US012612693B2

(12) United States Patent
Kim et al.

(10) Patent No.: US 12,612,693 B2
(45) Date of Patent: Apr. 28, 2026

(54) METHOD OF MANUFACTURING MASK ASSEMBLY

(71) Applicant: Samsung Display Co., Ltd., Yongin-si (KR)

(72) Inventors: Hwi Kim, Suwon-si (KR); Jeongkuk Kim, Suwon-si (KR); Seungyong Song, Suwon-si (KR); Areum Lee, Suwon-si (KR); Eunbee Jo, Hwaseong-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 603 days.

(21) Appl. No.: 18/103,587

(22) Filed: Jan. 31, 2023

(65) Prior Publication Data

US 2023/0265555 A1      Aug. 24, 2023

(30) Foreign Application Priority Data

Feb. 24, 2022     (KR) ......................... 10-2022-0024104

(51) Int. Cl.
*C23C 16/04*           (2006.01)

(52) U.S. Cl.
CPC .................................. *C23C 16/042* (2013.01)

(58) Field of Classification Search
CPC ................. H01L 21/027–0338; G03F 7/70783
See application file for complete search history.

(56) References Cited

U.S. PATENT DOCUMENTS

| | | | | |
|---|---|---|---|---|
| 6,847,433 | B2 * | 1/2005 | White | ................. G03F 7/70633 |
| | | | | 430/30 |
| 11,590,529 | B2 * | 2/2023 | Kim | ...................... C23C 14/042 |
| 11,597,995 | B2 * | 3/2023 | Kim | ..................... H10K 71/166 |
| 11,709,420 | B2 * | 7/2023 | Wu | ......................... B21D 11/02 |
| | | | | 29/446 |

(Continued)

FOREIGN PATENT DOCUMENTS

| | | |
|---|---|---|
| KR | 10-2000548 | 7/2019 |
| KR | 10-2192036 | 12/2020 |

(Continued)

OTHER PUBLICATIONS

Extended European Search Report for European Application No. 23157947.5, dated Jul. 19, 2023.

*Primary Examiner* — Jacob J Cigna
(74) *Attorney, Agent, or Firm* — CANTOR COLBURN LLP

(57)        ABSTRACT

A manufacturing method of a mask assembly includes tensioning a mask sheet, connecting the tensioned mask sheet with a mask frame, and defining opening processing areas in the tensioned mask sheet to form openings respectively corresponding to the opening processing areas. The defining of the opening processing areas includes defining initial opening processing areas in the tensioned mask sheet in a first direction and in a second direction crossing the first direction to determine a processing sequence of the initial opening processing areas, calculating cumulative deformation amounts accumulated in each of the initial opening processing areas based on the processing sequence, and correcting a size and a position of each of the initial opening processing areas based on the cumulative deformation amounts.

19 Claims, 34 Drawing Sheets

(56)     References Cited

U.S. PATENT DOCUMENTS

| | | | |
|---|---|---|---|
| 12,234,540 B2* | 2/2025 | Niu | G06F 30/20 |
| 2002/0059903 A1* | 5/2002 | Hasegawa | C23C 14/042 |
| | | | 118/504 |
| 2012/0240850 A1 | 9/2012 | Kobayashi et al. | |
| 2019/0100834 A1* | 4/2019 | Sakio | C23C 14/042 |
| 2021/0187576 A1 | 6/2021 | Wu et al. | |
| 2021/0285086 A1 | 9/2021 | Kim et al. | |

FOREIGN PATENT DOCUMENTS

| | | |
|---|---|---|
| KR | 10-2193044 | 12/2020 |
| WO | 2015146544 | 10/2015 |
| WO | 2020143218 | 7/2020 |

* cited by examiner

P-COn+11

Cn+11

P-COn+20

Cn+20

BB

P2-MS

P-CT-n  CT-n

P-COn

Cn

P-COn+9

| Processing Sequence | C1 | | C2 | | C3 | | C4 | | C5 | | C6 | | C7 | | C8 | | C9 | | C10 | | C11 | |
|---|---|---|---|---|---|---|---|---|---|---|---|---|---|---|---|---|---|---|---|---|---|---|
| Position | D1 | U1 | D2 | U2 | D3 | U3 | D4 | U4 | D5 | U5 | D6 | U6 | D7 | U7 | D8 | U8 | D9 | U9 | D10 | U10 | D11 | U11 |
| C1 | -K | +K | | | | | | | | | | | | | | | | | | | | |
| C2 | -K | -K | -K | +K | | | | | | | | | | | | | | | | | | |
| C3 | -K | -K | -K | -K | -K | +K | | | | | | | | | | | | | | | | |
| C4 | -K | -K | -K | -K | -K | -K | -K | +K | | | | | | | | | | | | | | |
| C5 | -K | -K | -K | -K | -K | -K | -K | -K | -K | +K | | | | | | | | | | | | |
| C6 | -K | -K | -K | -K | -K | -K | -K | -K | -K | -K | -K | +K | | | | | | | | | | |
| C7 | -K | -K | -K | -K | -K | -K | -K | -K | -K | -K | -K | -K | -K | +K | | | | | | | | |
| C8 | -K | -K | -K | -K | -K | -K | -K | -K | -K | -K | -K | -K | -K | -K | -K | +K | | | | | | |
| C9 | -K | -K | -K | -K | -K | -K | -K | -K | -K | -K | -K | -K | -K | -K | -K | -K | -K | +K | | | | |
| C10 | -K | -K | -K | -K | -K | -K | -K | -K | -K | -K | -K | -K | -K | -K | -K | -K | -K | -K | -K | +K | | |
| C11 | -K | -K | -K | -K | -K | -K | -K | -K | -K | -K | -K | -K | -K | -K | -K | -K | -K | -K | -K | -K | -K | +K |
| Cumulative Deformation Amount(K) | -11 | -9 | -10 | -8 | -9 | -7 | -8 | -6 | -7 | -5 | -6 | -4 | -5 | -3 | -4 | -2 | -3 | -1 | -2 | 0 | -1 | +1 |
| Corrected Center Position | +10K | | +9K | | +8K | | +7K | | +6K | | +5K | | +4K | | +3K | | +2K | | +1K | | 0 | |

FIG. 12C

| Processing Sequence | C1 | | C12 | | C23 | | C34 | | C45 | |
|---|---|---|---|---|---|---|---|---|---|---|
| Position | L1 | R1 | L2 | R2 | L3 | R3 | L4 | R4 | L5 | R5 |
| C1 | −K' | +K' | | | | | | | | |
| C12 | −K' | −K' | −K' | +K' | | | | | | |
| C23 | −K' | −K' | −K' | −K' | −K' | +K' | | | | |
| C34 | −K' | −K' | −K' | −K' | −K' | −K' | −K' | +K' | | |
| C45 | −K' | −K' | −K' | −K' | −K' | −K' | −K' | −K' | −K' | +K' |
| Cumulative Deformation Amount(K') | −5 | −3 | −4 | −2 | −3 | −2 | −2 | 0 | −1 | +1 |
| Corrected Center Position | +4K' | | +3K' | | +2K' | | +1K' | | 0 | |

FIG. 13B

| Processing Sequence | C1 | | C11 | | C2 | | C10 | | C3 | | C9 | | C4 | | C8 | | C5 | | C7 | | C6 | |
|---|---|---|---|---|---|---|---|---|---|---|---|---|---|---|---|---|---|---|---|---|---|---|
| Position | D1 | U1 | D11 | U11 | D2 | U2 | D10 | U10 | D3 | U3 | D9 | U9 | D4 | U4 | D8 | U8 | D5 | U5 | D7 | U7 | D6 | U6 |
| C1 | -K | +K | | | | | | | | | | | | | | | | | | | | |
| C11 | -K | -K | -K | +K | | | | | | | | | | | | | | | | | | |
| C2 | -K | -K | +K | +K | -K | +K | | | | | | | | | | | | | | | | |
| C10 | -K | -K | +K | +K | -K | -K | -K | +K | | | | | | | | | | | | | | |
| C3 | -K | -K | +K | +K | -K | -K | +K | +K | -K | +K | | | | | | | | | | | | |
| C9 | -K | -K | +K | +K | -K | -K | +K | +K | -K | -K | -K | +K | | | | | | | | | | |
| C4 | -K | -K | +K | +K | -K | -K | +K | +K | -K | -K | +K | +K | -K | +K | | | | | | | | |
| C8 | -K | -K | +K | +K | -K | -K | +K | +K | -K | -K | +K | +K | -K | -K | -K | +K | | | | | | |
| C5 | -K | -K | +K | +K | -K | -K | +K | +K | -K | -K | +K | +K | -K | -K | +K | +K | -K | +K | | | | |
| C7 | -K | -K | +K | +K | -K | -K | +K | +K | -K | -K | +K | +K | -K | -K | +K | +K | -K | -K | -K | +K | | |
| C6 | -K | -K | +K | +K | -K | -K | +K | +K | -K | -K | +K | +K | -K | -K | +K | +K | -K | -K | +K | +K | -K | +K |
| Cumulative Deformation Amount(K) | -11 | -9 | +8 | +10 | -9 | -7 | +6 | +8 | -7 | -5 | +4 | +6 | -5 | -3 | +2 | +4 | -3 | -2 | 0 | +2 | -1 | +1 |
| Corrected Center Position | +10K | | -9K | | +8K | | -7K | | +6K | | -5K | | +4K | | -3K | | +2K | | -1K | | 0 | |

FIG. 14B

| Processing Sequence | C6 | | C5 | | C7 | | C4 | | C8 | | C3 | | C9 | | C2 | | C10 | | C1 | | C11 | |
|---|---|---|---|---|---|---|---|---|---|---|---|---|---|---|---|---|---|---|---|---|---|---|
| Position | D6 | U6 | D5 | U5 | D7 | U7 | D4 | U4 | D8 | U8 | D3 | U3 | D9 | U9 | D2 | U2 | D10 | U10 | D1 | U1 | D11 | U11 |
| C6 | −K | +K | | | | | | | | | | | | | | | | | | | | |
| C5 | +K | +K | −K | +K | | | | | | | | | | | | | | | | | | |
| C7 | −K | −K | −K | −K | −K | +K | | | | | | | | | | | | | | | | |
| C4 | +K | +K | +K | +K | +K | +K | −K | +K | | | | | | | | | | | | | | |
| C8 | −K | −K | −K | −K | −K | −K | −K | −K | −K | +K | | | | | | | | | | | | |
| C3 | +K | +K | +K | +K | +K | +K | +K | +K | +K | +K | −K | +K | | | | | | | | | | |
| C9 | −K | −K | −K | −K | −K | −K | −K | −K | −K | −K | −K | −K | −K | +K | | | | | | | | |
| C2 | +K | +K | +K | +K | +K | +K | +K | +K | +K | +K | +K | +K | +K | +K | −K | +K | | | | | | |
| C10 | −K | −K | −K | −K | −K | −K | −K | −K | −K | −K | −K | −K | −K | −K | −K | −K | −K | +K | | | | |
| C1 | +K | +K | +K | +K | +K | +K | +K | +K | +K | +K | +K | +K | +K | +K | +K | +K | +K | +K | −K | +K | | |
| C11 | −K | −K | −K | −K | −K | −K | −K | −K | −K | −K | −K | −K | −K | −K | −K | −K | −K | −K | −K | −K | −K | +K |
| Cumulative Deformation Amount(K) | −1 | +1 | −2 | 0 | −1 | +1 | −2 | 0 | −1 | +1 | −2 | 0 | −1 | +1 | −2 | 0 | −1 | +1 | −2 | 0 | −1 | +1 |
| Corrected Center Position | 0 | | +K | | 0 | | +K | | 0 | | +K | | 0 | | +K | | 0 | | +K | | 0 | |

METHOD OF MANUFACTURING MASK ASSEMBLY

CROSS REFERENCE TO RELATED APPLICATION(S)

This application claims priority to and benefits of Korean Patent Application No. 10-2022-0024104 under 35 U.S.C. § 119, filed on Feb. 24, 2022, in the Korean Intellectual Property Office (KIPO), the entire contents of which are incorporated herein by reference.

BACKGROUND

1. Technical Field

The disclosure relates to a method of manufacturing a mask assembly. More particularly, the disclosure relates to a method of manufacturing a mask assembly used to manufacture a display panel.

2. Description of the Related Art

Multimedia electronic devices, such as televisions, mobile phones, tablet computers, navigation devices, and game devices, include a display panel displaying an image. The display panel includes pixels displaying the image, and each of the pixels includes a light emitting element generating a light and a driving element connected to the light emitting element. The display panel is formed by stacking various functional layers on a substrate.

Functional layers of the display panel are formed through a patterning process using a mask provided with an opening area defined therethrough. The patterned functional layers have a shape and a position, which are determined depending on a shape and a position of the opening area of the mask. A mask provided with the opening area that is processed with high precision is required to improve a deposition quality of the patterned functional layers. Accordingly, research for a manufacturing method of the mask to improve the process precision of the opening area is desired.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a method of manufacturing a mask assembly to manufacture a mask that improves a deposition quality of functional layers formed on a target substrate.

Embodiments provide a method of manufacturing a mask assembly. The method may include tensioning a mask sheet, connecting the tensioned mask sheet with a mask frame, and defining opening processing areas in the tensioned mask sheet to form openings respectively corresponding to the opening processing areas. The defining of the opening processing areas may include defining initial opening processing areas in the tensioned mask sheet in a first direction and in a second direction intersecting the first direction to determine a processing sequence of the initial opening processing areas, calculating cumulative deformation amounts accumulated in each of the initial opening processing areas based on the processing sequence, and correcting a size and a position of each of the initial opening processing areas based on the cumulative deformation amounts.

Each of the opening processing areas may have a size smaller than a size of a corresponding opening among the openings formed from the opening processing areas.

A first tensile force acts on the tensioned mask sheet in a direction substantially parallel to the first direction, an opening processing area which may be defined to form the opening having a first width in the first direction, has a second width in the first direction, and a difference between the first width and the second width may be proportional to the first tensile force.

The second width may be smaller than the first width by 2K, K satisfies the following equation 1 of $K=FP/AE$, F denotes the first tensile force, P denotes a width in the first direction between a center of the opening processing area and an edge of the opening processing area, A denotes a size in cross-section of an area to which the first tensile force may be applied in the opening processing area, and E denotes an elastic modulus of the mask sheet.

A second tensile force acts on the tensioned mask sheet in a direction substantially parallel to the second direction, the opening processing area which may be defined to form the opening having a third width in the second direction, has a fourth width in the second direction, and a difference between the third width and the fourth width may be proportional to the second tensile force.

An n-th opening processing area that may be processed at an n-th order among the opening processing areas may have a center set at a second position to form an n-th opening having a center at a first position, the opening processing areas arranged with the n-th opening processing area in a line in the first direction may be defined as a first group. In case that a number of the opening processing areas which may be processed after the n-th opening processing area and may be arranged in an upward direction parallel to the first direction from the n-th opening processing area among the opening processing areas of the first group, is defined as m and a number of the opening processing areas which may be processed after the n-th opening processing area and may be arranged in a downward direction parallel to the first direction from the n-th opening processing area among the opening processing areas of the first group, may be defined as 1. A difference in position between the first position and the second position in the first direction may be proportional to a difference between m and 1, and each of m and 1 may be zero (0) or a natural number.

In case that m is smaller than 1, the second position may be disposed below the first position in a plan view, and in case that m is greater than 1, the second position may be disposed above the first position in a plan view.

A first tensile force acts on the tensioned mask sheet in the first direction, the difference in position between the first position and the second position in the first direction may be X, X satisfies the following equation 2 of $X=|1m-1|(FP/AE)$, F denotes the first tensile force, P denotes a width in the first direction between a center of the opening processing area and an edge of the opening processing area, A denotes a size in cross-section of an area to which the first tensile force may be applied in the opening processing area, and E denotes an elastic modulus of the mask sheet.

The opening processing areas arranged with the n-th opening processing area in a line in the second direction may be defined as a second group, and in case that the number of the opening processing areas which may be processed after the n-th opening processing area and may be arranged in a leftward direction parallel to the second direction from the n-th opening processing area among the opening processing areas of the second group, is defined as p and the number of the opening processing areas which may be processed after the n-th opening processing area and may be arranged in a rightward direction parallel to the second direction from the n-th opening processing area among the opening processing areas of the second group, is defined as q. A difference in position between the first position and the second position in the second direction may be proportional to a difference between p and q, and each of p and q is zero (0) or a natural number.

In case that p is smaller than q, the second position may be disposed to a right side of the first position in a plan view, and in case that p is greater than q, the second position may be disposed to a left side of the first position in a plan view.

The opening processing areas may include first to a-th processing groups each may include opening processing areas arranged in a line in the first direction, a is a natural number equal to or greater than two (2) the first to a-th processing groups may be arranged in the second direction, and the processing sequence may be sequentially set from the first processing group to the a-th processing group.

The method may further include forming temporary openings through the mask sheet before the tensioning of the mask sheet, the opening processing areas correspond to the temporary openings, and each of the opening processing areas surrounds a corresponding temporary opening among the temporary openings in a plan view.

Embodiments provide a method of manufacturing a mask assembly. The method may include tensioning a mask sheet, connecting the tensioned mask sheet with a mask frame, defining primary opening processing areas arranged in an arrangement (e.g., a predetermined or selectable arrangement) on the tensioned mask sheet and each having a center point whose position is corrected, and forming final opening areas respectively corresponding to the primary opening processing areas. The forming of the final opening areas may include irradiating a laser beam to each of the primary opening processing areas based on a processing sequence of the primary opening processing areas to sequentially form secondary opening processing areas, and a position of a center point of at least one of the secondary opening processing areas may be different from a position of a center point of a corresponding final opening area among the final opening areas.

The primary opening processing areas may include first to a-th opening processing areas arranged in a first direction between one end and another end of the tensioned mask sheet in a plan view, the final opening areas include first to a-th openings respectively corresponding to the first to a-th opening processing areas and formed through the tensioned mask sheet. Each of the first to a-th opening processing areas may have a first center point, each of the first to a-th openings may have a second center point, a position of the first center point of at least one of the first to a-th opening processing areas may be different from a position of the second center point of an opening corresponding thereto, and a may be a natural number equal to or greater than two (2).

The laser beam may be sequentially irradiated from the first opening processing area disposed closest to the one end and to the a-th opening processing area in the first direction.

The laser beam may be first irradiated to the first opening processing area among the first to a-th opening processing areas to form a secondary first opening processing area having the same center point as the first center point of the first opening processing area, and a position of a center point of the secondary first opening area may be different from a position of the second center point of the first opening in the first direction.

The second center point of the first opening may be closer to the one end in the first direction than a center point of the secondary first opening processing area may be.

The laser beam may be irradiated at an a-th order to the a-th opening processing area among the first to a-th opening processing areas to form a secondary a-th opening processing area having the same center point as the first center point of the a-th opening processing area, and a position of a center point of the secondary a-th opening area may be the same as a position of the second center point of the a-th opening in the first direction.

The opening processing area disposed at a center in the first direction among the first to a-th opening processing areas may be defined as a center opening processing area, and the laser beam may be sequentially irradiated to the first to a-th opening processing areas from the opening processing area disposed farthest from the center opening processing area.

The opening processing area disposed at a center in the first direction among the first to a-th opening processing areas may be defined as a center opening processing area, and the laser beam may be sequentially irradiated according to the processing sequence that gradually goes away from the center opening processing area.

According to the above, the cumulative deformation amounts acting on each of the opening areas may be calculated based on the tensile force acting on the mask sheet and the processing sequence of the opening areas formed through the mask sheet, and the size and the position of the opening area may be corrected. Accordingly, the mask may have an excellent accuracy with respect to the size and the position of the opening areas and an improved reliability.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other advantages of the disclosure will become readily apparent by reference to the following detailed description when considered in conjunction with the accompanying drawings wherein:

FIG. 1A is a schematic plan view of a display panel according to an embodiment of the disclosure;

5

Figure 6:
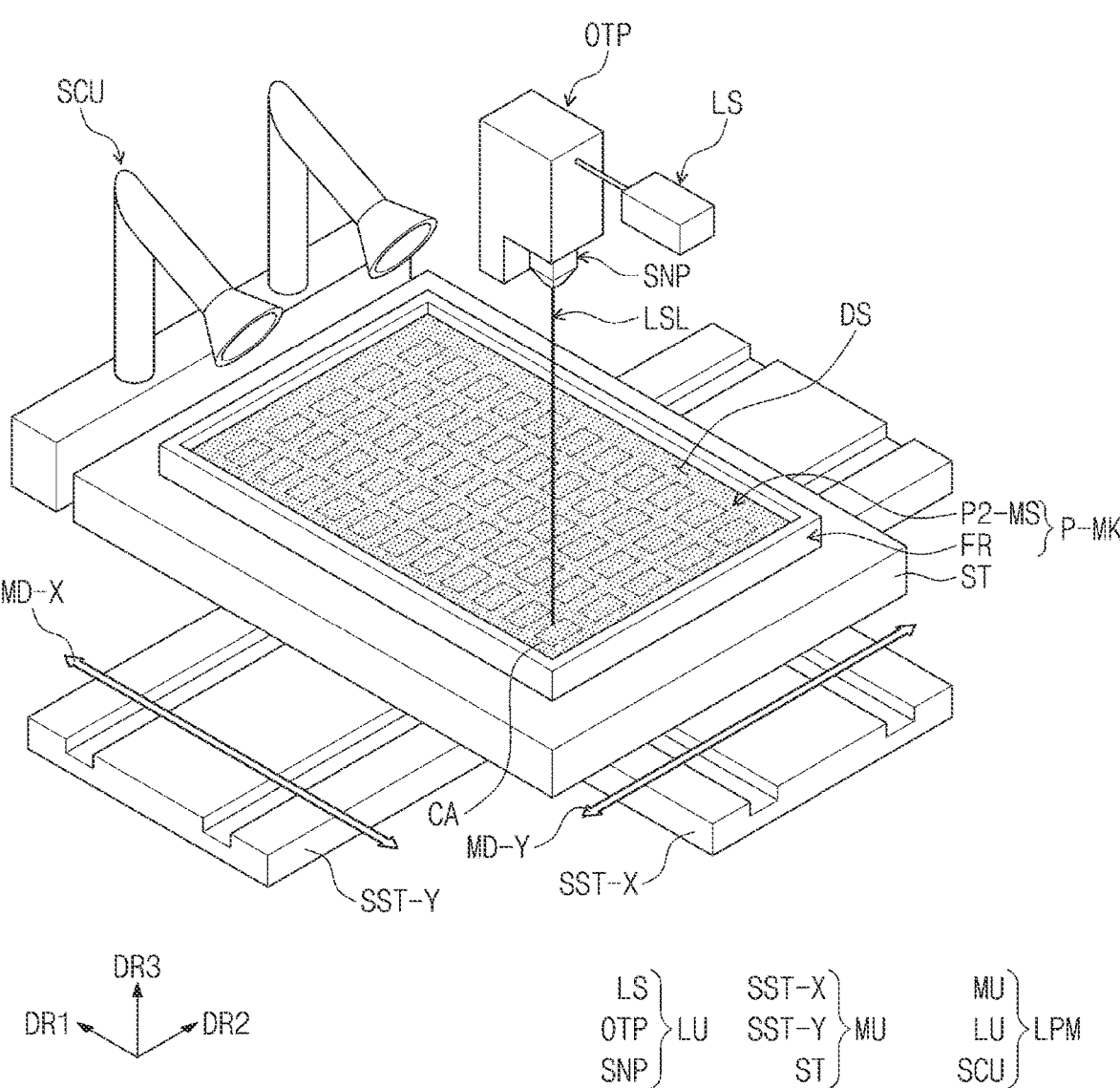
Figure 7:
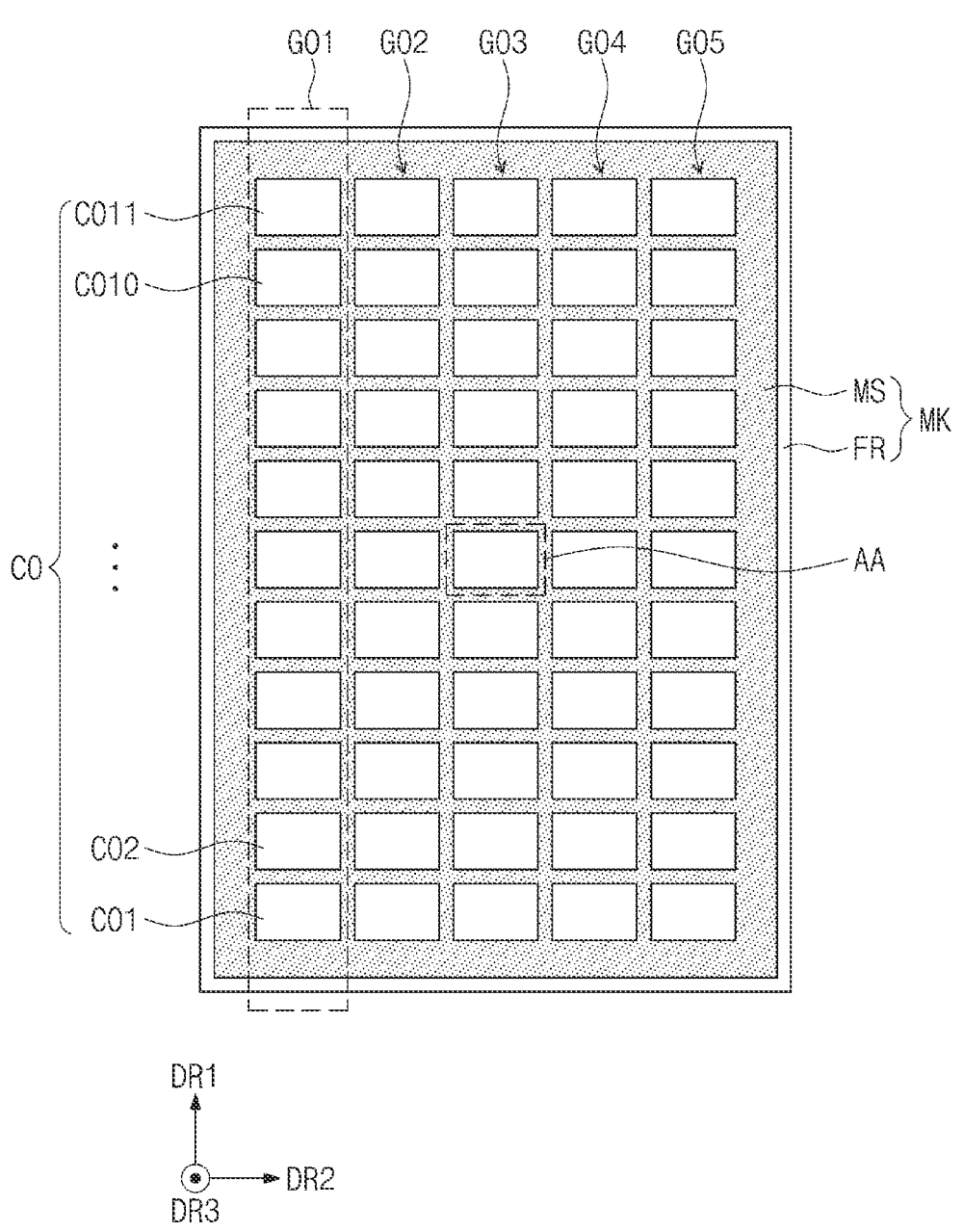
Figure 8:
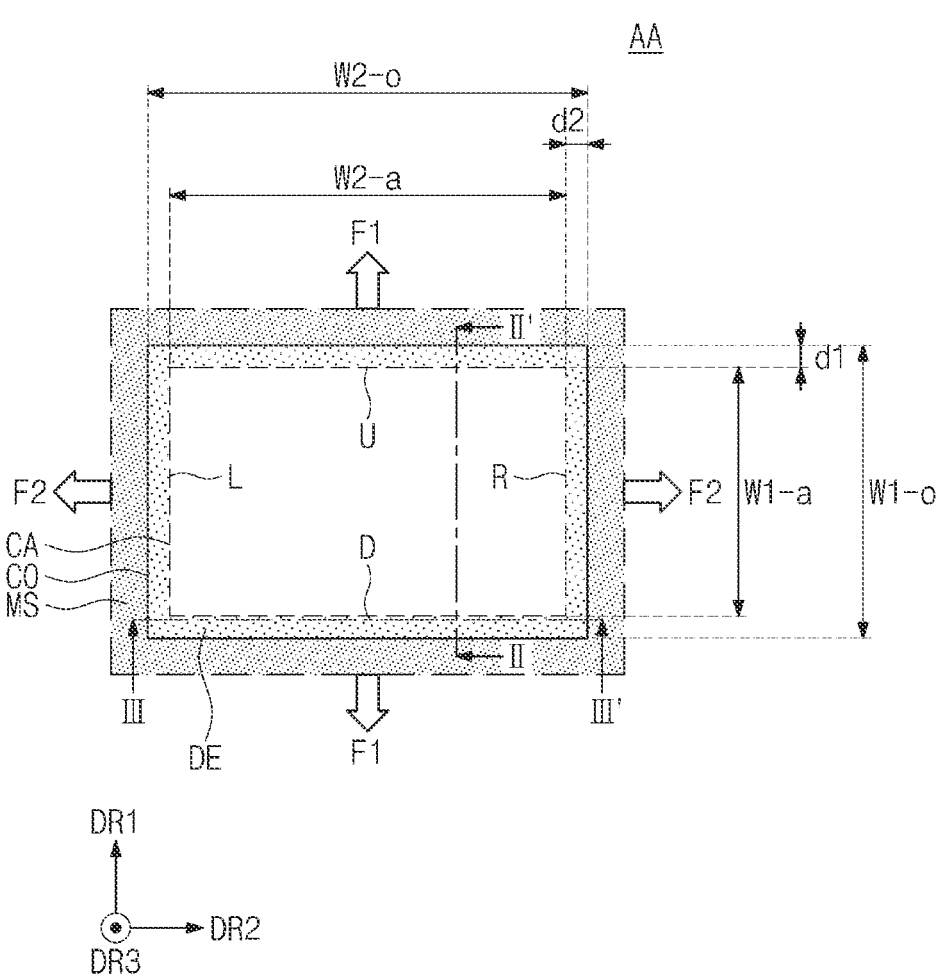
Figure 9A:
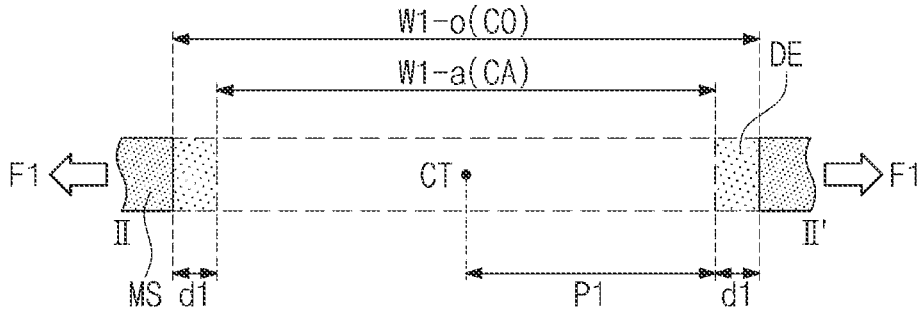
Figure 9A:
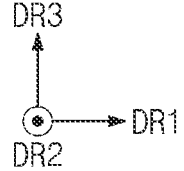
Figure 9B:
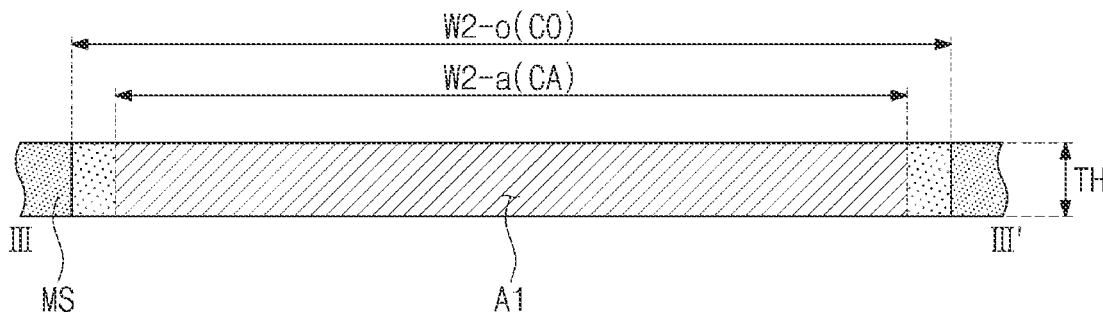
Figure 9B:
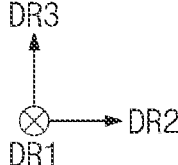
Figure 10:
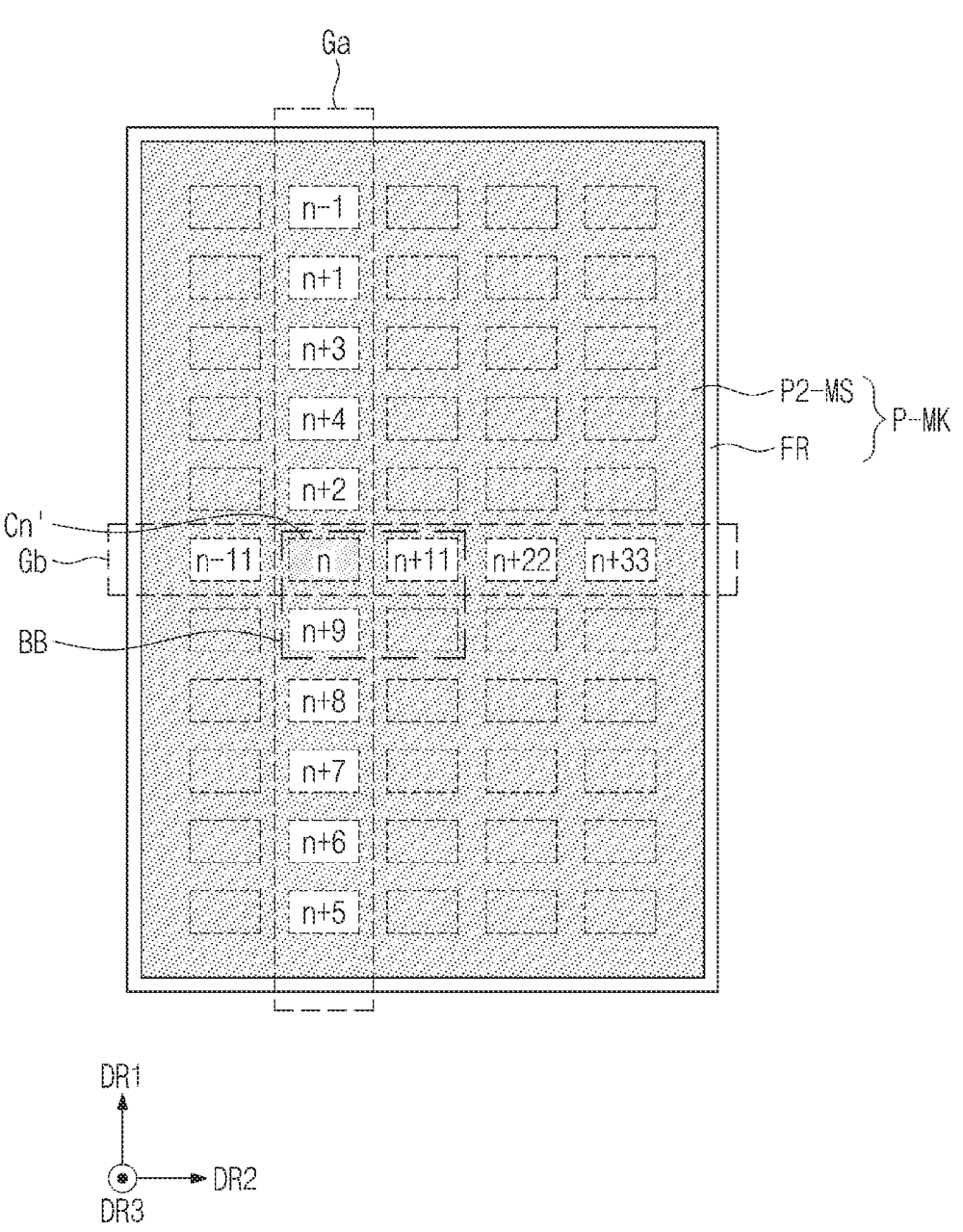
Figure 12A:
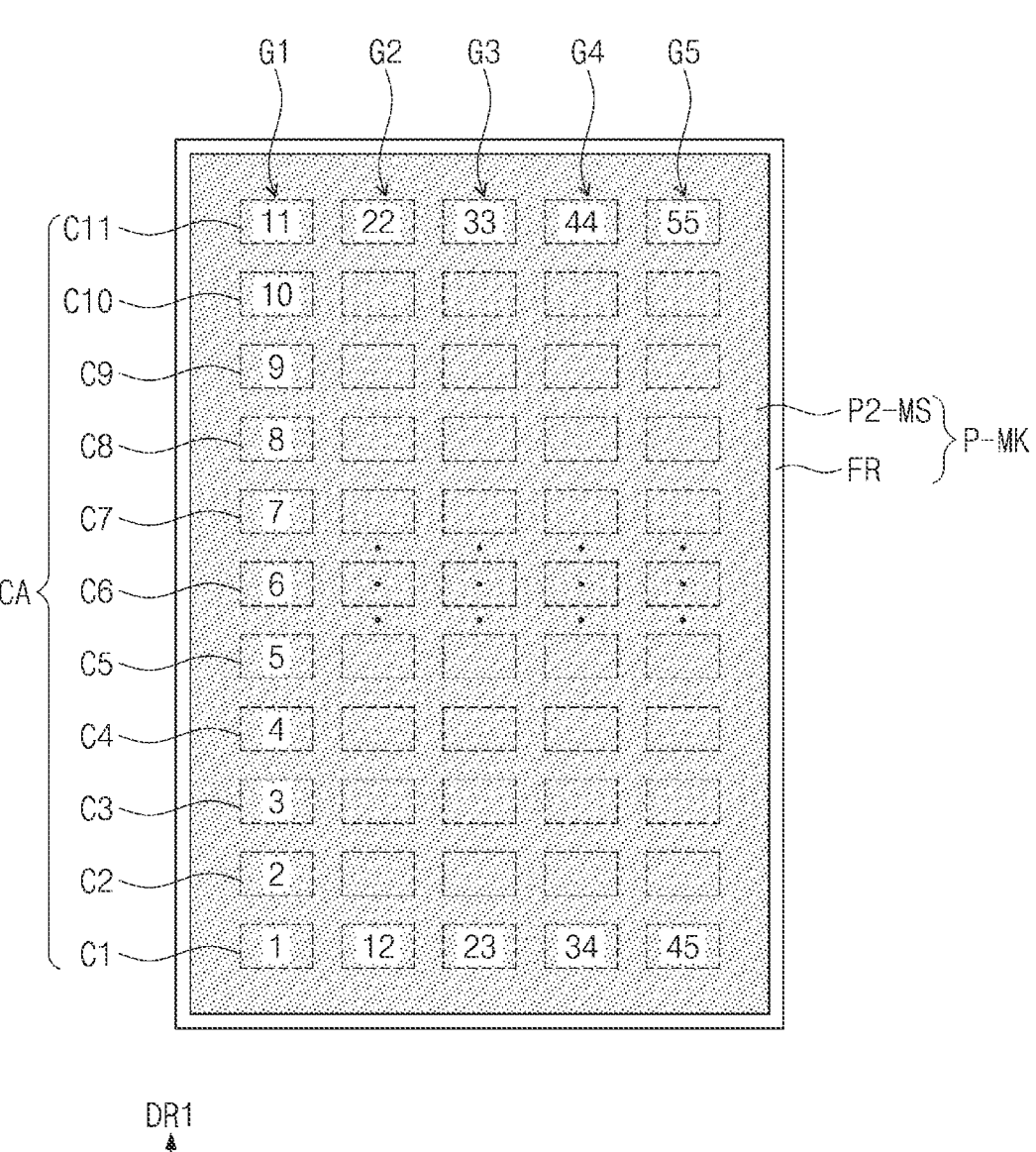
Figure 12D:
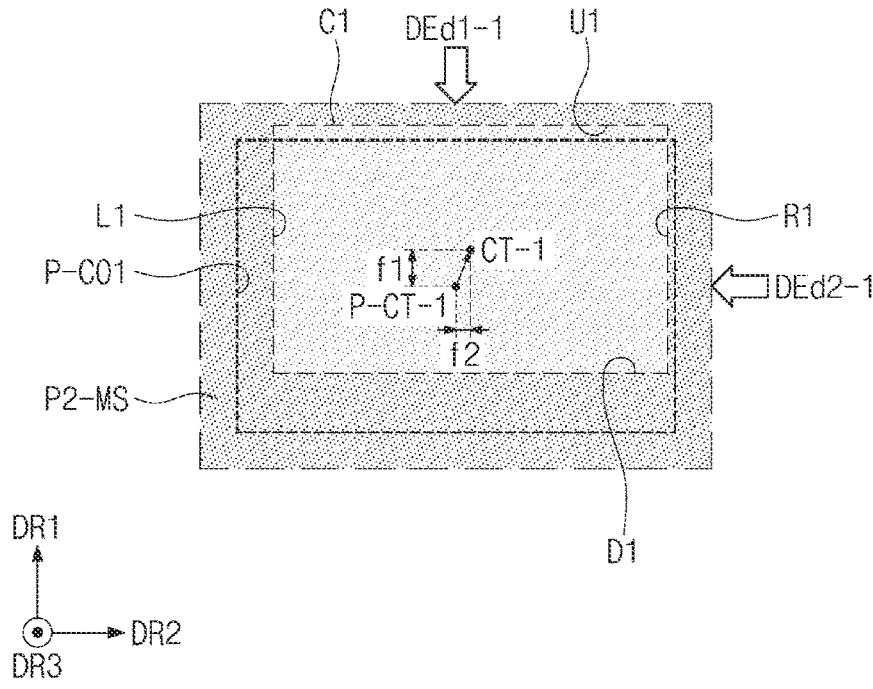
Figure 12E:
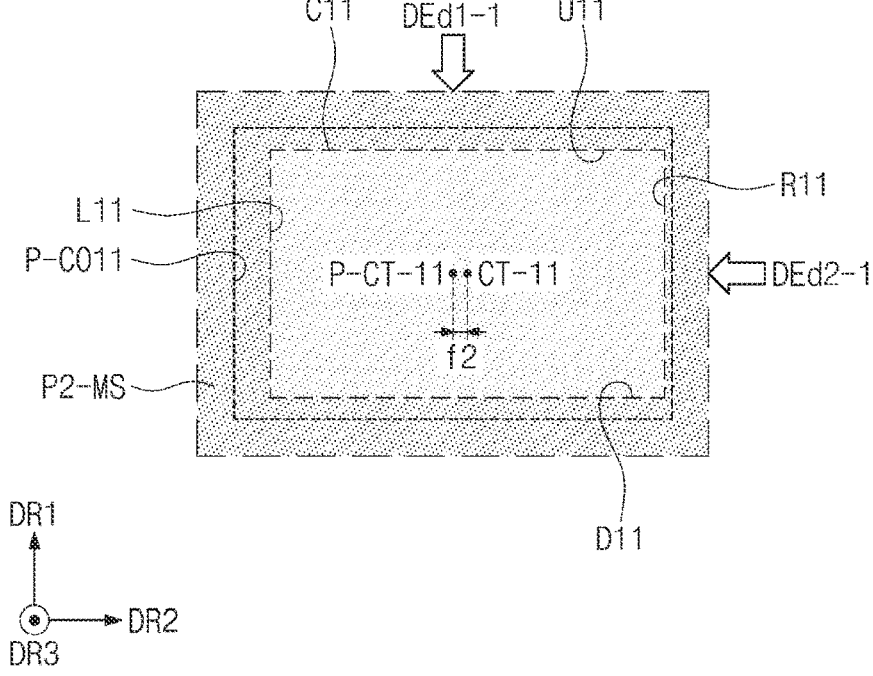
Figure 13A:
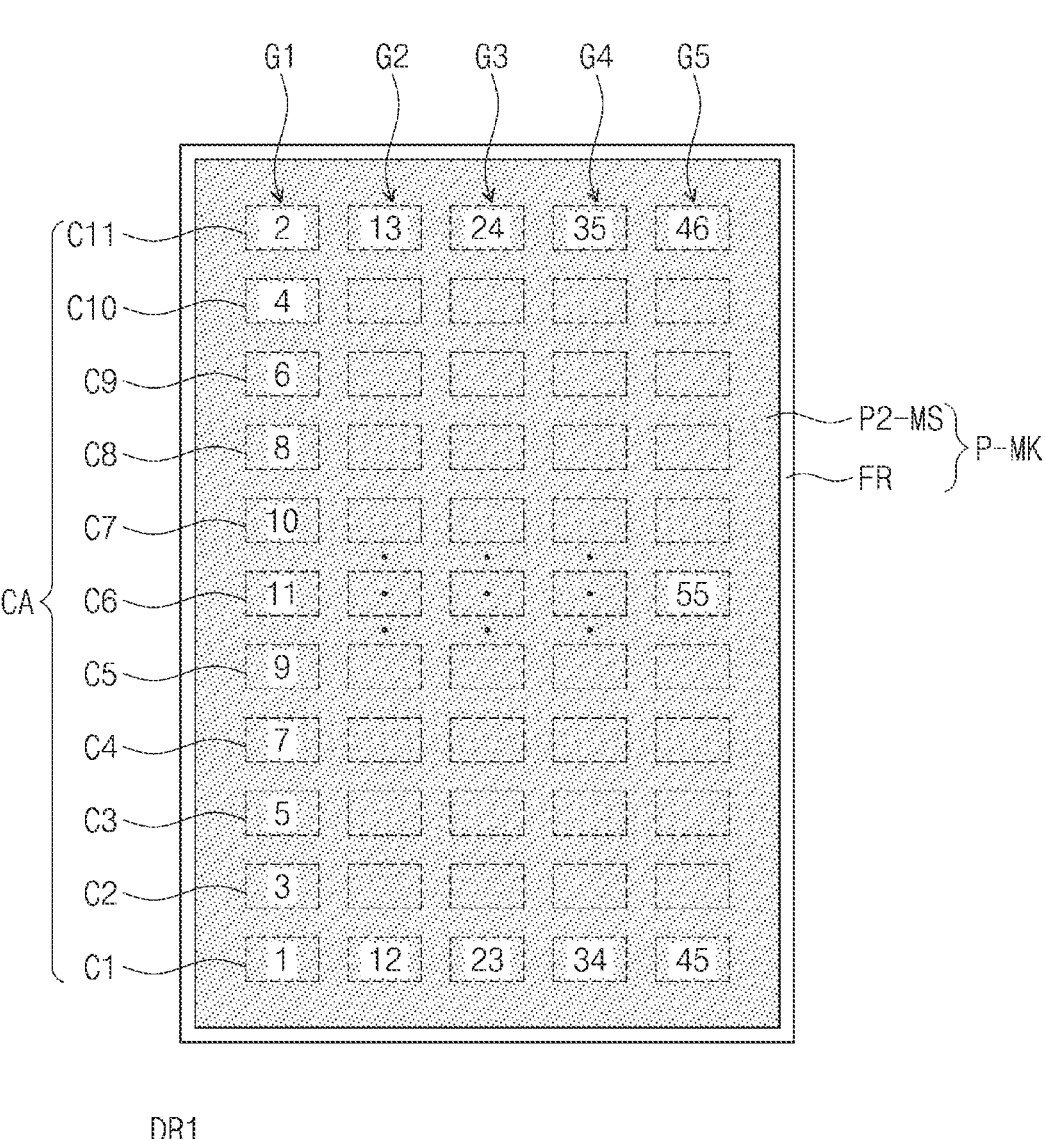
Figure 13C:
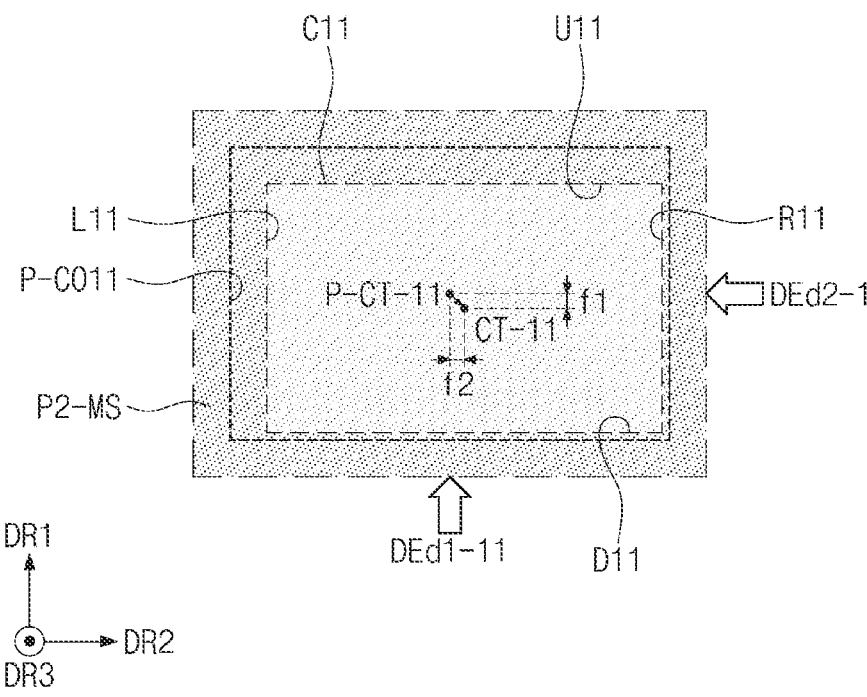
Figure 14A:
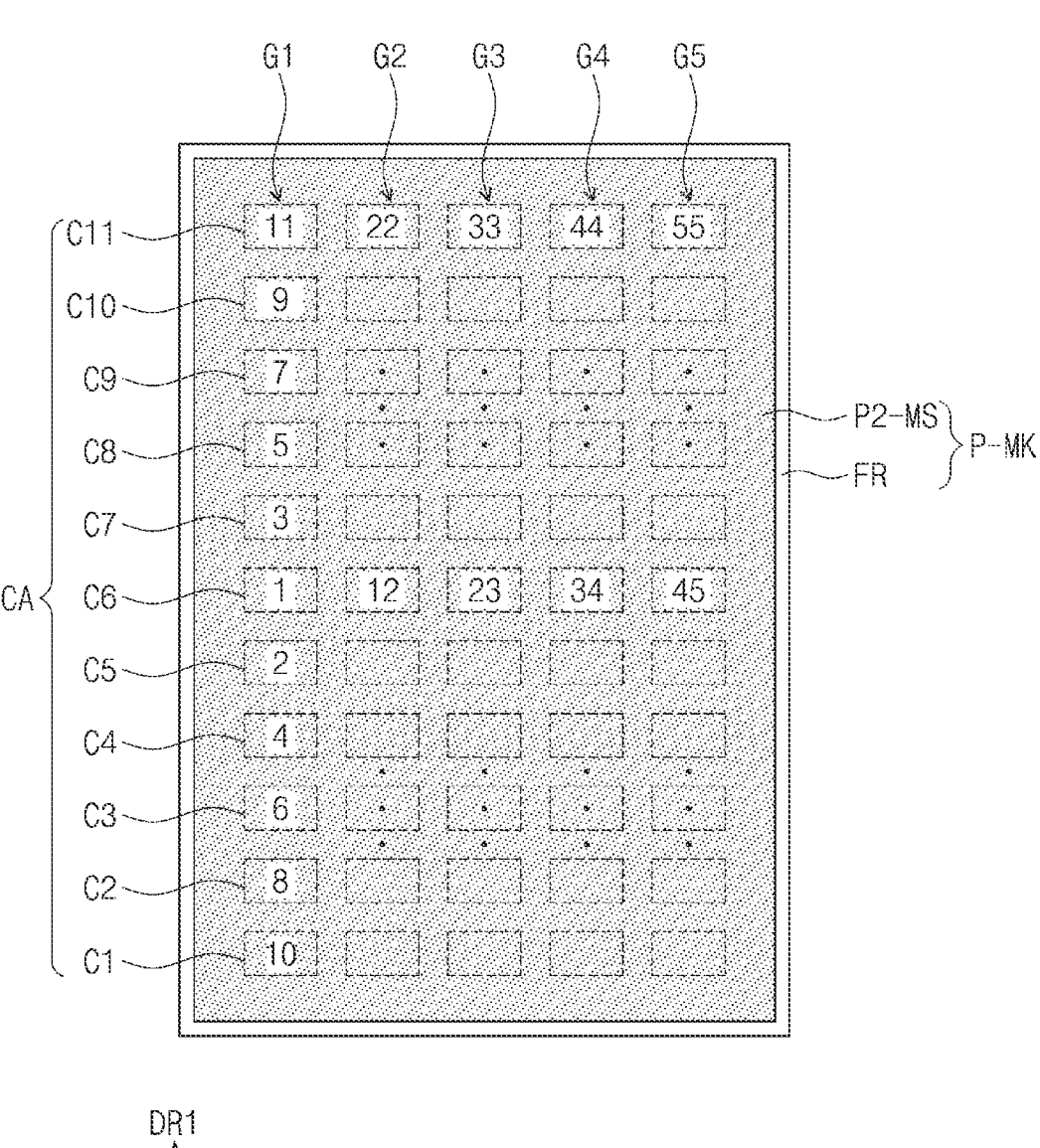
Figure 15A:
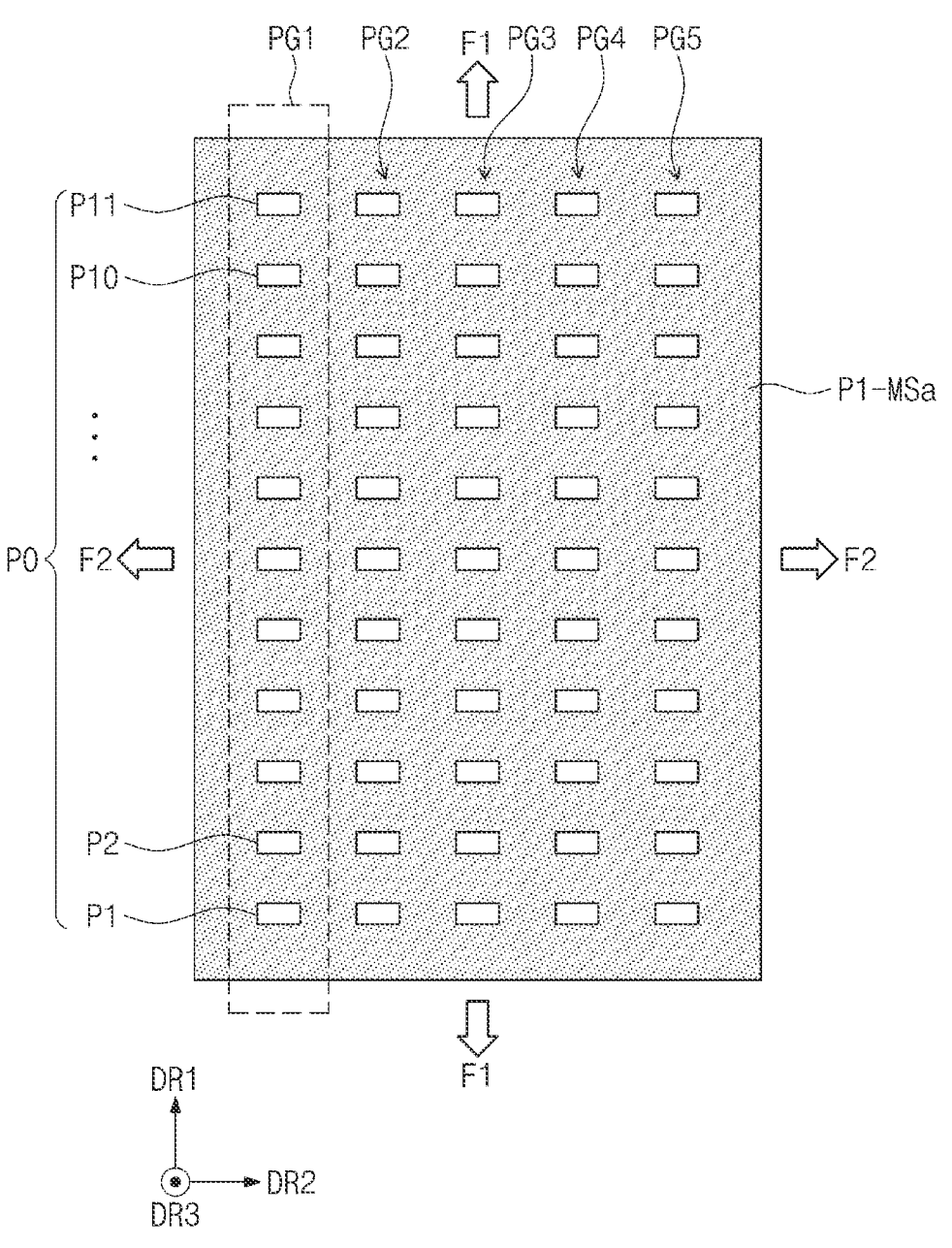
Figure 15B:
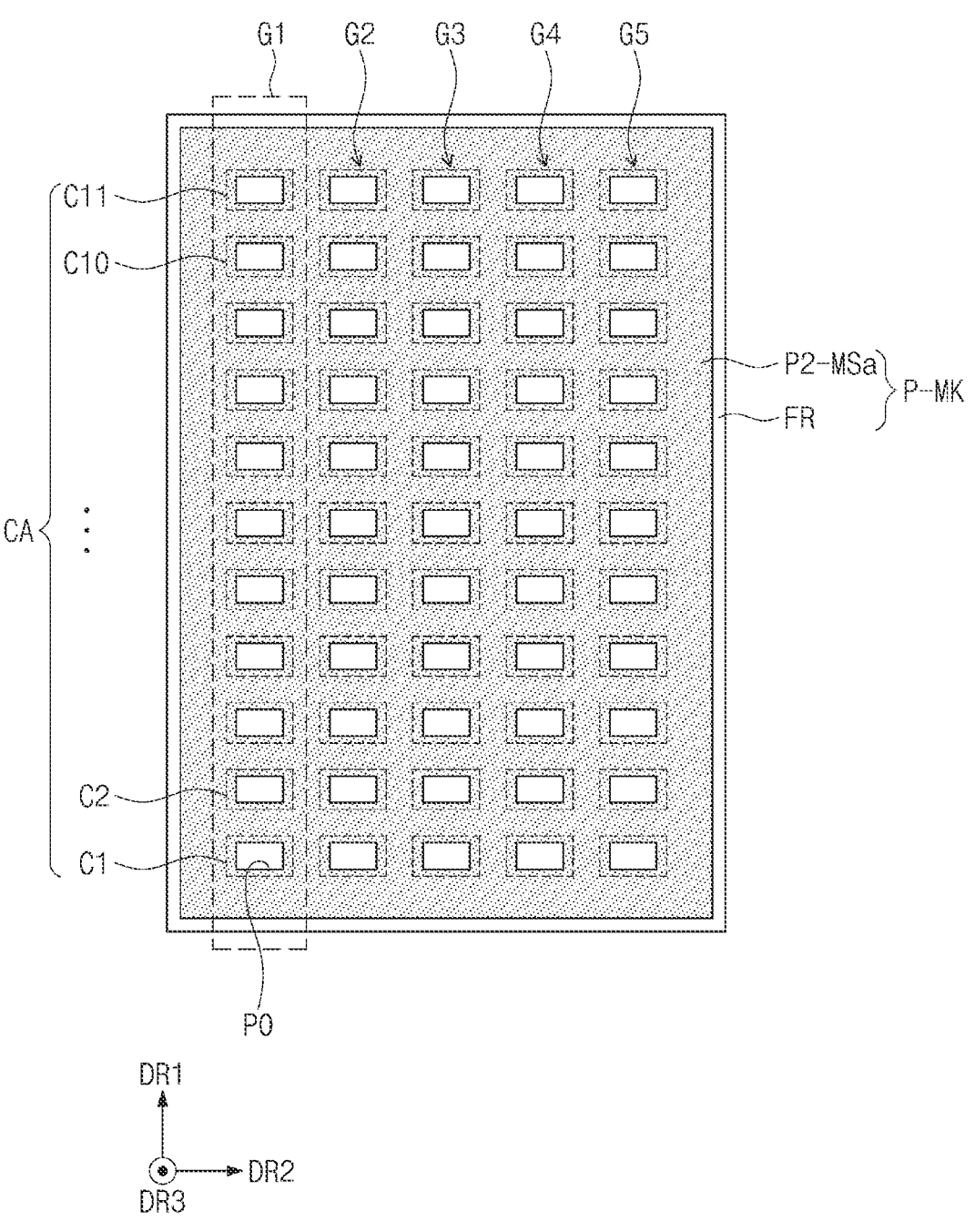
Figure 17A:
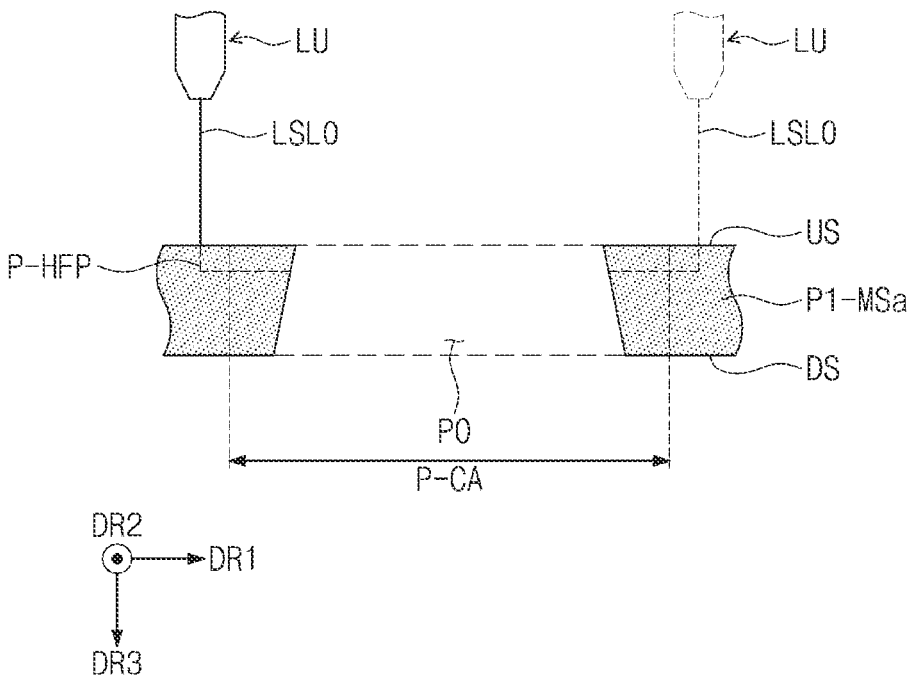
Figure 17B:
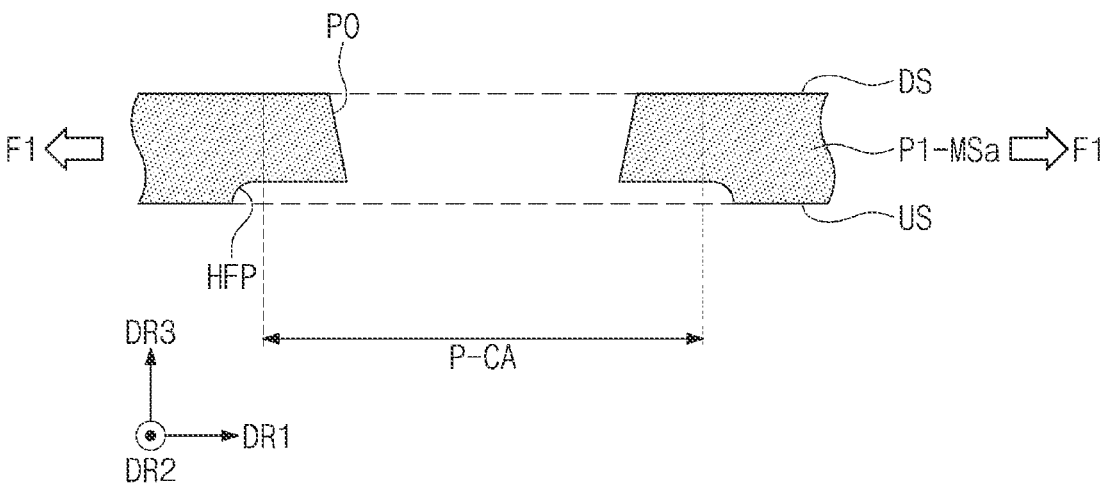
Figure 17C:
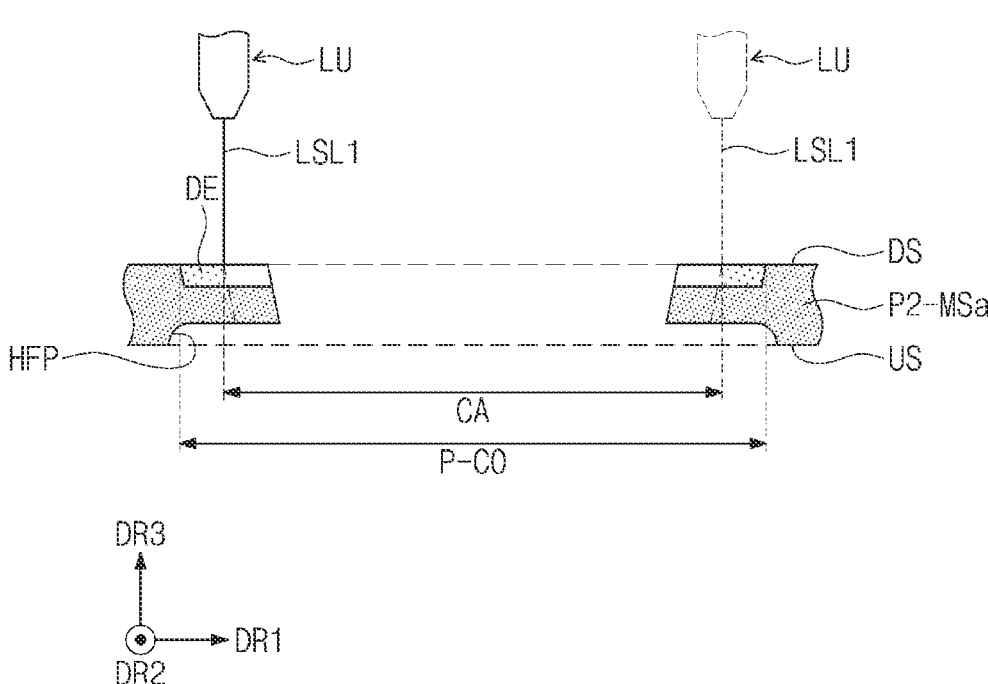
Figure 18A:
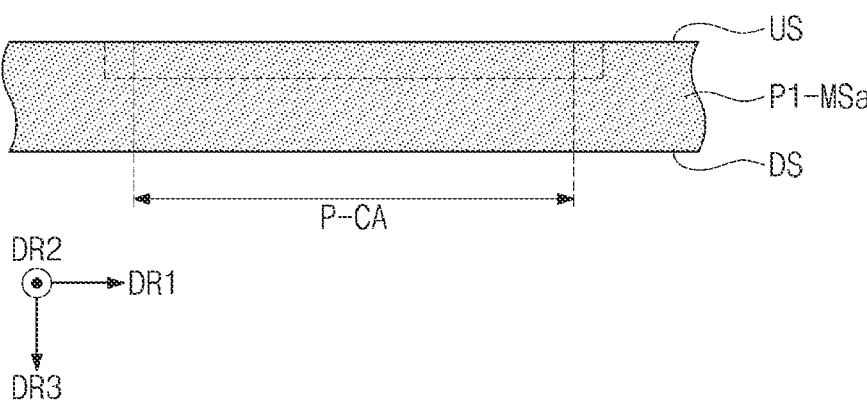
Figure 18B:
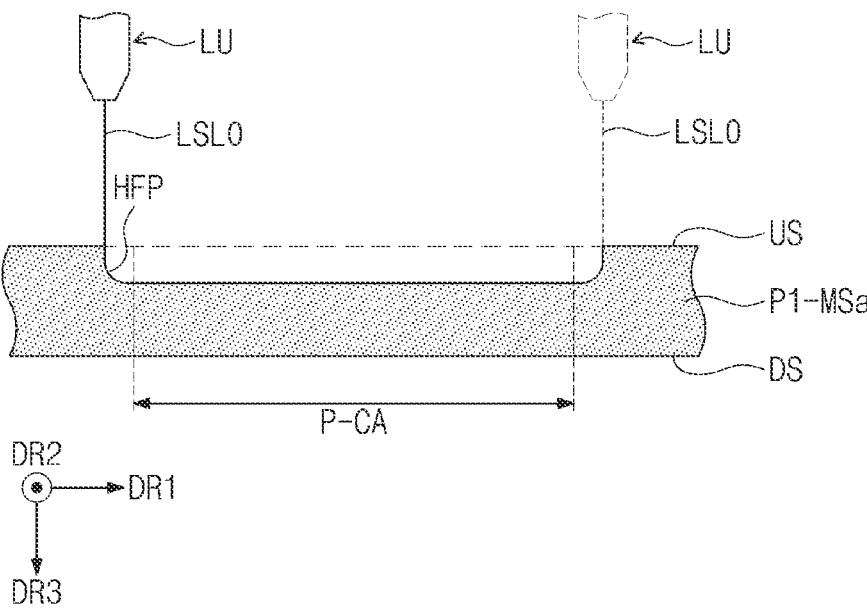
Figure 18C:
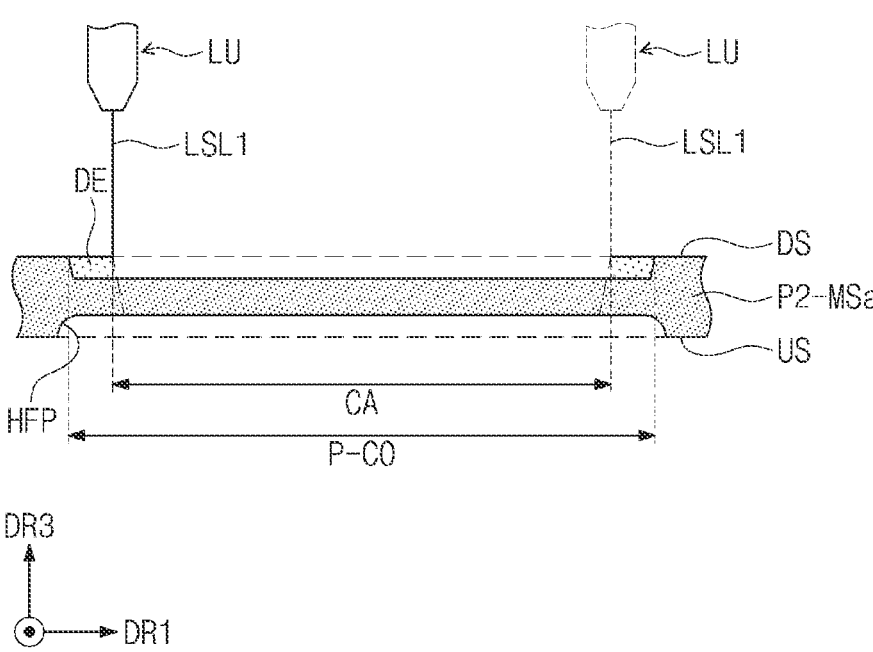
Figure 19A:
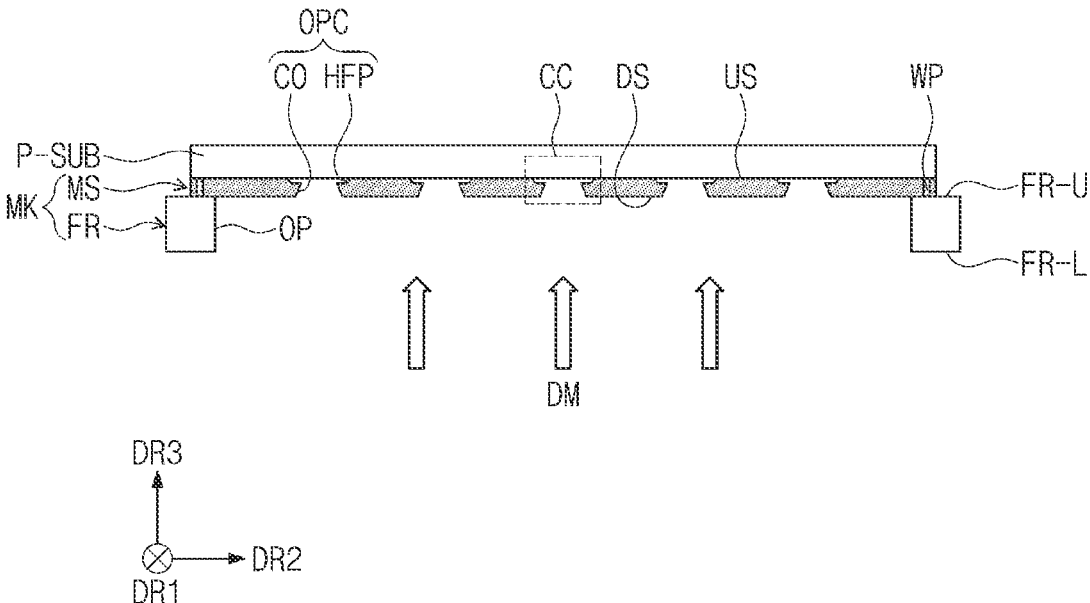
Figure 19B:
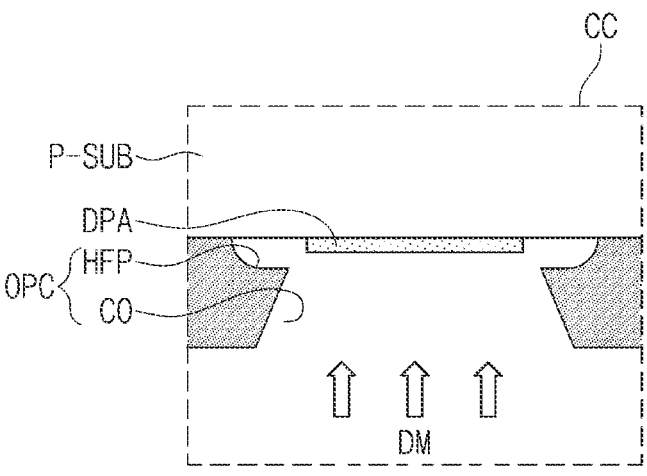

FIG. 6 is a schematic perspective view of a process of a manufacturing method of a mask assembly according to an embodiment of the disclosure;

FIG. 7 is a schematic plan view of a mask assembly according to an embodiment of the disclosure;

FIG. 8 is an enlarged schematic plan view of an area AA of FIG. 7 according to an embodiment of the disclosure;

FIG. 9A is a schematic cross-sectional view of a mask taken along a line II-II' of FIG. 8 according to an embodiment of the disclosure;

FIG. 9B is a schematic cross-sectional view of a mask taken along a line III-III' of FIG. 8 according to an embodiment of the disclosure;

FIG. 10 is a schematic plan view of a process of a manufacturing method of a mask assembly according to an embodiment of the disclosure;

FIGS. 11A to 11E are schematic plan views of a process of a manufacturing method of a mask assembly in an area BB of FIG. 10 according to an embodiment of the disclosure;

FIG. 12A is a schematic plan view of a process of a manufacturing method of a mask assembly according to an embodiment of the disclosure;

FIGS. 12B and 12C are tables showing a calculation of cumulative deformation amount and a degree of position correction of opening processing areas in a method of manufacturing a mask assembly according to an embodiment of the disclosure;

FIGS. 12D and 12E are enlarged schematic plan views of a mask according to an embodiment of the disclosure;

FIG. 13A is a schematic plan view of a process of a manufacturing method of a mask assembly according to an embodiment of the disclosure;

FIG. 13B is a table showing a calculation of cumulative deformation amount and a degree of position correction of opening processing areas in a method of manufacturing a mask assembly according to an embodiment of the disclosure;

FIG. 13C is an enlarged schematic plan view of a mask according to an embodiment of the disclosure;

FIG. 14A is a schematic plan view of a process of a manufacturing method of a mask assembly according to an embodiment of the disclosure;

FIG. 14B is a table showing a calculation of cumulative deformation amount and a degree of position correction of opening processing areas in a method of manufacturing a mask assembly according to an embodiment of the disclosure;

FIGS. 15A and 15B are schematic plan views of processes of a manufacturing method of a mask assembly according to an embodiment of the disclosure;

FIGS. 16A to 16D are schematic cross-sectional views of processes of a manufacturing method of a mask assembly according to an embodiment of the disclosure;

FIGS. 17A to 17C are schematic cross-sectional views of processes of a manufacturing method of a mask assembly according to an embodiment of the disclosure;

FIGS. 18A to 18C are schematic cross-sectional views of processes of a manufacturing method of a mask assembly according to an embodiment of the disclosure;

FIG. 19A is a schematic cross-sectional view of a deposition process using a mask assembly according to an embodiment of the disclosure; and FIG. 19B is an enlarged schematic cross-sectional view of an area CC of FIG. 19A.

6

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on," "connected to," or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

It will be understood that, although the terms first, second, and the like may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

The words "substantially the same as" used herein may mean that "substantially identical or similar to."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a method of manufacturing a mask assembly of the disclosure will be described with reference to the accompanying drawings.

Figure 1A:
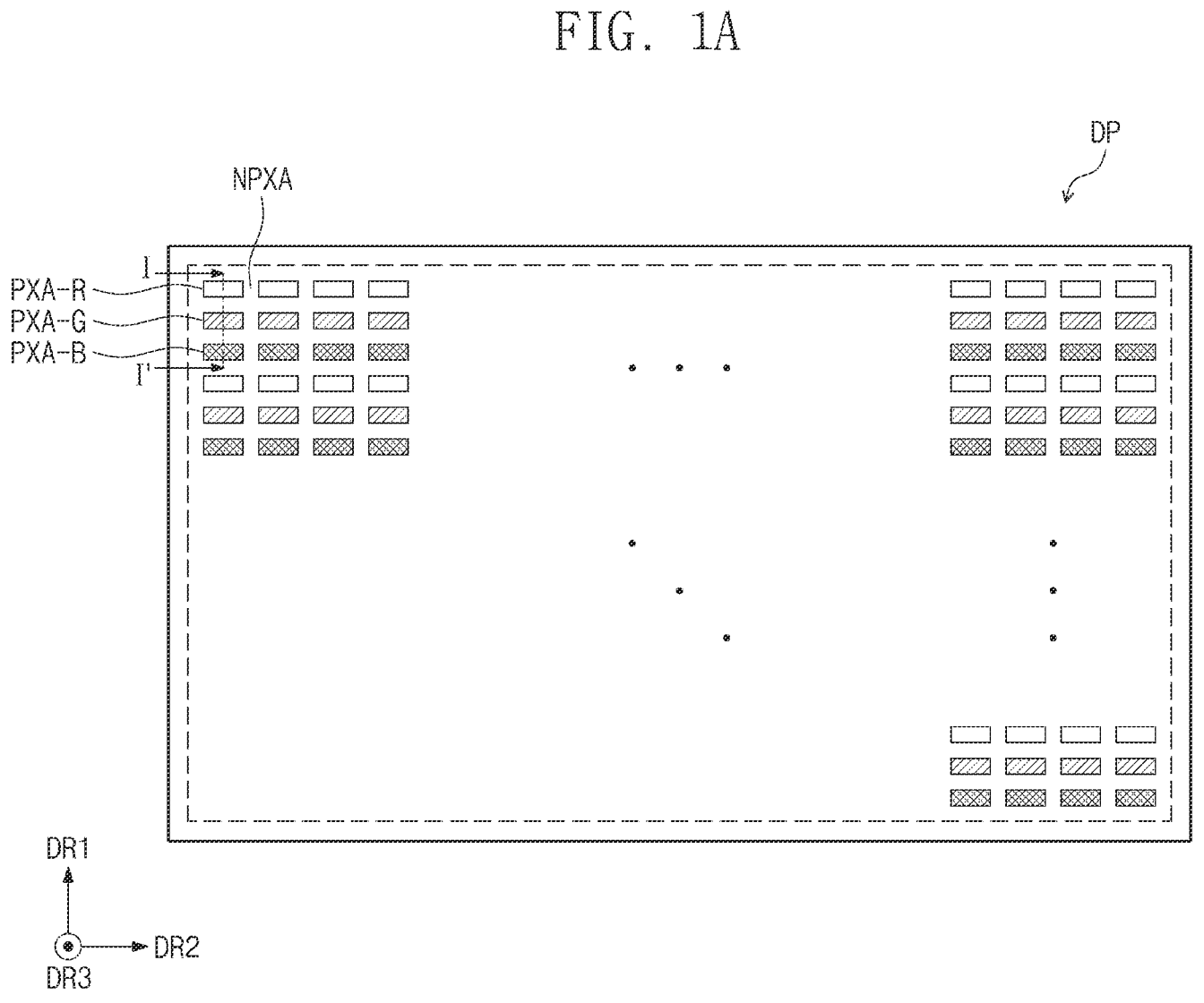
Figure 1B:
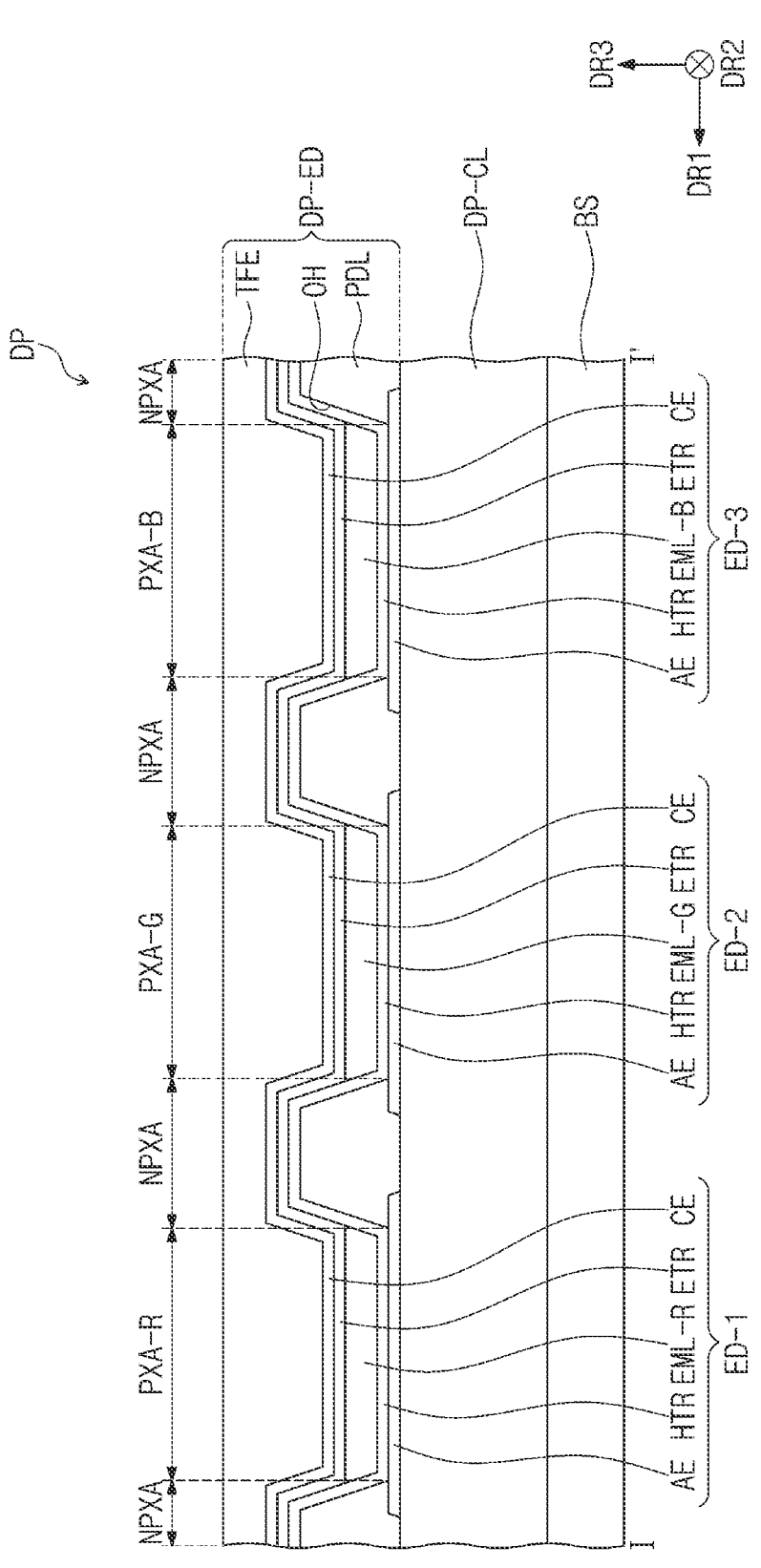
FIG. 1B is a schematic cross-sectional view of a display panel taken along a line I-I' of FIG. 1A according to an embodiment of the disclosure.

FIG. 1A is a schematic plan view of a display panel DP when viewed in a third direction DR3 (or in a plan view) according to an embodiment of the disclosure. FIG. 1B is a schematic cross-sectional view of the display panel DP taken along line I-I' of FIG. 1A according to an embodiment of the disclosure.

A direction intersecting a plane defined by a first direction DR1 and a second direction DR2 may be defined as a third direction DR3 in the disclosure. Front (or upper) and rear (or lower) surfaces of each member (or each unit) of the display panel DP may be defined with respect to a plane substantially parallel to each of the first and second directions DR1 and DR2. The front and rear surfaces may be opposite to each other in the third direction DR3, and a normal line direction of each of the front and rear surfaces may be substantially parallel to the third direction DR3.

In the disclosure, a separation distance between the front and rear surfaces of each member (or each unit) in the third direction DR3 may correspond to a thickness of the member (or the unit). In the disclosure, the expression "when viewed in a plane" or "in a plan view" may mean a state of being viewed in the third direction DR3. In the disclosure, the expression "when viewed in a cross-section" or "in a cross-sectional view" may mean a state of being viewed in the first direction DR1 or the second direction DR2. Directions indicated by the first, second, and third directions DR1, DR2, and DR3 may be relative to each other, and thus, the directions indicated by the first, second, and third directions DR1, DR2, and DR3 may be changed to other directions.

The display panel DP may be activated in response to electrical signals and may display an image. The display panel DP may be applied to various display devices. As an example, the display panel DP may be applied to a large-sized electronic item, such as a television set, an outdoor billboard, etc., and a small and medium-sized electronic item, such as a monitor, a mobile phone, a tablet computer, a navigation unit, a game unit, etc.

The display panel DP according to an embodiment may be a light-emitting type display panel, however, it should not be particularly limited. For instance, the display panel DP may be an organic light emitting display panel, an inorganic light emitting display panel, or a quantum dot light emitting display panel. A light emitting layer of the organic light emitting display panel may include an organic light emitting material. A light emitting layer of the inorganic light emitting display panel may include an inorganic light emitting material. A light emitting layer of the quantum dot light emitting display panel may include a quantum dot or a quantum rod. Hereinafter, the organic light emitting display panel will be described as a representative example of the display panel DP.

Referring to FIGS. 1A and 1B, the display panel DP may include light emitting areas PXA-R, PXA-G, and PXA-B and a non-light-emitting area NPXA surrounding the light emitting areas PXA-R, PXA-G, and PXA-B.

The light emitting areas PXA-R, PXA-G, and PXA-B may include a first light emitting area PXA-R, a second light emitting area PXA-G, and a third light emitting area PXA-B. The first light emitting area PXA-R, the second light emitting area PXA-G, and the third light emitting area PXA-B may be distinguished from each other on the plane substantially parallel to the first and second directions DR1 and DR2. The non-light-emitting area NPXA may surround the first, second, and third light emitting areas PXA-R, PXA-G, and PXA-B adjacent to each other.

The first light emitting area PXA-R, the second light emitting area PXA-G, and the third light emitting area PXA-B may be distinguished from each other depending on colors of lights emitted therethrough. As an example, the first light emitting area PXA-R may be a red light emitting area, the second light emitting area PXA-G may be a green light emitting area, and the third light emitting area PXA-B may be a blue light emitting area. However, the colors of the lights emitted from the light emitting areas PXA-R, PXA-G, and PXA-B should not be limited thereto or thereby.

The first, second, and third light emitting areas PXA-R, PXA-G, and PXA-B may be arranged in a form (e.g., a predetermined or selectable form), and FIG. 1A shows a structure in which the first, second, and third light emitting areas PXA-R, PXA-G, and PXA-B are arranged in a stripe form as a representative example. The first light emitting area PXA-R, the second light emitting area PXA-G, and the third light emitting area PXA-B may be sequentially and repeatedly arranged with each other in the first direction DR1. Referring to FIG. 1A, each of the first, second, and third light emitting areas PXA-R, PXA-G, and PXA-B may be provided in plural, and the first light emitting areas PXA-R, the second light emitting areas PXA-G, and the third light emitting areas PXA-B may be arranged in the second direction DR2.

The arrangement of the first, second, and third light emitting areas PXA-R, PXA-G, and PXA-B should not be limited to the structure shown in FIG. 1A, and the arrangement, size, and shape of the first, second, and third light emitting areas PXA-R, PXA-G, and PXA-B may be designed in various ways depending on characteristics of display quality required for the display panel DP. As an example, the first, second, and third light emitting areas PXA-R, PXA-G, and PXA-B may be arranged in a PEN-TILE® form or a lozenge form.

The display panel DP shown in FIGS. 1A and 1B may include at least one functional layer formed using a mask that is manufactured by a mask assembly manufacturing method described below. As an example, the display panel DP may include at least one functional layer commonly formed over the light emitting areas PXA-R, PXA-G, and PXA-B and the non-light-emitting area NPXA, and the functional layer may be formed by using the mask that may be manufactured by the mask assembly manufacturing method described below.

FIG. 1B shows a schematic cross-section of the display panel DP in the first, second, and third light emitting areas PXA-R, PXA-G, and PXA-B. Referring to FIG. 1B, the display panel DP may include a base layer BS, a circuit layer DP-CL, and a display element layer DP-ED. The display element layer DP-ED of the display panel DP may include light emitting elements ED-1, ED-2, and ED-3.

The base layer BS may provide a base surface on which the circuit layer DP-CL may be disposed. In an embodiment, the base layer BS may include at least one of glass, synthetic resin, and organic/inorganic composite material. However, the embodiments are not limited thereto. The base layer BS may have a single-layer or multi-layer structure. As an example, the base layer BS having the multi-layer structure may include synthetic resin layers and at least one inorganic layer disposed between the synthetic resin layers.

The circuit layer DP-CL may include driving elements and signal lines connected to the light emitting elements ED-1, ED-2, and ED-3. The circuit layer DP-CL may include a semiconductor pattern and a conductive pattern, which form a driving circuit of a pixel. The circuit layer DP-CL may be formed by forming an insulating layer, a semiconductor layer, and a conductive layer on the base layer BS by using a coating or depositing process and selectively patterning the semiconductor layer and the conductive layer through several photolithography processes.

The display element layer DP-ED may be disposed on the circuit layer DP-CL. The display element layer DP-ED may include the light emitting elements ED-1, ED-2, and ED-3, a pixel definition layer PDL, and an encapsulation layer TFE. Each of the light emitting elements ED-1, ED-2, and ED-3 may include a first electrode AE, a hole transport region HTR, a corresponding light emitting layer among light emitting layers EML-R, EML-G, and EML-B, an electron transport region ETR, and a second electrode CE.

The first electrode AE may be disposed on the circuit layer DP-CL and may be electrically connected to a corresponding driving element among the driving elements of the circuit layer DP-CL. The pixel definition layer PDL may be provided with light emitting openings OH defined therethrough to expose a portion of the first electrodes AE of the light emitting elements ED-1, ED-2, and ED-3. Portions of the first electrodes AE exposed through the light emitting openings OH of the pixel definition layer PDL may correspond to the light emitting areas PXA-R, PXA-G, and PXG-B, respectively. An area in which the pixel definition layer PDL may be disposed may correspond to the non-light-emitting area NPXA surrounding the light emitting areas PXA-R, PXA-G, and PXG-B.

As shown in FIG. 1B, the light emitting layers EML-R, EML-G, and EML-B of the light emitting elements ED-1, ED-2, and ED-3 may be disposed in the light emitting openings OH defined through the pixel definition layer PDL, respectively. The light emitting layers EML-R, EML-G, and EML-B may be provided in the form of a pattern to correspond to the light emitting openings OH, however, they should not be limited thereto or thereby. According to an embodiment, the light emitting layers EML-R, EML-G, and EML-B of the light emitting elements ED-1, ED-2, and ED-3 may be provided integrally with each other as a common layer.

Each of the hole transport region HTR, the electron transport region ETR, and the second electrode CE may be provided as a common layer. The hole transport region HTR, the electron transport region ETR, and the second electrode CE may be formed to overlap the light emitting areas PXA-R, PXA-G, and PXG-B and the non-light-emitting area NPXA. At least one of the hole transport region HTR, the electron transport region ETR, and the second electrode CE each being provided as the common layer may be formed using a mask described below, and the mask may be referred to as an open mask. The mask may be manufactured by the mask assembly manufacturing method according to an embodiment of the disclosure.

A first voltage may be applied to the first electrodes AE via the driving element of the circuit layer DP-CL, and a common voltage may be applied to the second electrode CE. Holes and electrons, which may be injected into the light emitting layers EML-R, EML-G, and EML-B, may be recombined with each other to generate excitons. The light emitting elements ED-1, ED-2, and ED-3 may emit the light in case that the excitons return to a ground state from an excited state.

The encapsulation layer TFE may be disposed on the light emitting elements ED-1, ED-2, and ED-3. The encapsulation layer TFE may encapsulate the light emitting elements ED-1, ED-2, and ED-3. The encapsulation layer TFE may include multiple thin films to improve an optical efficiency of the light emitting elements ED-1, ED-2, and ED-3 or to protect the light emitting elements ED-1, ED-2, and ED-3.

The encapsulation layer TFE may include at least one inorganic layer and an organic layer. The inorganic layer of the encapsulation layer TFE may protect the light emitting elements ED-1, ED-2, and ED-3 from moisture and/or oxygen. The inorganic layer of the encapsulation layer TFE may include silicon nitride, silicon oxide, or compounds thereof. The inorganic layer of the encapsulation layer TFE may be formed by a chemical vapor deposition (CVD) method, however, it should not be limited thereto or thereby.

The organic layer of the encapsulation layer TFE may protect the light emitting elements ED-1, ED-2, and ED-3 from a foreign substance such as dust particles. The organic layer of the encapsulation layer TFE may be formed on the inorganic layer and may provide a flat surface. The organic layer may cover particles or flexures existing in the inorganic layer disposed under the organic layer. The organic layer may relieve a stress between the layers which contact the organic layer. As an example, the organic layer of the encapsulation layer TFE may include an acrylic-based resin, however, the organic layer should not be limited thereto or thereby. The organic layer may be formed by a spin coating process, a slit coating process, or an inkjet process, however, it should not be limited thereto or thereby.

The insulating layers of the circuit layer DP-CL and some insulating layers of the encapsulation layer TFE may be formed using the mask described below, and the mask may be manufactured by the mask assembly manufacturing method of the disclosure.

Figure 2:
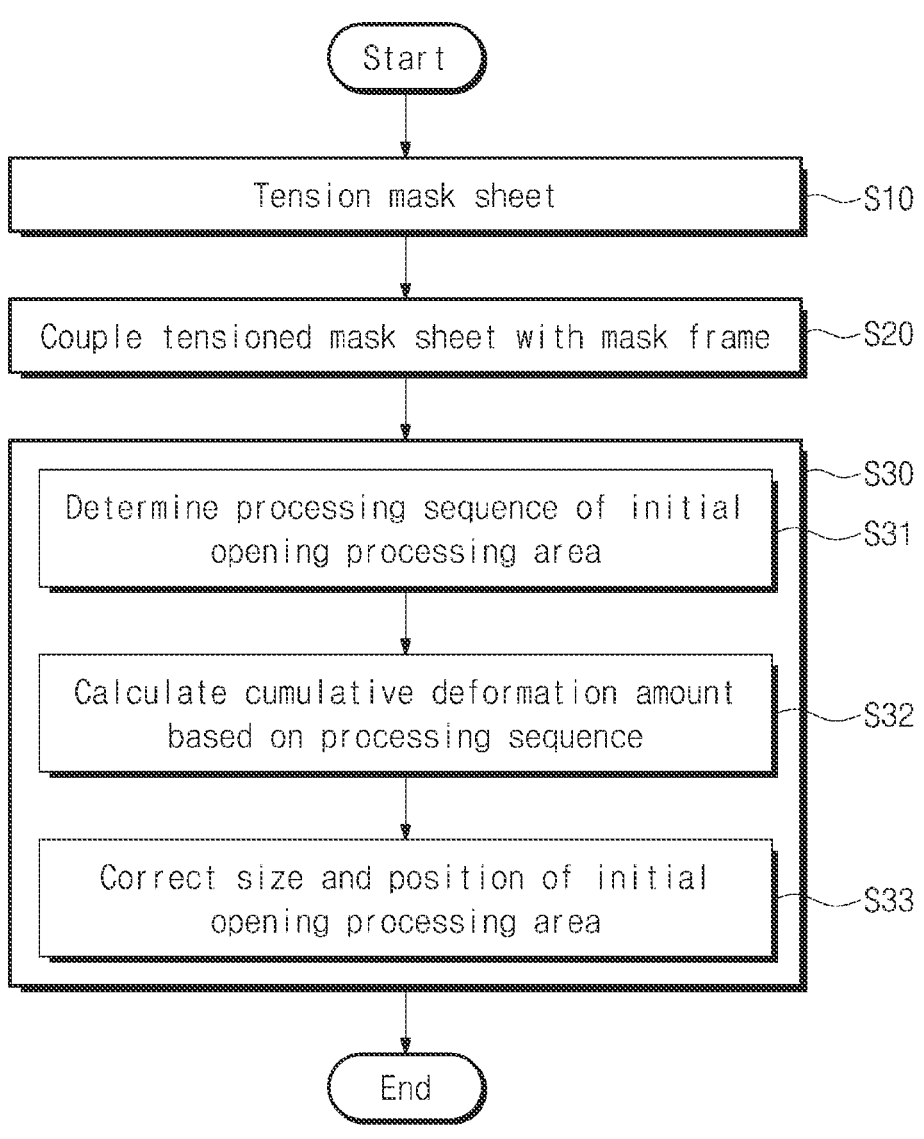
FIG. 2 is a flowchart of a method of manufacturing a mask assembly according to an embodiment of the disclosure.

FIG. 2 is a flowchart showing the mask assembly manufacturing method according to an embodiment of the disclosure. Referring to FIG. 2, the mask assembly manufacturing method may include tensioning a mask sheet (S10), coupling (or connecting) the tensioned mask sheet with a mask frame (S20), forming openings through the tensioned mask sheet (S30).

The forming of the openings through the tensioned mask sheet (S30) may include determining a processing sequence of an initial opening processing area (S31), calculating a cumulative deformation amount based on the processing sequence (S32), and correcting a size and a position of the initial opening processing area (S33).

The initial opening processing area may be provided in plural, and the initial opening processing areas may be imaginary areas that may be initially set to respectively correspond to the openings to be formed through the tensioned mask sheet. The processing sequence determined in the determining of the processing sequence of the initial opening processing areas (S31) may correspond to the order of irradiating a laser beam to form the openings. In the process of forming the openings through the mask sheet, a size and a position of openings that may be previously formed may be changed depending on the processing sequence and the deformation amount accumulated by a tensile force applied to the tensioned mask sheet. Accordingly, the mask assembly manufacturing method according to the disclosure may include predicting and calculating the cumulative deformation amount acting on each of the openings and correcting the size and the position of the initial opening processing area by taking into account the calculated cumulative deformation amount to form the openings precisely through positions that may be initially designed. An opening processing area whose size and position are corrected may correspond to the opening processing area to which the laser beam may be substantially irradiated. Detailed descriptions of each process of the mask assembly manufacturing method will be described with reference to the drawings below.

Figure 3:
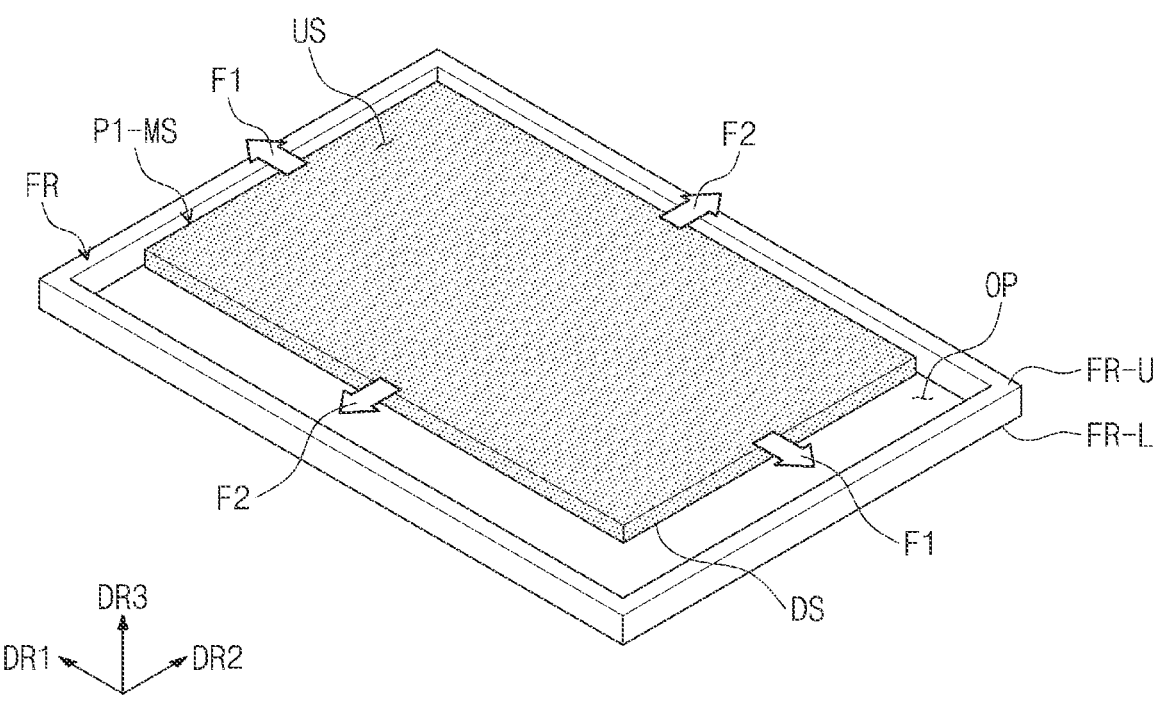
FIG. 3 is a schematic perspective view of a process of a manufacturing method of a mask assembly according to an embodiment of the disclosure.
Figure 4:
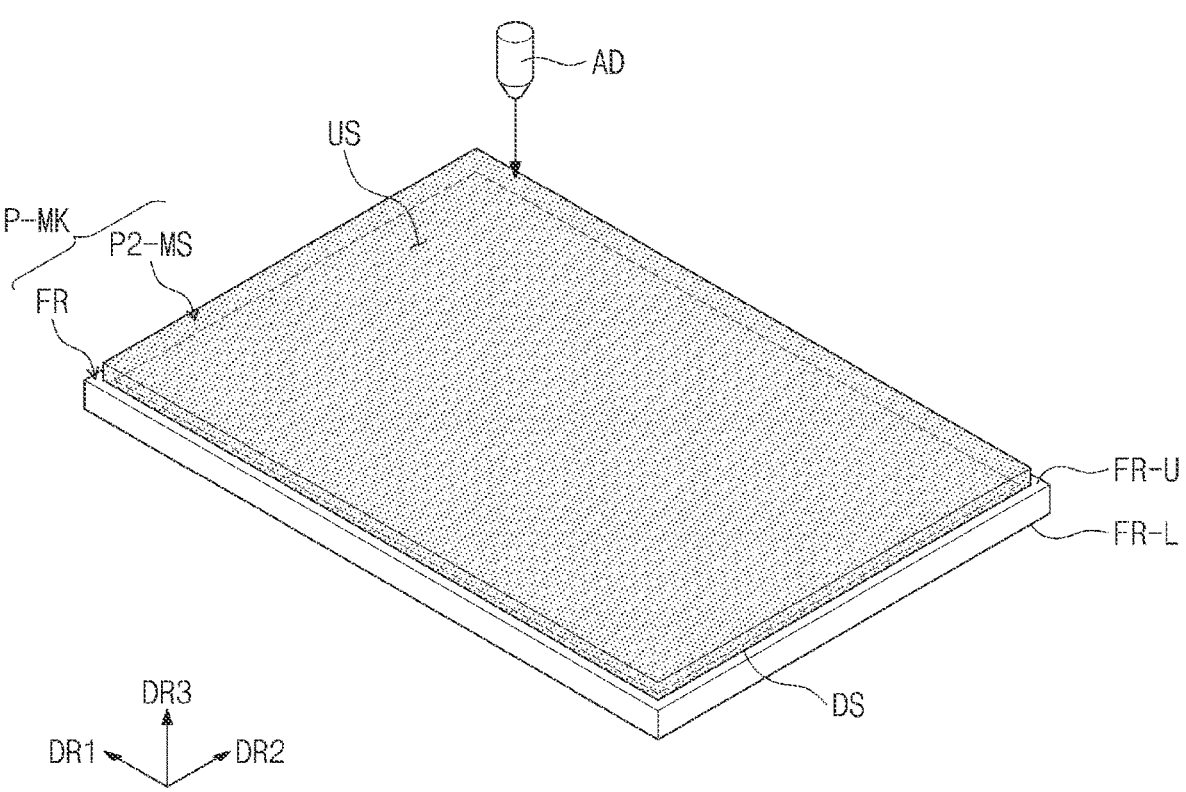
FIG. 4 is a schematic perspective view of a process of a manufacturing method of a mask assembly according to an embodiment of the disclosure.

FIGS. 3 and 4 are schematic perspective views of processes of the mask assembly manufacturing method according to an embodiment of the disclosure. The process shown in FIG. 3 may correspond to the tensioning of the mask sheet P1-MS (S10), and the process shown in FIG. 4 may correspond to the coupling of the tensioned mask sheet P2-MS with the mask frame FR (S20). Hereinafter, the mask sheet P1-MS before being tensioned will be referred to as a preliminary mask sheet P1-MS, and the tensioned mask sheet P2-MS will be referred to as a tension mask sheet P2-MS.

Referring to FIG. 3, the preliminary mask sheet P1-MS and the mask frame FR may be provided to manufacture the mask assembly. The preliminary mask sheet P1-MS may be tensioned and may be provided on the mask frame FR, and the mask frame FR may support the tension mask sheet P2-MS (refer to FIG. 4).

A frame opening OP may be defined through an upper side FR-U and a lower side FR-L of the mask frame FR. The mask frame FR may have a ring shape in a plane. FIGS. 3 and 4 show the mask frame FR having a quadrangular ring shape as a representative example, however, the shape of the mask frame FR should not be particularly limited as long as the mask frame FR may support the tension mask sheet P2-MS. As an example, the mask frame FR may have a variety of shapes, e.g., a circular ring shape or a polygonal ring shape, to correspond to the shape of the tension mask sheet P2-MS disposed on the mask frame FR.

The mask frame FR may include a metal material. In an embodiment, the mask frame FR may be formed of the metal material containing at least one of iron (Fe), nickel (Ni), and cobalt (Co). As an example, the mask frame FR may include a nickel-cobalt alloy or a nickel-iron alloy. The mask frame FR may include stainless steel (SUS) or Invar, however, the material for the mask frame FR should not be limited thereto or thereby.

The preliminary mask sheet P1-MS may have a plate shape extending in the first direction DR1 and the second direction DR2. The preliminary mask sheet P1-MS may have a quadrangular shape with long sides extending in the first direction DR1 and short sides extending in the second direction DR2 when viewed in the plane, however, it should not be limited thereto or thereby. According to an embodiment, the preliminary mask sheet P1-MS may be manufactured to have a variety of shapes according to a shape of a target substrate providing a surface to be deposited (hereinafter, referred to as a deposition surface).

The preliminary mask sheet P1-MS may include a first surface US and a second surface DS, which may be substantially parallel to the first direction DR1 and the second direction DR2. A normal line direction of the first surface US and the second surface DS may be substantially parallel to the third direction DR3. The first surface US and the second surface DS may be opposite to each other in the third direction DR3. The first surface US may correspond to an upper surface of the preliminary mask sheet P1-MS, and the second surface DS may correspond to a lower surface of the preliminary mask sheet P1-MS.

In an embodiment, the preliminary mask sheet P1-MS may include a metal material. For example, the preliminary mask sheet P1-MS may be formed of the metal material containing at least one of iron (Fe), nickel (Ni), and cobalt (Co). As an example, the preliminary mask sheet P1-MS may include a nickel-cobalt alloy or a nickel-iron alloy. The preliminary mask sheet P1-MS may include stainless steel (SUS) or Invar. The preliminary mask sheet P1-MS may include the same material as that of the mask frame FR, however, the material for the preliminary mask sheet P1-MS should not be limited thereto or thereby.

The preliminary mask sheet P1-MS may have a thermal expansion coefficient equal to or smaller than about 5 ppm/° C. The mask frame FR may also have a thermal expansion coefficient similar to that of the preliminary mask sheet P1-MS. Accordingly, a thermal deformation of the mask sheet MS (refer to FIG. 7) may be reduced in a deposition process in which the mask sheet MS (refer to FIG. 7) manufactured from the preliminary mask sheet P1-MS through subsequent processes may be used, and a deposition quality of a deposition layer formed on the target substrate may be improved.

Referring to FIG. 3, the preliminary mask sheet P1-MS may have a size smaller than an outer edge of the mask frame FR when viewed in the plane. Accordingly, the preliminary mask sheet P1-MS may be tensioned in the tensioning of the mask sheet (S10, refer to FIG. 2) to couple (or connect) the preliminary mask sheet P1-MS with the mask frame FR. For example, the preliminary mask sheet P1-MS may be tensioned to correspond to the size of the mask frame FR.

The short sides of the preliminary mask sheet P1-MS, which extend in the second direction DR2, may be tensioned in an outer direction substantially parallel to the first direction DR1 by a first tensile force F1. The long sides of the preliminary mask sheet P1-MS, which extend in the first direction DR1, may be tensioned in an outer direction substantially parallel to the second direction DR2 by a second tensile force F2. An intensity of the first tensile force F1 and an intensity of the second tensile force F2 may be controlled according to a degree of the tensioning of the preliminary mask sheet P1-MS, and the first tensile force F1 may have the intensity different from the intensity of the second tensile force F2, however, it should not be limited thereto or thereby. According to an embodiment, the first tensile force F1 and the second tensile force F2 may have substantially the same intensity.

Referring to FIG. 4, the tension mask sheet P2-MS may have a size greater than that of the preliminary mask sheet P1-MS when viewed in the plane. Accordingly, the tension mask sheet P2-MS may overlap at least a portion of the upper side FR-U of the mask frame FR when viewed in the plane (or in a plan view). The tension mask sheet P2-MS may be disposed on the mask frame FR such that the second surface DS of the tension mask sheet P2-MS may face the upper side FR-U of the mask frame FR.

The mask frame FR may be disposed under the second surface DS of the tension mask sheet P2-MS and may support an edge of the tension mask sheet P2-MS, however, it should not be limited thereto or thereby. According to an embodiment, the mask frame FR may support edges of the first surface US and the second surface DS of the tension mask sheet P2-MS according to a shape of the mask frame FR.

In the coupling of the tension mask sheet P2-MS with the mask frame FR (S20, refer to FIG. 2), the tension mask sheet P2-MS may be fixed to the mask frame FR. The tension mask sheet P2-MS may be coupled with the mask frame FR by a welding process. A welding portion AD of a mask assembly manufacturing apparatus may weld the tension mask sheet P2-MS to the mask frame FR along the edge of the tension mask sheet P2-MS overlapping the mask frame FR. The tension mask sheet P2-MS and the mask frame FR coupled with the tension mask sheet P2-MS may form a preliminary mask assembly P-MK.

The tension mask sheet P2-MS may have a thickness (e.g., a predetermined or selectable thickness), and the thickness of the tension mask sheet P2-MS may correspond to a distance in the third direction DR3 between the first surface US and the second surface DS of the tension mask sheet P2-MS. As an example, the thickness of the tension mask sheet P2-MS may be equal to or greater than about 50 $\mu$m and equal to or smaller than about 300 $\mu$m . However, the thickness of the tension mask sheet P2-MS should not be limited thereto or thereby.

The tensile forces F1 and F2 (refer to FIG. 3) applied in the tensioning process (S10, refer to FIG. 2) may act on the tension mask sheet P2-MS. In detail, the first tensile force F1 may act on the tension mask sheet P2-MS in a direction substantially parallel to the first direction DR1, and the second tensile force F2 may act on the tension mask sheet P2-MS in a direction substantially parallel to the second direction DR2. The tensile forces F1 and F2 acting on the tension mask sheet P2-MS may exert influence on (e.g., affect, modify, or change) the size and the position of the openings in the forming of the openings through the tension mask sheet P2-MS. This will be described in detail below.

Figure 5:
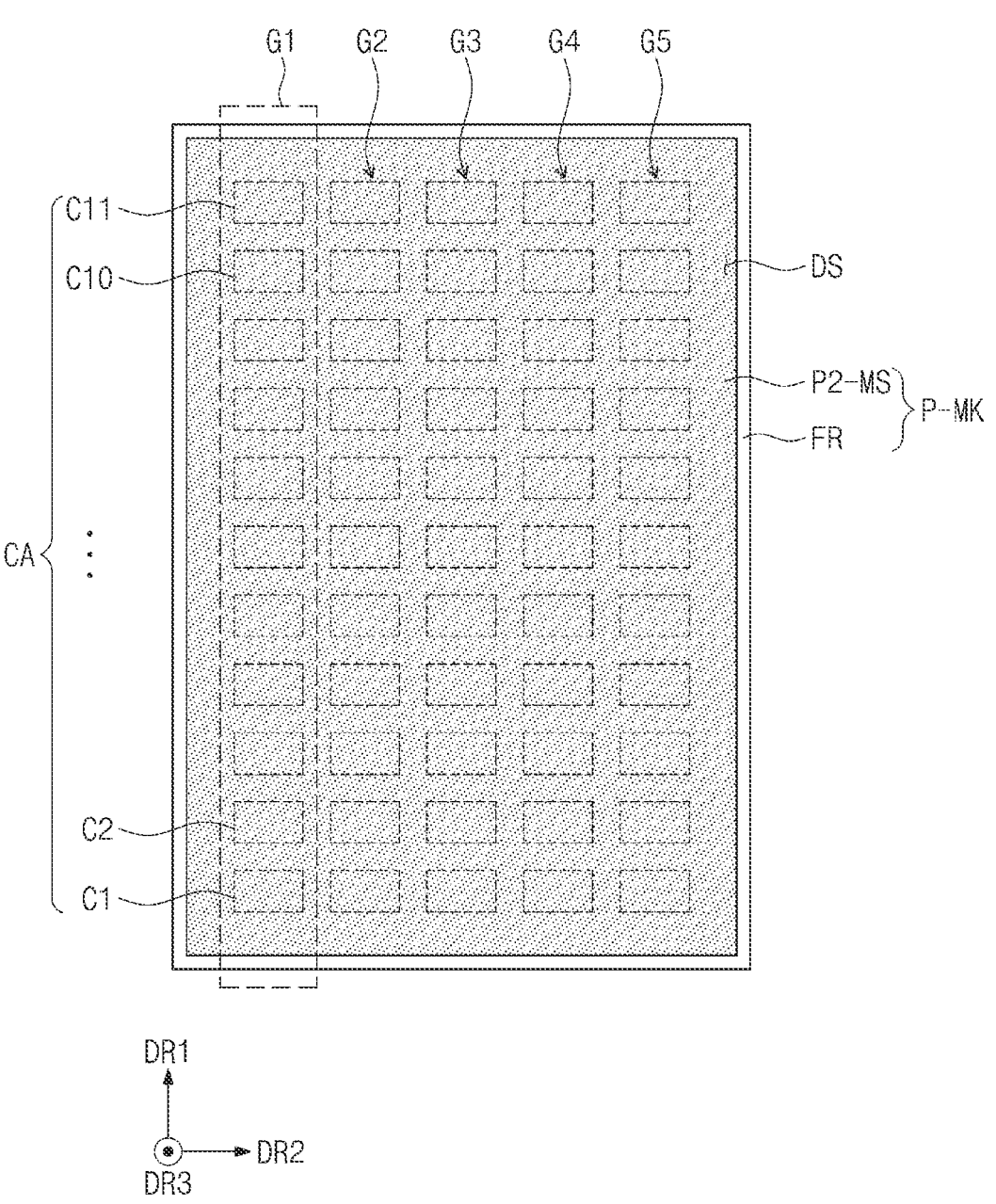
FIG. 5 is a schematic plan view of a process of a manufacturing method of a mask assembly according to an embodiment of the disclosure.

FIG. 5 is a schematic plan view of a process of the mask assembly manufacturing method according to an embodiment of the disclosure. FIG. 5 is a schematic plan view of the preliminary mask assembly P-MK when viewed from the above of the second surface DS of the tension mask sheet P2-MS (or in a plan view).

Referring to FIG. 5, the opening processing areas CA may be defined in the tension mask sheet P2-MS in the forming of the openings (S30, refer to FIG. 2). The opening processing areas CA may correspond to the openings that may be formed through the tension mask sheet P2-MS. In detail, the opening processing areas CA may be defined by setting the initial opening processing areas to correspond to the openings to be formed through the tension mask sheet P2-MS and correcting the size and the position of each of the initial opening processing areas.

The initial opening processing areas may be defined in the tension mask sheet P2-MS by taking into account the arrangement, number, size and position of the openings to be finally formed through the tension mask sheet P2-MS. In the embodiment, the initial opening processing areas may be the imaginary areas to define the areas through which the openings are formed, and the opening processing areas CA may correspond to imaginary areas obtained by correcting the size and the position of each of the initial opening processing areas to allow the openings to be formed in the size and the position that are actually designed and may be the areas to which the laser beam may be substantially irradiated.

After the initial opening processing areas are defined through the tension mask sheet P2-MS, the processing sequence of each of the initial opening processing areas may be set in the determining of the processing sequence (S31, refer to FIG. 2). The processing sequence of each of the initial opening processing areas may be designed in various ways such that the processing time may be optimized according to a structure of the mask manufacturing apparatus.

After the processing sequence of the initial opening processing areas may be determined, the cumulative deformation amounts respectively acting on the initial opening processing areas may be calculated in the calculating of the cumulative deformation amount (S32, refer to FIG. 2) based on the processing sequence and the position of the initial opening processing areas and the tensile force acting on the tension mask sheet P2-MS.

After the calculating of the cumulative deformation amount (S32, refer to FIG. 2), the size and the position of the initial opening processing areas may be corrected based on the cumulative deformation amounts (S33, refer to FIG. 2). For example, the opening processing areas finally defined in the tension mask sheet P2-MS may respectively correspond to the initial opening processing areas whose size and position may be corrected. Accordingly, at least some of the opening processing areas CA may have a size and a position, which may be different from those of the initial opening processing areas initially defined in the tension mask sheet P2-MS.

The calculating of the cumulative deformation amount according to the processing sequence of the initial opening processing areas will be described in detail below with reference to accompanying drawings.

Referring to FIG. 5, the opening processing areas CA may be arranged in the first direction DR1 and the second direction DR2. The arrangement of the opening processing areas CA may be set to correspond to the arrangement of the openings to be formed through the tension mask sheet P2-MS.

The opening processing areas CA may include processing groups G1, G2, G3, G4, and G5 respectively defined by the opening processing areas arranged in the first direction DR1. The processing groups G1 to G5 may be arranged in the second direction DR2. FIG. 5 shows five processing groups G1 to G5 arranged in the second direction DR2 as a representative example, and each of the processing groups G1 to G5 may include eleven opening processing areas C1, C2, . . . , C10, and C11 (hereinafter, referred to as first, second, . . . , tenth, and eleventh opening processing areas).

However, the arrangement and the number of the opening processing areas CA should not be limited thereto or thereby.

FIG. 5 shows the structure in which the opening processing areas CA are arranged in the first direction DR1 and the second direction DR2, however, the disclosure should not be limited thereto or thereby. According to an embodiment, the opening processing areas CA may be arranged in one direction of the first direction DR1 and the second direction DR2. The arrangement of the opening processing areas CA may be changed in various ways depending on the size of the opening processing area and the size of the tension mask sheet P2-MS.

Each of the opening processing areas CA may have a quadrangular shape with short sides extending in the first direction DR1 and long sides extending in the second direction DR2 when viewed in the plane (or in a plan view). However, the shape of the opening processing areas CA should not be limited thereto or thereby and may be determined to correspond to the shape of the functional layers formed on the target substrate using the mask assembly. For example, the shape of the opening processing areas CA may vary depending on the shape of the openings to be formed through the tension mask sheet P2-MS.

FIG. 6 is a schematic perspective view explaining a process of the mask assembly manufacturing method. The process shown in FIG. 6 may correspond to the forming of the openings (S30, refer to FIG. 2). Referring to FIG. 6, a laser beam LSL may be irradiated to the opening processing areas CA defined in the tension mask sheet P2-MS to form the openings through the tension mask sheet P2-MS.

The preliminary mask assembly P-MK may be provided to a laser processing apparatus LPM to process the tension mask sheet P2-MS. The laser processing apparatus LPM may include a support unit MU and a light supply unit LU. The light supply unit LU may be disposed above the support unit MU. The preliminary mask assembly P-MK to be processed may be disposed between the support unit MU and the light supply unit LU. The preliminary mask assembly P-MK may be disposed on the support unit MU to allow the second surface DS of the tension mask sheet P2-MS to face the light supply unit LU.

The support unit MU may include a stage ST, a first direction moving unit SST-X, and a second direction moving unit SST-Y.

The stage ST may provide a space in which the preliminary mask assembly P-MK may be placed. The stage ST may support the preliminary mask assembly P-MK provided on an upper surface of the stage ST. The stage ST may hold the preliminary mask assembly P-MK such that the preliminary mask assembly P-MK may not be shaken during a movement process.

The stage ST may move in the first direction DR1 and the second direction DR2 by the first direction moving unit SST-X and the second direction moving unit SST-Y. The first direction moving unit SST-X and the second direction moving unit SST-Y may be disposed to cross (or intersect) each other. According to an embodiment, the second direction moving unit SST-Y may be disposed on the first direction moving unit SST-X, and the stage ST may be disposed on the second direction moving unit SST-Y, however, the disclosure should not be limited thereto or thereby.

The stage ST may move parallel to the second direction DR2 on the second direction moving unit SST-Y. The stage ST may move along a groove of the second direction moving unit SST-Y. For example, the stage ST may move in a left and right processing direction MD-Y substantially parallel to the second direction DR2 by the second direction moving unit SST-Y. As the stage ST moves by the second direction moving unit SST-Y, the laser beam LSL may be irradiated along the left and right processing direction MD-Y even though the light supply unit LU may be fixed.

The stage ST may move parallel to the first direction DR1 on the first direction moving unit SST-X. As an example, the second direction moving unit SST-Y on which the stage ST may be placed may move parallel to the first direction DR1 on the first direction moving unit SST-X. The stage ST and the second direction moving unit SST-Y may move along a groove of the first direction moving unit SST-X. For example, the stage ST may move in an upper and lower processing direction MD-X substantially parallel to the first direction DR1 by the first direction moving unit SST-X. As the stage ST moves by the first direction moving unit SST-X, the laser beam LSL may be irradiated along the upper and lower processing direction MD-X even though the light supply unit LU may be fixed.

FIG. 6 shows the second direction moving unit SST-Y disposed on the first direction moving unit SST-X as a representative example, however, the disclosure should not be limited thereto or thereby. According to an embodiment, the first direction moving unit SST-X may be disposed on the second direction moving unit SST-Y. The first direction moving unit SST-X and the second direction moving unit SST-Y should not be particularly limited as long as they may move the stage ST to the first direction DR1 and the second direction DR2. According to an embodiment, the stage ST may move on its own by a control unit without employing the first direction moving unit SST-X and the second direction moving unit SST-Y.

The light supply unit LU may include a light source unit LS, an optical unit OTP, and a scan unit SNP. The light source unit LS may supply a source laser beam to the optical unit OTP. The optical unit OTP may diffract, split, and redirect the source laser beam provided by the light source unit LS. The optical unit OTP may include optical elements, such as a diffractive optical element (DOE), an optical lens, a mirror, etc., to process the source laser beam. The scan unit SNP may control a size and a focus of the processed laser beam provided by the optical unit OTP and may irradiate the final laser beam LSL on the tension mask sheet P2-MS. The scan unit SNP may include optical elements, such as a mirror, a focus lens, etc.

The laser beam LSL used in the mask assembly manufacturing method may be a pulse laser beam. As an example, the laser beam LSL may be a pulse laser beam having a pulse width in a range of femtoseconds ($10^{-15}$ second) to picoseconds ($10^{-12}$ second). The laser beam LSL may have a short wavelength. As an example, the wavelength of the laser beam LSL may be within a range of about 400 nm to about 600 nm. For example, the wavelength at which the laser beam LSL provided as the pulse laser beam which may have a maximum intensity may be in a range of about 400 nm to about 600 nm.

The light supply unit LU may irradiate the laser beam LSL onto the tension mask sheet P2-MS. A surface of the tension mask sheet P2-MS to which the laser beam LSL may be irradiated may be changed according to the direction to which the preliminary mask assembly P-MK may be provided. As shown in FIG. 6, the preliminary mask assembly P-MK may be disposed on the stage ST to allow the second surface DS of the tension mask sheet P2-MS to face the light supply unit LU, and the laser beam LSL may be directly irradiated to the second surface DS of the tension mask sheet P2-MS.

The laser beam LSL may be irradiated to the opening processing areas CA defined in the tension mask sheet P2-MS. The laser beam LSL may be irradiated to each of the opening processing areas CA according to the processing sequence, which may be set in advance. The irradiation direction and location of the laser beam LSL may be controlled according to the movement of the support unit MU, however, it should not be limited thereto or thereby. In the process of irradiating the laser beam LSL, the support unit MU may be fixed, the light supply unit LU may move in the first direction DR1 and the second direction DR2, and the laser beam LSL may be irradiated to the opening processing areas CA.

The laser processing apparatus LPM may further include a suction unit SCU. The suction unit SCU may be disposed adjacent to one side of the stage ST. FIG. 6 shows the suction unit SCU disposed adjacent to the one side of the stage ST, which is substantially parallel to the second direction DR2, as a representative example. However, it should not be limited thereto or thereby. According to an embodiment, the suction unit SCU may be further disposed at another side of the stage ST or may be disposed on the stage ST. The suction unit SCU may suck dust generated during the irradiation of the laser beam in the forming of the openings (S30, refer to FIG. 2), and thus, may remove contaminants.

FIG. 7 is a schematic plan view of the mask assembly MK according to an embodiment of the disclosure. FIG. 7 shows the mask assembly MK including the mask manufactured by the mask assembly manufacturing method.

After the irradiation of the laser beam LSL shown in FIG. 6 is completed, openings CO may be formed through the tension mask sheet P2-MS (refer to FIG. 6). In the disclosure, the tension mask sheet through which the openings CO may be formed may be defined as the mask MS.

Referring to FIG. 7, the mask assembly MK may include the mask MS and the mask frame FR coupled with the mask MS. Openings CO may be defined through the mask MS in the third direction DR3 and may be arranged in the first direction DR1 and the second direction DR2.

The mask assembly MK manufactured by the mask assembly manufacturing method of the disclosure may be used to form the functional layer on the deposition surface of the target substrate. The mask assembly MK may be an open mask used to form a common layer provided as a thin layer in an area of the target substrate. The open mask may be used to form display panels on one target substrate with a large area and may be used to deposit the functional layer included in each of the display panels. For example, a deposition material may be deposited on the target substrate after passing through the openings CO defined through the mask MS to correspond to the openings CO.

The openings CO may be formed to respectively correspond to the opening processing areas CA (refer to FIG. 5). An arrangement of the openings CO may correspond to the arrangement of the opening processing areas CA (refer to FIG. 5). In detail, the openings CO may include opening groups GO1, GO2, GO3, GO4, and GO5 respectively corresponding to the processing groups G1 to G5 (refer to FIG. 5). Each of the opening groups GO1 to GO5 may include first, second, . . . , tenth, and eleventh openings CO1, CO2, . . . , CO10, and CO11 respectively corresponding to the first to eleventh processing areas C1 to C11 (refer to FIG. 5). Accordingly, the number of the openings CO may be the same as the number of the opening processing areas CA defined in the tension mask sheet P2-MS (refer to FIG. 5).

Each of the openings CO may have a shape corresponding to that of the opening processing areas CA (refer to FIG. 5).

The shape of the openings CO may be substantially the same as the shape of the opening processing areas CA (refer to FIG. 5). As an example, each of the openings CO may have a quadrangular shape with short sides extending in the first direction DR1 and long sides extending in the second direction DR2 to correspond to the shape of the opening processing areas CA (refer to FIG. 5).

At least some of the openings CO finally formed through the mask MS may have different sizes and positions from those of the opening processing areas CA (refer to FIG. 5) defined in the tension mask sheet P2-MS (refer to FIG. 5). As an example, the size and the position of the first opening CO1 corresponding to the first opening processing area C1 (refer to FIG. 5) may be different from the size and the position of the first opening processing area C1 (refer to FIG. 5).

In the disclosure, the expression "the position of one component is different from the position of another component" may mean that the position of a center point of one component may be different from the position of a center point of another component. For example, the expression that the position of the opening processing area is different from the position of the corresponding opening may mean that the center point of the opening processing area may be different from the center point of the corresponding opening.

As the laser beam LSL (refer to FIG. 6) is irradiated according to the processing sequence of the opening processing areas CA (refer to FIG. 5), the openings CO may be sequentially formed according to the processing sequence. In the process of sequentially forming the openings CO, the opening formed after the openings previously formed through the tension mask sheet P2-MS (refer to FIG. 5) may exert influence on the previously formed openings due to the tensile force acting on the tension mask sheet P2-MS (refer to FIG. 5). As an example, after the first opening CO1 is formed, the second opening CO2 may be formed by irradiating the laser beam LSL (refer to FIG. 6) to the second opening processing area C2 (refer to FIG. 5). In case that the second opening CO2 is formed, the first opening CO1 may move from an initially formed position under the influence of the second opening CO2.

Accordingly, since the opening processing areas CA (refer to FIG. 5) may be the areas set by correcting the size and the position in consideration of the deformation amount exerting influence on each of the openings CO to accurately form the openings CO at designed positions, the size and the position of the opening processing areas CA (refer to FIG. 5) may be different from the size and the position of the openings CO by the corrected amount. This will be described in detail below with reference to the accompanying drawings.

FIG. 8 is an enlarged schematic plan view of an area AA of FIG. 7 according to an embodiment of the disclosure. FIG. 9A is a schematic cross-sectional view of the mask assembly taken along line II-II' of FIG. 8 according to an embodiment of the disclosure. FIG. 9B is a schematic cross-sectional view of the mask assembly taken along line III-III' of FIG. 8 according to an embodiment of the disclosure.

Referring to FIG. 8, the first tensile force F1 may act on the mask MS in a direction substantially parallel to the first direction DR1, and the second tensile force F2 may act on the mask MS in a direction substantially parallel to the second direction DR2. The first tensile force F1 and the second tensile force F2 may correspond to the first and second tensile forces F1 and F2 acting on the preliminary mask sheet P1-MS (refer to FIG. 3) in the tensioning of the preliminary mask sheet P1-MS (S10, refer to FIG. 2).

FIG. 8 shows one opening CO formed by irradiating the laser beam LSL (refer to FIG. 6) to one opening processing area CA. In the case where the laser beam LSL (refer to FIG. 6) is irradiated to the opening processing area CA, the opening CO may be formed to be larger than the opening processing area CA in the direction in which the tensile forces F1 and F2 may be applied due to the tensile forces F1 and F2 acting on the mask MS. For example, the opening CO may be formed to be larger than the opening processing area CA by a deformation size DE. For the convenience of explanation, the deformation size DE is shown by hatching in FIG. 8, however, the inside of the opening CO corresponding to the deformation size DE may be substantially an empty space penetrating the mask MS.

The opening processing area CA may include a first side U, a second side D, a third side L, and a fourth side R when viewed in the plane. The first side U and the second side D of the opening processing area CA may extend in the second direction DR2 and may be spaced apart from each other in the first direction DR1. The third side L and the fourth side R of the opening processing area CA may extend in the first direction DR1 and may be spaced apart from each other in the second direction DR2.

The opening processing area CA may be defined to have a first width W1-*a* in the first direction DR1 and to have a second width W2-*a* in the second direction DR2. The first width W1-*a* of the opening processing area CA may correspond to a distance between the first side U and the second side D and may correspond to a length of each of the third side L and the fourth side R. The second width W2-*a* of the opening processing area CA may correspond to a distance between the third side L and the fourth side R and may correspond to a length of each of the first side U and the second side D.

The first side U of the opening processing area CA may be deformed by a first deformation amount d1 in an upward direction by the first tensile force F1 acting in the upward direction parallel to the first direction DR1 when viewed in the plane. The second side D of the opening processing area CA may be deformed by the first deformation amount d1 in a downward direction by the first tensile force F1 acting in the downward direction parallel to the first direction DR1 when viewed in the plane. In the disclosure, the upward direction and the downward direction may be substantially parallel to the first direction DR1 and may be opposite to each other. The upward direction and the downward direction may be relative to each other and may be changed to other directions depending on the direction in which the tensile force acts.

The third side L of the opening processing area CA may be deformed by a second deformation amount d2 in a leftward direction by the second tensile force F2 acting in the leftward direction parallel to the second direction DR2 when viewed in the plane. The fourth side R of the opening processing area CA may be deformed by the second deformation amount d2 in a rightward direction by the second tensile force F2 acting in the rightward direction parallel to the second direction DR2 when viewed in the plane. In the disclosure, the leftward direction and the rightward direction may be substantially parallel to the second direction DR2 and may be opposite to each other. The leftward direction and the rightward direction may be relative to each other and may be changed to other directions depending on the direction in which the tensile force acts.

Accordingly, in case that the opening CO is formed, the size of the opening processing area CA may expand by the deformation size DE due to the tensile forces F1 and F2 acting on the mask MS, and the size of the opening CO finally formed through the mask MS may become larger than the size of the opening processing area CA defined in the tension mask sheet P2-MS (refer to FIG. 5) by the deformation size DE.

In detail, the opening CO may have a third width W1-*o* in the first direction DR1 and may have a fourth width W2-*o* in the second direction DR2. The third width W1-*o* of the opening CO may be greater than the first width W1-*a* of the opening processing area CA by two times of the first deformation amount d1. The fourth width W2-*o* of the opening CO may be greater than the second width W2-*a* of the opening processing area CA by two times of the second deformation amount d2.

A size of the first deformation amount d1 may be changed depending on the first tensile force F1, the size of the opening processing area CA, a cross-sectional size to which the first tensile force F1 may be applied, and a material for the mask MS. This will be described in detail with reference to FIGS. 9A and 9B.

The first deformation amount d1 may satisfy the following Equation 1.

$$d1 = \frac{F1 \cdot P1}{A1 \cdot E} \qquad \text{[Equation 1]}$$

In Equation 1, F1 denotes the first tensile force F1 shown in FIGS. 8 and 9A. In Equation 1, P1 denotes a distance P1 from a center CT of the opening processing area CA to the first side U or the second side D to which the first tensile force F1 may be applied. The distance P1 may correspond to a half of the first width W1-*a* of the opening processing area CA. As shown in FIG. 9B, A1 of Equation 1 denotes the cross-sectional size A1 to which the first tensile force F1 may be applied in the opening processing area CA. Cross-sections to which the first tensile force F1 may be applied in the opening processing area CA may include the first side U and the second side D. Accordingly, the cross-sectional size A1 may be proportional to the length of the first side U or the second side D. For example, the cross-sectional size A1 may correspond to a size obtained by multiplying the second width W2-*a* of the opening processing area CA by a thickness TH of the mask MS. In Equation 1, E denotes an elastic modulus of the mask MS.

Similarly, the second deformation amount d2 may be proportional to the second tensile force F2 and a distance from the center CT of the opening processing area CA to the third side L or the fourth side R to which the second tensile force F2 may be applied, and may be inversely proportional to a cross-sectional size of the opening processing area CA to which the second tensile force F2 may be applied, and the elastic modulus of the mask MS.

The opening CO may be expanded more than the area processed by the laser beam due to the tensile forces F1 and F2 acting on the mask MS. For example, the size of the opening processing area CA corresponding to the area to which the laser beam may be irradiated may be corrected by taking into account the deformation size DE. In other words, in case that the opening CO is designed to have a size of A, the opening processing area CA may be set to have a size that may be smaller than the size of A by the deformation size DE.

FIG. 10 is a schematic plan view of a process of the mask assembly manufacturing method according to an embodiment of the disclosure. FIG. 10 shows the process of calculating the cumulative deformation amount and correcting the position of the initial opening processing area. For the convenience of explanation, FIG. 10 shows an n-th initial opening processing area Cn', which is a target to calculate the cumulative deformation amount, and shows the processing sequence of the initial opening processing areas, which exerts an influence on the calculation of the cumulative deformation amount of the n-th initial opening processing area Cn'.

Referring to FIG. 10, the n-th initial opening processing area Cn' among the initial opening processing areas may be an opening area that may be processed at an n-th order. The initial opening processing areas that exert influence on the calculation of the cumulative deformation amount of the n-th initial opening processing area Cn' may be initial opening processing areas arranged from the n-th initial opening processing area Cn' to a direction substantially parallel to the direction in which the tensile force acts. For example, the initial opening processing areas that exert influence on the calculation of the cumulative deformation amount of the n-th initial opening processing area Cn' may be arranged from the n-th initial opening processing area Cn' to the first direction DR1 or the second direction DR2. Among the initial opening processing areas, the initial opening processing areas arranged parallel to the n-th initial opening processing area Cn' in the first direction DR1 may be defined as a first group Ga, and the initial opening processing areas arranged parallel to the n-th initial opening processing area Cn' in the second direction DR2 may be defined as a second group Gb.

The cumulative deformation amount of the n-th initial opening processing area Cn' may vary depending on the number and the position of the initial opening processing areas processed later than the n-th initial opening processing area Cn'. For example, among the initial opening processing areas of the first group Ga and the second group Gb, the opening processing areas processed after the n-th initial opening processing area Cn' may exert influence on an opening (hereinafter, referred to as an n-th opening) formed to correspond to the n-th initial opening processing area Cn'.

As an example, in the embodiment shown in FIG. 10, in case that an initial opening processing area, i.e., an (n+1)th initial opening processing area, which may be disposed in the upward direction of the n-th initial opening processing area Cn' in the plane and may be processed at an (n+1)th order, is processed, an (n+1)th opening may be formed while being expanded due to the tensile force. As the (n+1)th opening is expanded in case of being formed, the position of the n-th opening may move in the downward direction. For example, a position of a center point of the n-th opening may move in the downward direction by the processing of the (n+1)th initial opening processing area. In this way, when an initial opening processing area, i.e., an (n+5)th initial opening processing area, which may be disposed in the downward direction of the n-th initial opening processing area Cn' in the plane and may be processed at an (n+5)th order, is processed, the position of the center point of the n-th opening may move in the upward direction. An initial opening processing area, i.e., an (n+11)th initial opening processing area, which may be disposed in the rightward direction of the n-th initial opening processing area Cn' in the plane and may be processed at an (n+11)th order, is processed, the position of the center point of the n-th opening may move in the leftward direction.

The processing areas processed prior to the n-th initial opening processing area Cn' may not exert influence on the cumulative deformation amount of the n-th initial opening processing area Cn'. As an example, according to the embodiment shown in FIG. 10, an (n−1)th initial opening processing area may be arranged parallel to the n-th initial opening processing area Cn' in the first direction DR1, and an (n−11)th initial opening processing area may be arranged parallel to the n-th initial opening processing area Cn' in the second direction DR2. However, the (n−1)th and (n−11)th initial opening processing areas may not exert influence on the cumulative deformation amount of the n-th initial opening processing area Cn'.

Among the initial opening processing areas of the first group Ga, the number of the initial opening processing areas processed after the n-th initial opening processing area Cn' and disposed in the upward direction of the n-th initial opening processing area Cn' may be defined as "m", and the number of the initial opening processing areas processed after the n-th initial opening processing area Cn' and disposed in the downward direction of the n-th initial opening processing area Cn' may be defined as "1". In a case where m is greater than 1, the position of the center point of the n-th opening may finally move in the downward direction due to the cumulative deformation amount, and in a case where m is smaller than 1, the position of the center point of the n-th opening may finally move in the upward direction.

Among the initial opening processing areas of the second group Gb, the number of the initial opening processing areas processed after the n-th initial opening processing area Cn' and disposed in the leftward direction of the n-th initial opening processing area Cn' may be defined as "p", and the number of the initial opening processing areas processed after the n-th initial opening processing area Cn' and disposed in the rightward direction of the n-th initial opening processing area Cn' may be defined as "q". In a case where p is greater than q, the position of the center point of the n-th opening may finally move in the rightward direction due the cumulative deformation amount, and in a case where p is smaller than q, the position of the center point of the n-th opening may finally move in the leftward direction.

Accordingly, the position of the center point of each of the initial opening processing areas may be corrected to prevent the position of the finally formed openings from differing from the designed position of the openings due to the cumulative deformation amount. In the case where m is greater than 1, the position of the center point of the n-th initial opening processing area may be corrected in the upward direction, and in the case where m is smaller than 1, the position of the center point of the n-th initial opening processing area may be corrected in the downward direction. In the case where p is greater than q, the position of the center point of the n-th initial opening processing area may be corrected in the leftward direction, and in the case where p is smaller than q, the position of the center point of the n-th initial opening processing area may be corrected in the rightward direction. As described above, the initial opening processing areas whose position is corrected may correspond to the opening processing areas CA (refer to FIG. 5).

As an example, in the embodiment shown in FIG. 10, m, 1, p, and q may be 4, 5, 0, and 3, respectively. Accordingly, in case that the initial opening processing areas of the first group Ga and the second group Gb are sequentially processed according to the processing sequence, the position of the center point of the n-th opening may move in the upward direction and the leftward direction due to the cumulative deformation amount. Accordingly, the position of the center point of the n-th initial opening processing area Cn' of FIG. 10 may move in the downward direction and the rightward direction by the cumulative deformation amount to set the opening processing area, and thus, the position of the center point of the n-th opening may be corrected.

Figure 11A:
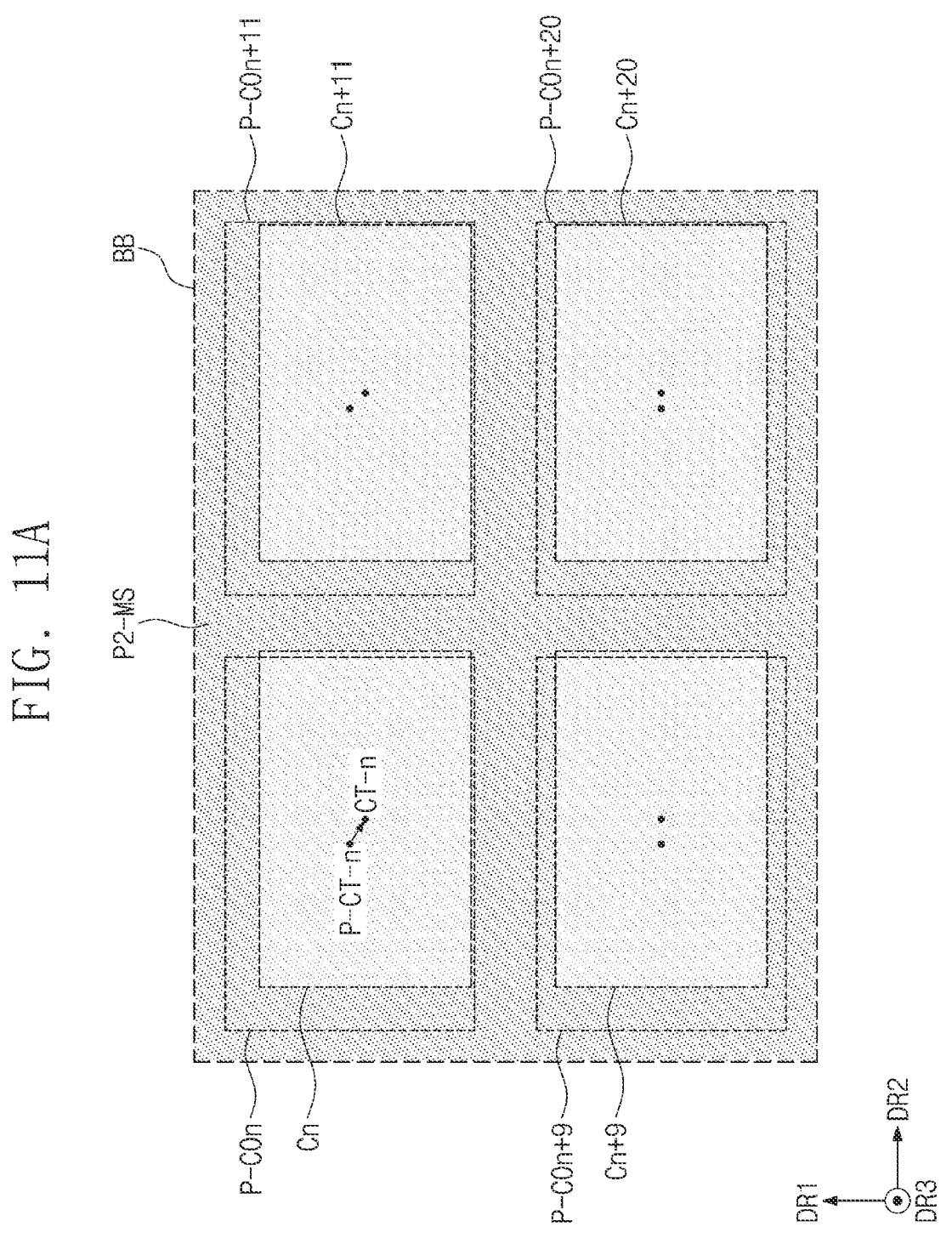

FIGS. 11A to 11E are schematic plan views of an area BB of FIG. 10 and sequentially show the deformation amount acting the n-th opening. FIG. 11A shows an n-th opening processing area Cn obtained by correcting the size and the position of the n-th initial opening processing area Cn' of FIG. 10. In the disclosure, the n-th opening processing area Cn whose size and position may be corrected may be defined as a primary opening processing area.

Referring to FIG. 11A, the n-th opening processing area Cn whose size may be corrected may have a size smaller than a size of an n-th opening P-COn (hereinafter, referred to as an imaginary n-th opening) that is to be finally formed. Descriptions of the corrected size may be the same as those described with reference to FIGS. 8, 9A, and 9B. In the disclosure, the imaginary n-th opening P-COn may substantially correspond to the above-described n-th initial opening processing area.

A position of a center point CT-n of the n-th opening processing area Cn whose position may be corrected may be different from a position of a center point P-CT-n of the imaginary n-th opening P-COn. The position of the center point CT-n of the n-th opening processing area Cn may be set by moving the position of the center point P-CT-n of the imaginary n-th opening P-COn to the downward direction and the rightward direction.

Positions of (n+9)th, (n+11)th, and (n+20)th opening processing areas Cn+9, Cn+11, and Cn+20 may be corrected using the calculating method of the cumulative deformation amount described above. Center points of the (n+9)th, (n+11)th, and (n+20)th opening processing areas Cn+9, Cn+11, and Cn+20 may be different from center points of the imaginary (n+9)th, (n+11)th, and (n+20)th openings P-COn+9, P-COn+11, and P-COn+20, respectively.

Figure 11B:
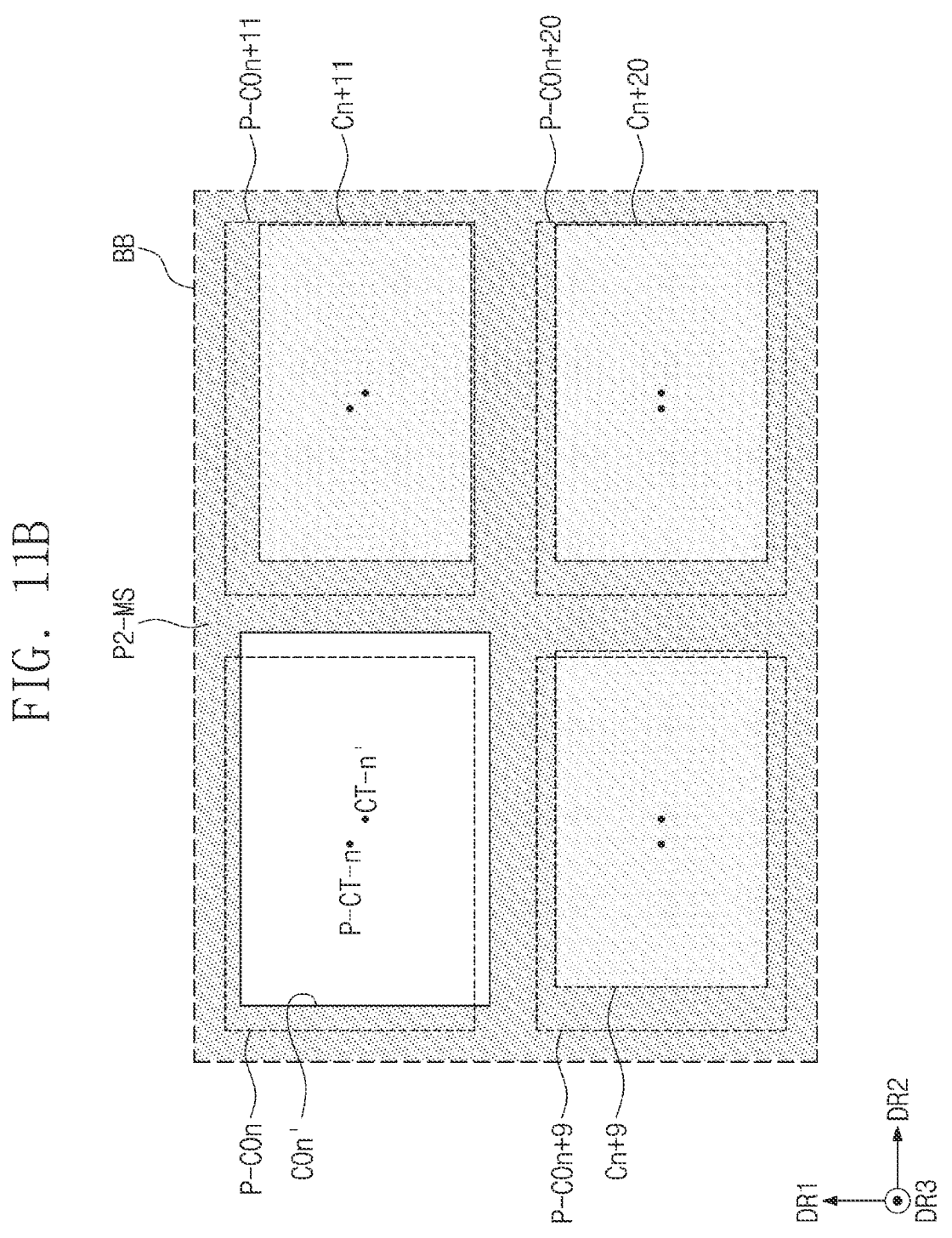

FIG. 11B shows an n-th opening COn' (hereinafter, referred to as an initial n-th opening) that may be initially formed by irradiating the laser beam to the n-th opening processing area Cn. In the disclosure, an opening initially formed to correspond to one opening processing area right after the laser beam may be irradiated to the one opening processing area may be defined as a secondary opening processing area. Accordingly, the initial n-th opening COn' initially formed to correspond to the n-th opening processing area Cn right after the laser beam may be irradiated to the n-th opening processing area Cn may be defined as a secondary n-th opening processing area.

Referring to FIG. 11B, a size of the initial n-th opening COn' may be substantially the same as a size of the imaginary n-th opening P-COn due to the deformation occurring in case that the n-th opening processing area Cn is processed. A position of a center point CT-n' of the initial n-th opening COn' may be substantially the same as the position of the center point CT-n of the n-th opening processing area Cn and may be different from the position of the center point P-CT-n of the imaginary n-th opening P-COn.

Figure 11C:
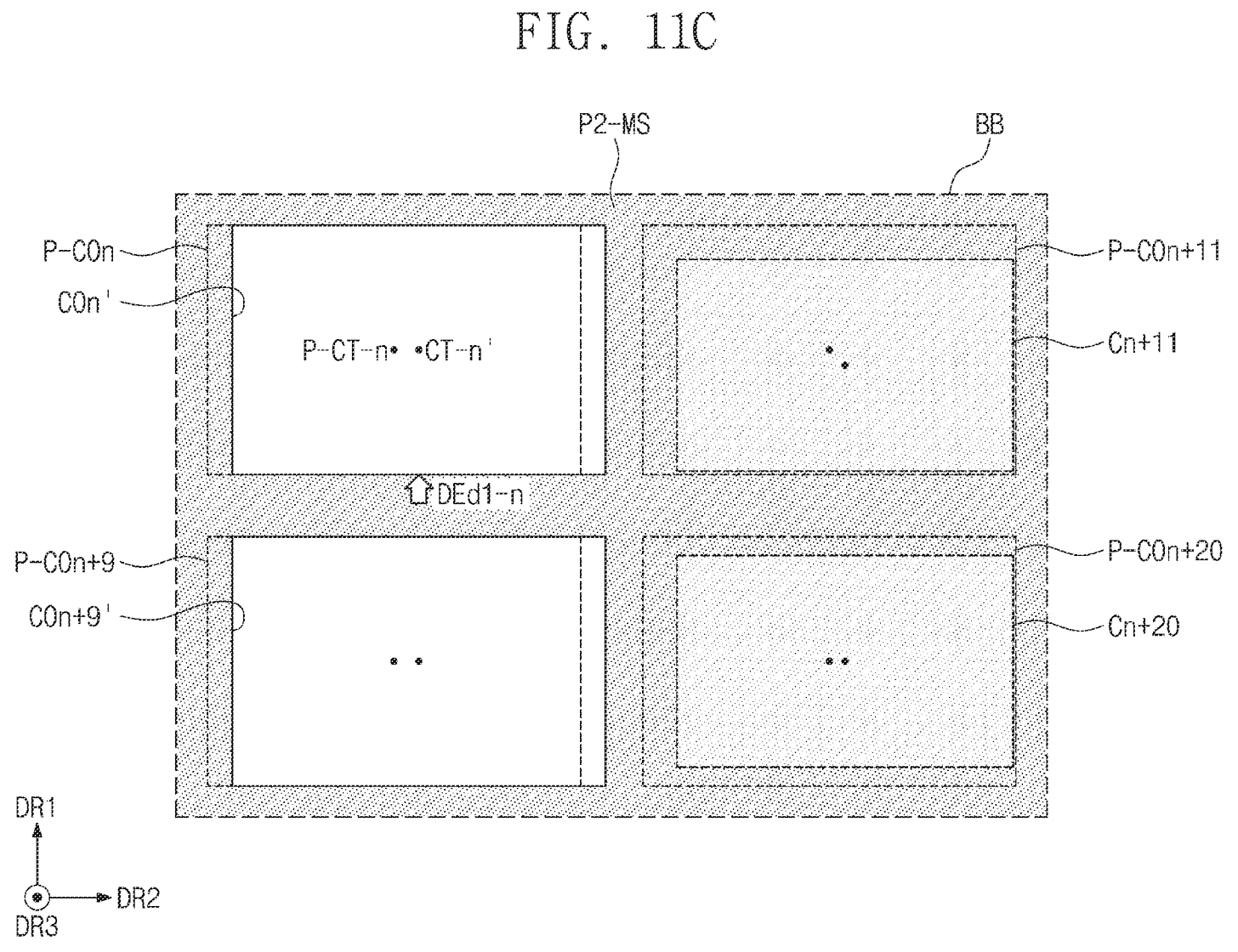

FIG. 11C shows a process of initially forming an (n+9)th opening COn+9' by irradiating the laser beam to the (n+9)th opening processing area Cn+9. The (n+9)th opening processing area Cn+9 may be an area that is processed last among the opening processing areas of the first group Ga in the embodiment shown in FIG. 10.

Referring to FIG. 11C, a cumulative deformation amount DEd1-$n$ may act on the initial n-th opening COn' in the upward direction during the process of forming the initial (n+9)th opening COn+9', and thus, the position of the initial n-th opening COn' (or the position of the secondary n-th opening processing area COn') may be changed. For example, the position of the center point CT-n' of the initial n-th opening COn' may move in the upward direction due to the cumulative deformation amount DEd1-$n$ acting in the upward direction. The position of the center point CT-n' of the initial n-th opening COn', which may be deformed by the initial (n+9)th opening COn+9', may coincide with the position of the center point P-CT-n of the imaginary n-th opening P-COn in the first direction DR1 and may be parallel with the position of the center point P-CT-n of the imaginary n-th opening P-COn in the second direction DR2. For example, the position of at least some of the secondary opening processing areas may be changed as the primary opening processing areas are sequentially processed.

Figure 11D:
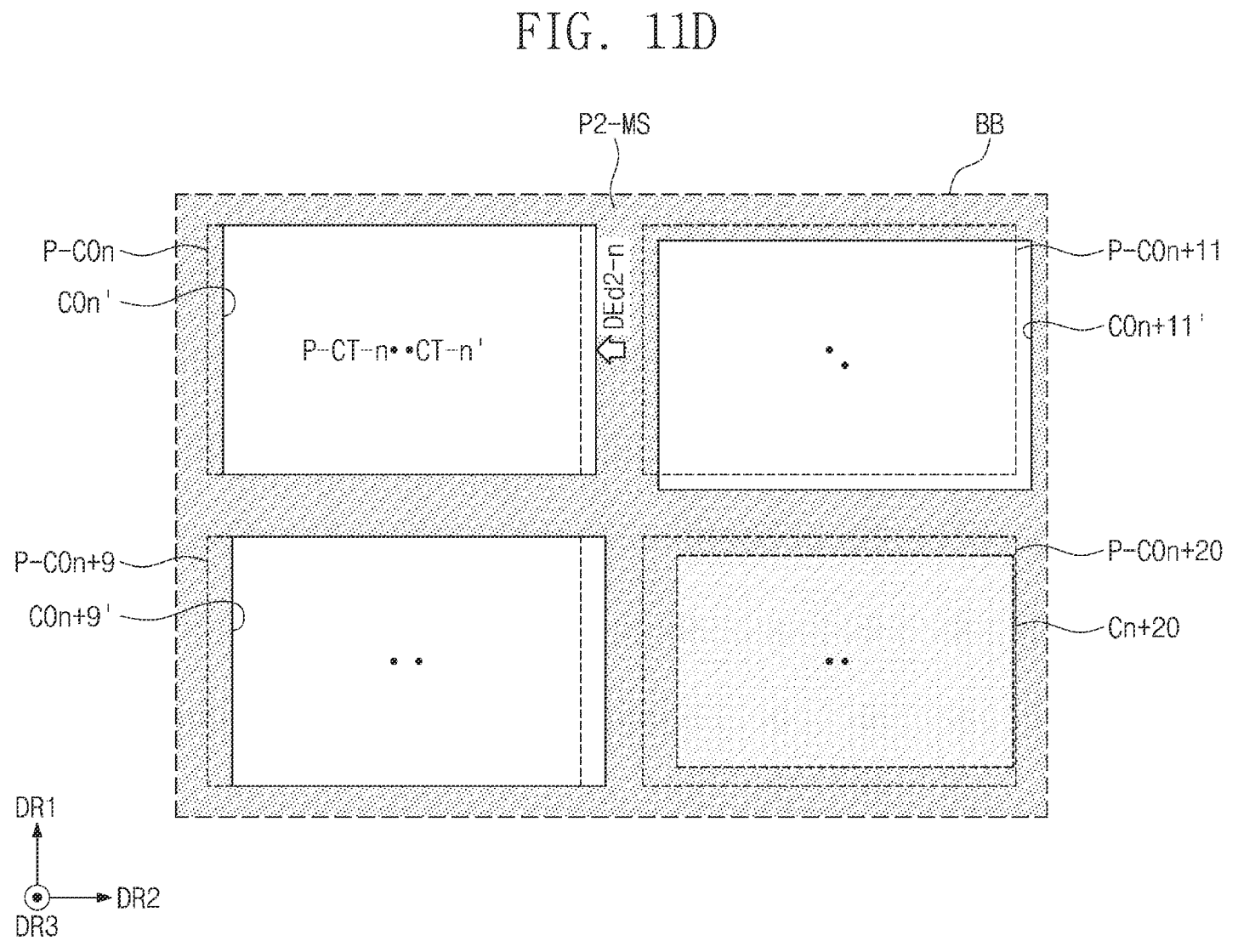

FIG. 11D shows a process of irradiating the laser beam to the (n+11)th opening processing area Cn+11 to initially form an (n+11)th opening COn+11'. Referring to FIG. 11D, a cumulative deformation amount DEd2-$n$ may act on the deformed initial n-th opening COn' in the leftward direction during the process of forming the initial (n+11)th opening COn+11', and thus, the position of the deformed initial n-th opening COn' may be deformed again. For example, the position of the center point CT-n' of the deformed initial n-th opening COn' may move in the leftward direction due to the cumulative deformation amount DEd2-$n$ acting in the leftward direction compared to the position of the center point CT-n' of the initial n-th opening COn' deformed in the process shown in FIG. 11C.

Figure 11E:
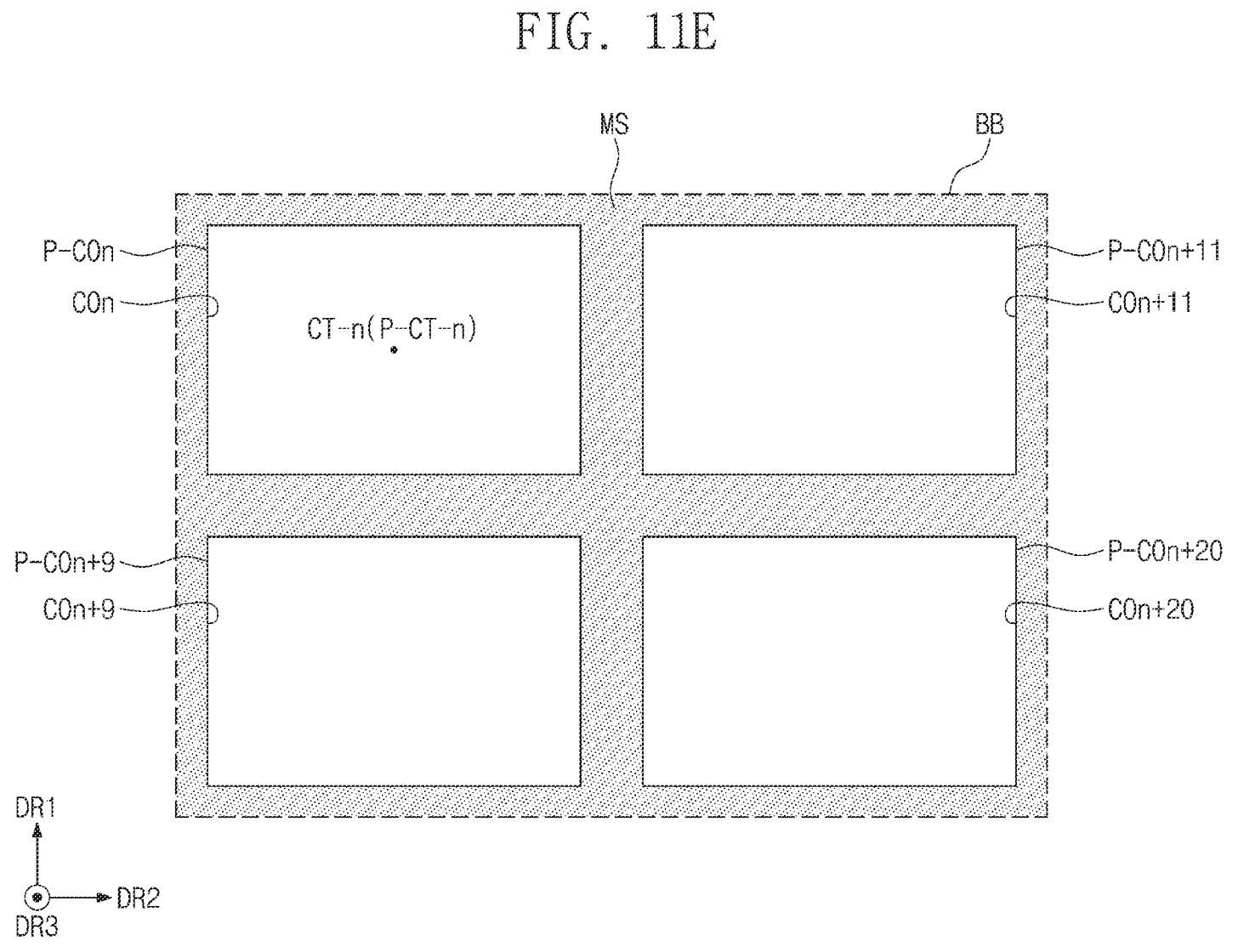

FIG. 11E shows the mask MS in which all the openings to be formed are formed. In the disclosure, the openings formed through the mask MS in case that the irradiation of the laser beam is completed may be defined as final opening areas. As all the openings may be formed through the mask MS, all the calculated cumulative deformation amount may act on the initial n-th opening COn'. Accordingly, the size and the position of the n-th opening COn that may be finally formed (hereinafter, referred to as a final n-th opening) may be substantially the same as the size and the position of the imaginary n-th opening P-COn that may be intended to be formed through the mask MS. For example, the position of the center point CT-n of the final n-th opening COn may coincide with the position of the center point P-CT-n of the imaginary n-th opening P-COn.

Similarly, the size and the position of each of final (n+9)th, (n+11)th, and (n+20)th openings COn+9, COn+11, and COn+20 may be substantially the same as the size and the position of the corresponding opening of the imaginary (n+9)th, (n+11)th, and (n+20)th openings P-COn+9, P-COn+11, and P-COn+20 that may be intended to be formed through mask MS.

For example, as the opening processing areas whose size and position may be corrected by taking into account the cumulative deformation amount may be set and the openings may be formed using the opening processing areas, the openings may be finally formed with the designed size through the designed position. For example, the accuracy of the size and the position of the openings formed through the mask may be improved. Accordingly, a reliability of the mask may be improved, and the deposition quality of the display panel manufactured using the mask may be improved.

FIGS. 12A, 13A, and 14A are schematic plan views of preliminary mask assemblies in which the opening processing areas are defined according to the mask assembly manufacturing method of the disclosure. Although not shown in figures, the first tensile force F1 (refer to FIG. 3) may act on the tension mask sheets P2-MS shown in FIGS. 12A, 13A, and 14A in a direction substantially parallel to the first direction DR1, and the second tensile force F2 (refer to FIG. 3) may act on the tension mask sheets P2-MS shown in FIGS. 12A, 13A, and 14A in a direction substantially parallel to the second direction DR2.

According to the mask assembly manufacturing method, the processing sequence of the opening processing areas CA may be set to decrease a movement amount of the stage ST (refer to FIG. 6). The processing sequence of the opening processing areas CA may be substantially the same as the processing sequence set in the determining of the processing sequence of the initial opening processing area (S31, refer to FIG. 2). For the convenience of explanation, FIGS. 12A, 13A, and 14A show the processing sequence of some opening processing areas among the opening processing areas CA.

Referring to FIGS. 12A, 13A, and 14A, the laser beam may be sequentially irradiated to the opening processing areas in the second direction DR2 from the opening processing areas of the first processing group G1 arranged on the leftmost side to the opening processing areas of the fifth processing group G5 arranged on the rightmost side. Accordingly, a degree of movement of the stage ST (refer to FIG. 6) in the second direction DR2 may be reduced in the process of aligning the position to irradiate the laser beam to the opening processing areas CA, and a loading time caused by the movement of the stage ST (refer to FIG. 6) may be reduced. Accordingly, the processing time required to manufacture the mask may be reduced.

Each of the first to fifth processing groups G1 to G5 may include first to a-th opening processing areas arranged in the first direction DR1, and FIGS. 12A, 13A, and 14A show first, second, third, fourth, fifth, sixth, seventh, eighth, ninth, tenth, and eleventh opening processing areas C1, C2, C3, C4, C5, C6, C7, C8, C9, C10, and C11 as a representative example. In an embodiment a in a-th may be a natural number equal to or greater than two. The processing sequence of the first to eleventh opening processing areas C1 to C11 may be set in various ways, and the calculated value of the cumulative deformation amount applied to each of the first to eleventh opening processing areas C1 to C11 may be changed depending on the processing sequence. FIGS. 12A, 13, and 14A show processing sequences according to embodiments. Hereinafter, the first to eleventh opening processing areas C1 to C11 of the first processing group G1 will be described.

Referring to FIG. 12A, the first to eleventh opening processing areas C1 to C11 may be sequentially processed from the first opening processing area C1 in the first direction DR1. For example, among the first to eleventh opening processing areas C1 to C11, the first opening processing area C1 may be processed first, the second opening processing area C2 may be processed second, and the eleventh opening processing area C11 may be processed eleventh.

FIG. 12B shows the cumulative deformation amounts acting on each of the first to eleventh opening processing areas C1 to C11 arranged parallel to the first direction DR1 in the embodiment shown in FIG. 12A and the correction degree of the position of the center point of each of the first to eleventh opening processing areas C1 to C11. FIG. 12C shows the cumulative deformation amounts acting on each of the first opening processing area C1 and opening processing areas C12, C23, C34, and C45 arranged in a line with the first opening processing area C1 in the second direction DR2 in the embodiment shown in FIG. 12A and the correction degree of the position of the center point of each of the first opening processing area C1 and the opening processing areas C12, C23, C34, and C45.

FIG. 12D is an enlarged schematic plan view of the first opening processing area C1 whose position may be corrected based on the cumulative deformation amount calculated in FIGS. 12B and 12C, and FIG. 12E is an enlarged schematic plan view of the eleventh opening processing area C11 whose position may be corrected based on the cumulative deformation amount calculated in FIGS. 12B and 12C.

Initial opening processing areas, e.g., a first imaginary opening P-CO1 of FIG. 12D, which is to be finally formed through the mask, may be defined to set the opening processing areas each in which the position of the center point may be corrected. The cumulative deformation amounts acting on first sides U1 to U11 and second sides D1 to D11, which receive the first tensile force F1, in the first to eleventh opening processing areas C1 to C11 may be calculated based on the processing sequence of the opening processing areas CA. Similarly, the cumulative deformation amount acting on third sides L1 to L11 and fourth sides R1 to R11, which receive the second tensile force F2, in the first to eleventh opening processing areas C1 to C11 may be calculated.

In the embodiment, each of the first sides U1 to U11 and the second sides D1 to D11 may correspond to sides extending in the second direction DR2 and receiving the first tensile force F1 among sides defining the first to eleventh opening processing areas C1 to C11, and each of the third sides R1 to R11 and the fourth sides L1 to L11 may correspond to sides extending in the first direction DR1 and receiving the second tensile force F2 among the sides defining the first to eleventh opening processing areas C1 to C11.

In FIG. 12B, K denotes the deformation amount K that may be applied to a previously formed opening by another opening to be formed parallel with the previously formed opening in the first direction DR1. The deformation amount K of FIG. 12B may correspond to the first deformation amount d1 satisfying the following Equation 1. Descriptions of the following Equation 1 are the same as the above-mentioned descriptions, and thus, details thereof will be omitted.

$$d1 = \frac{F1 \cdot P1}{A1 \cdot E} \qquad \text{[Equation 1]}$$

In FIG. 12B, '±' denotes an acting direction of the deformation amount K. In FIG. 12B, '+' denotes that the deformation amount K acts in the upward direction substantially parallel to the first direction DR1, and '−' denotes that the deformation amount K acts in the downward direction substantially parallel to the first direction DR1. The cumulative deformation amounts of FIG. 12B may be proportional to a value of the deformation amount K. Descriptions on the deformation amount K of FIG. 12B may be applied to the deformation amount K shown in FIGS. 13B and 14B.

In FIG. 12C, K' denotes the deformation amount K' that may be applied to the previously formed opening by another opening to be formed parallel with the previously formed opening in the second direction DR2, and the deformation amount K' may correspond to the second deformation amount d2. In FIG. 12C, '±' denotes an acting direction of the deformation amount K', '+' denotes that the deformation amount K' acts in the rightward direction substantially parallel to the second direction DR2, and '−' denotes that the deformation amount K' acts in the leftward direction substantially parallel to the second direction DR2.

The position of the center point of the opening processing area may be corrected to a direction opposite to the acting direction of the cumulative deformation amount that may be applied to the opening formed to correspond to the opening processing area by other openings. The correction degrees of the position of the opening processing area may correspond to an average value of the cumulative deformation amounts applied to the sides. The correction degrees of the position of the opening processing area may be changed depending on the number and the position of the opening processing areas formed after the opening processing area that may be subjected to a calculation of the cumulative deformation amount. This will be described in detail with reference to FIGS. 12D and 12E.

Referring to FIG. 12D, the first imaginary opening P-CO1 whose size and center point coincide with those of the first opening to be finally formed may be defined through the tension mask sheet P2-MS. The first opening processing area C1 may be the area whose size may be corrected by the method described with reference to FIGS. 8, 9A, and 9B. Accordingly, the size of the first opening processing area C1 may be smaller than the size of the first imaginary opening P-CO1.

In case that considering the cumulative deformation amount calculated in FIG. 12B, the opening formed to correspond to the first opening processing area C1 may receive a first cumulative deformation amount DEd1-1 by the second to eleventh opening processing areas C2 to C11 processed after the first opening processing area C1. For example, the position of the opening formed to correspond to the first opening processing area C1 may be changed in proportion to the first cumulative deformation amount DEd1-1.

In the processing of each of the second to eleventh opening processing areas C2 to C11 in the upward direction of the first opening processing area C1, the initial opening formed to correspond to the first opening processing area C1 may move in the downward direction by the cumulative deformation amount. The first cumulative deformation amount DEd1-1 acting on the initial opening formed to correspond to the first opening processing area C1 may be in proportion to ten (10) that is the number of the second to eleventh opening processing areas C2 to C11.

Accordingly, a center point CT-1 of the first opening processing area C1 may be corrected from a center point P-CT-1 of the first imaginary opening P-CO1 by a first size f1 in the first direction DR1. A position of the center point CT-1 of the first opening processing area C1 may be corrected to the upward direction that may be opposite to the acting direction of the first cumulative deformation amount DEd1-1. The first size f1 may be 10K calculated in FIG. 12B. For example, the position of the center point CT-1 of the first opening processing area C1 may move in the upward direction from the center point P-CT-1 of the first imaginary opening P-CO1 by 10K to be corrected.

In case that considering the cumulative deformation amount calculated in FIG. 12C, the opening formed to correspond to the first opening processing area C1 may receive a second cumulative deformation amount DEd2-1 by twelfth, twenty-third, thirty-fourth, and forty-fifth opening processing areas C12, C23, C34, and C45 that may be processed after the first opening processing area C1 may be processed and may be arranged parallel with the first opening processing area C1 in the second direction DR2. The position of the opening formed to correspond to the first opening processing area C1 may be changed in proportion to the second cumulative deformation amount DEd2-1.

In the processing of each of the twelfth, twenty-third, thirty-fourth, and forty-fifth opening processing areas C12, C23, C34, and C45 processed in the rightward direction of the first opening processing area C1, the initial opening formed to correspond to the first opening processing area C1 may move in the leftward direction by the cumulative deformation amount. The second cumulative deformation amount DEd2-1 acting on the initial opening formed to correspond to the first opening processing area C1 may be in proportion to four (4) that may be the number of the twelfth, twenty-third, thirty-fourth, and forty-fifth opening processing areas C12, C23, C34, and C45.

Accordingly, the center point CT-1 of the first opening processing area C1 may be corrected from the center point P-CT-1 of the first imaginary opening P-CO1 by a second size f2 in the second direction DR2. The position of the center point CT-1 of the first opening processing area C1 may be corrected to the rightward direction opposite to the acting direction of the second cumulative deformation amount DEd2-1. The second size f2 may be 4K' calculated in FIG. 12C. For example, the position of the center point CT-1 of the first opening processing area C1 may move in the rightward direction from the center point P-CT-1 of the first imaginary opening P-CO1 by 4K' to be corrected.

Referring to FIG. 12E, an eleventh imaginary opening P-CO11 may be defined through the tension mask sheet P2-MS, and the eleventh opening processing area C11 may be the area whose size is corrected using the above-described method.

The cumulative deformation amount calculated in FIG. 12C may be applied to each of the first to eleventh opening processing areas C1 to C11 of the first processing group G1 in the second direction DR2 due to the second to fifth processing groups G2 to G5 that may be processed after the first processing group G1. Accordingly, the calculated cumulative deformation amount of the eleventh opening processing area C11 may correspond to the second cumulative deformation amount DEd2-1 that may be the same as the calculated cumulative deformation amount of the first opening processing area C1, and thus, a center point CT-11 of the eleventh opening processing area C11 may be corrected to the rightward direction by the second size f2.

In the embodiment shown in FIG. 12A, since the eleventh opening processing area C11 may be processed last among the first to eleventh opening processing areas C1 to C11, the eleventh opening processing area C11 may not be deformed in case that the first to tenth opening processing areas C1 to C10 are processed. Accordingly, the cumulative deformation amount of the eleventh opening processing area C11, which acts in a direction parallel to the first direction DR1, may correspond to zero (0). For example, there may be no difference between the position of the center point CT-11 of the eleventh opening processing area C11 and the position of the center point P-CT-11 of the eleventh imaginary opening P-CO11 in the first direction DR1.

Since the first to eleventh opening processing areas C1 to C11 may be sequentially processed based on the processing sequence and may not be processed at the same time, degrees of the cumulative deformation amounts respectively applied to the first to eleventh opening processing areas C1 to C11 may be different from each other. In the embodiment where the first to eleventh opening processing areas C1 to C11 may be processed in the order of arrangement in the first direction DR1, the cumulative deformation amount of the first opening processing area C1 processed first may be the largest, and the cumulative deformation amount of the eleventh opening processing area C11 processed last may be the smallest. Accordingly, the positions of the center points of the first to eleventh opening processing areas C1 to C11 which may be corrected based on the calculated cumulative deformation amounts may have different degrees of correction.

Referring to FIG. 13A, the first to eleventh opening processing areas C1 to C11 may be sequentially processed from the opening processing areas adjacent to an outer portion of the tension mask sheet P2-MS in the first direction DR1 to the opening processing area disposed at a center of the first to eleventh opening processing areas C1 to C11. The opening processing area disposed at the center of the first to eleventh opening processing areas C1 to C11 in the first direction DR1 may be defined as a center opening processing area, and the sixth opening processing area C6 may correspond to the center opening processing area in the embodiment shown in FIG. 13A.

The opening processing areas may be processed according to the processing sequence that starts from the opening processing area disposed farthest from the center opening processing area and goes to the center opening processing area. As an example, among the first to eleventh opening processing areas C1 to C11, the first opening processing area C1 and the eleventh opening processing area C11 may be disposed farthest from the sixth opening processing area C6, and thus, the first opening processing area C1 or the eleventh opening processing area C11 may be processed first. FIG. 13A shows the embodiment in which the first opening processing area C1 may be processed first.

The eleventh opening processing area C11 may be disposed farthest from the sixth opening processing area C6 except the first opening processing area C1 among the first to eleventh opening processing areas C1 to C11. The eleventh opening processing area C11 may be processed second. After that, among the second to tenth opening processing areas C2 to C10 except the first and eleventh opening processing areas C1 and C11, the second opening processing area C2 and the tenth opening processing area C10 may be opening processing areas disposed farthest from the sixth opening processing area C6, Thus, the second opening processing area C2 or the tenth opening processing area C10 may be processed third. The sixth opening processing area C6 corresponding to the center opening processing area may be processed last among the first to eleventh opening processing areas C1 to C11.

FIG. 13A shows the embodiment having one center opening processing area. However, in a case where the opening processing areas are provided in an even number, two opening processing areas may be defined as the center opening processing areas. One center opening processing area of the two center opening processing areas may be processed last.

FIG. 13B shows the cumulative deformation amounts respectively acting on the first to eleventh opening processing areas C1 to C11 of FIG. 13A and the correction degree of the position of the center point. The cumulative deformation amounts shown in FIG. 13A may be calculated in the same manner as the method of calculating the cumulative deformation amounts described with reference to FIG. 12A. FIG. 13C may be an enlarged view of the eleventh opening processing area C11 whose position may be corrected based on the cumulative deformation amount of FIG. 13B.

Referring to FIG. 13C, the eleventh imaginary opening P-CO11 may be defined through the tension mask sheet P2-MS and may be substantially the same as the eleventh imaginary opening P-CO11 of FIG. 12E. The eleventh opening processing area C11 may be the area whose size is corrected using the same method as described above.

The cumulative deformation amount acting on the eleventh opening processing area C11 in the direction substantially parallel to the second direction DR2 of FIG. 13A may be substantially the same as the second cumulative deformation amount DEd2-1 of the eleventh opening processing area C11 of FIG. 12E. Accordingly, the center point CT-11 of the eleventh opening processing area C11 may be corrected to the rightward direction by the second size f2, and the second size f2 may be 4K'.

Different from the embodiment of FIG. 12A, the eleventh opening processing area C11 according to the embodiment of FIG. 13A may be processed second among the first to eleventh opening processing areas C1 to C11. Accordingly, the position of the initial opening formed to correspond to the eleventh opening processing area C11 may move by a third cumulative deformation amount DEd1-11 by the processing of the second to tenth opening processing areas C2 to C10, which may be processed after the eleventh opening processing area C11.

The second to tenth opening processing areas C2 to C10 may be processed in the downward direction from the initial opening corresponding to the eleventh opening processing area C11 after the initial opening corresponding to the eleventh opening processing area C11 may be formed. Accordingly, in the processing of the second to tenth opening processing areas C2 to C10, the initial opening formed to correspond to the eleventh opening processing area C11 may move in the upward direction. The third cumulative deformation amount DEd1-11 may be proportional to nine (9) that is the number of the second to tenth opening processing areas C2 to C10.

Accordingly, the center point CT-11 of the eleventh opening processing area C11 may be corrected by the first size f1 from the center point P-CT-11 of the eleventh imaginary opening P-CO11 in the first direction DR1, and the first size f1 may be 9K calculated in FIG. 13B. For example, the position of the center point CT-11 of the eleventh opening processing area C11 may move from the center point P-CT-11 of the eleventh imaginary opening P-CO11 to the downward direction opposite to the acting direction of the third cumulative deformation amount DEd1-11 by 9K to be corrected.

Even though the opening processing area may be set to finally form the opening at the same position in the mask, the correction position of the center point of the opening processing area may be changed depending on the processing sequence. As described with reference to FIGS. 12E and 13C, the correction degree of the center point of the eleventh opening processing area C11, which is set to form the opening in the position of the imaginary eleventh opening P-CO11, may be changed depending on the processing sequence of the eleventh opening processing area C11. The cumulative deformation amount of each of the opening processing areas may be changed depending on the number and relative positions of the opening processing areas formed after the corresponding opening processing area, and the position and the size, which may be corrected by the cumulative deformation amount, may be changed.

Referring to FIG. 14A, the first to eleventh opening processing areas C1 to C11 may be sequentially processed from the opening processing area at the center of the tension mask sheet P2-MS in the first direction DR1. The opening processing areas may be processed according to the processing sequence that starts from the center opening processing area and goes to the opening processing areas which may be farther away from the center opening processing area.

In the embodiment shown in FIG. 14A, the sixth opening processing area C6 corresponding to the center opening processing area among the first to eleventh opening processing areas C1 to C11 may be processed first. The fifth opening processing area C5 or the seventh opening processing area C7 placed closest to the sixth opening processing area C6 among the first to eleventh opening processing areas C1 to C11 may be processed. FIG. 14A shows the embodiment in which the fifth opening processing area C5 is processed second.

The seventh opening processing area C7 placed closest to the sixth opening processing area C6 except the fifth opening processing area C5 among the first to eleventh opening processing areas C1 to C11 may be processed. After that, the fourth opening processing area C4 or the eighth opening processing area C8 placed closest to the sixth opening processing area C6 except the fifth and seventh opening processing areas C5 and C7 among the first to eleventh opening processing areas C1 to C11 may be processed. In this way, the processing sequence may be set so that the opening processing areas arranged at an upper side of the center opening processing area and the opening processing areas arranged at a lower side of the center opening processing area may be alternately processed from the opening processing area closest to the center opening processing area after the center opening processing area is processed. Accordingly, the first opening processing area C1 or the eleventh opening processing area C11 placed farthest from the sixth opening processing area C6 among the first to eleventh opening processing areas C1 to C11 may be processed last. FIG. 14A shows the embodiment in which the eleventh opening processing area C11 is processed eleventh.

FIG. 14B shows the cumulative deformation amounts respectively acting on the first to eleventh opening processing areas C1 to C11 in the embodiment shown in FIG. 14A and the correction degree of the center point. The cumulative deformation amounts shown in FIG. 14B may be calculated substantially in the same manner as the method of calculating the cumulative deformation amount described with reference to FIG. 12B.

Referring to FIG. 14B, levels of the cumulative deformation amounts respectively applied to the first to eleventh opening processing areas C1 to C11 based on the processing sequence of FIG. 14A may be smaller than those of the embodiment shown in FIG. 12A or FIG. 13A. As the level of the cumulative deformation amount applied to the first to eleventh opening processing areas C1 to C11 decreases, the correction degree of the position of the center point of the first to eleventh opening processing areas C1 to C11 may decrease.

FIGS. 15A and 15B are schematic plan views of processes of a manufacturing method of a mask assembly according to an embodiment of the disclosure.

Referring to FIG. 15A, the mask assembly manufacturing method may further include forming temporary openings PO through a preliminary mask sheet P1-MSa before the tensioning of the preliminary mask sheet P1-MSa (S10, refer to FIG. 2). Each of the temporary openings PO may be formed through the preliminary mask sheet P1-MSa through an etching process.

The temporary openings PO may be formed to correspond to the openings CO (refer to FIG. 7) to be finally formed through the mask MS (refer to FIG. 7) before the tensioning of the preliminary mask sheet P1-MSa. As the temporary openings PO may be formed before the tensioning of the preliminary mask sheet P1-MSa, the deformation of the mask during the tensioning of the preliminary mask sheet P1-MSa and the forming of the openings CO (refer to FIG. 7) by the tensile force may be reduced.

An arrangement, a shape, and the number of the temporary openings PO may correspond to the arrangement, the shape, and the number of the openings CO (refer to FIG. 7) to be finally formed through the mask MS (refer to FIG. 7). The temporary openings PO may be arranged in the first direction DR1 and the second direction DR2. As an example, the temporary openings PO may be grouped into temporary opening groups PG1, PG2, PG3, PG4, and PG5, and each of the temporary opening groups PG1 to PG5 may include first, second, third, fourth, fifth, sixth, seventh, eighth, ninth, tenth, and eleventh temporary openings P1, P2, P3, P4, P5, P6, P7, P8, P9, P10, and P11. The first to eleventh temporary openings P1 to P11 may be formed through the preliminary mask sheet P1-MSa to correspond to the number and the arrangement of the first to eleventh openings CO1 to CO11 (refer to FIG. 7) to be finally formed through the mask MS (refer to FIG. 7).

The temporary openings PO may have the shape corresponding to the shape of the openings CO (refer to FIG. 7) to be finally formed. As an example, each of the temporary openings PO may have a quadrangular shape when viewed in the plane. The temporary openings PO may be formed to have a small size that does not affect the shape or the position of the openings CO (refer to FIG. 7) to be formed.

After the temporary openings PO are formed through the preliminary mask sheet P1-MSa, the tensile forces F1 and F2 may be applied to the preliminary mask sheet P1-MSa in the direction substantially parallel to the first direction DR1 and the direction substantially parallel to the second direction DR2, respectively. FIG. 15B is a schematic plan view of a tension mask sheet P2-MSa obtained by tensioning the preliminary mask sheet P1-MSa through which the temporary openings PO may be formed.

Referring to FIG. 15B, the tension mask sheet P2-MSa may have a size greater than a size of the preliminary mask sheet P1-MSa due to the tensile forces F1 and F2 when viewed in the plane. Due to the tensile forces F1 and F2, the temporary openings PO formed through the preliminary mask sheet P1-MSa may be expanded in size.

After the tensioning of the preliminary mask sheet P1-MSa (S10, refer to FIG. 2), the opening processing areas CA may be defined in the tension mask sheet P2-MSa in the same manner as described above. The opening processing areas CA may be defined to respectively correspond to the temporary openings PO.

The expanded temporary openings PO may have the small size that does not affect the openings CO (refer to FIG. 7) to be finally formed, and the opening processing areas CA may be defined to surround the temporary openings PO, respectively. At least some opening processing areas of the opening processing areas CA may have the center point that coincides with a center point of a corresponding temporary opening PO, and the other opening processing areas may have the center point that does not coincide with the center point of a corresponding temporary opening PO. However, the disclosure should not be limited thereto or thereby.

Figure 16A:
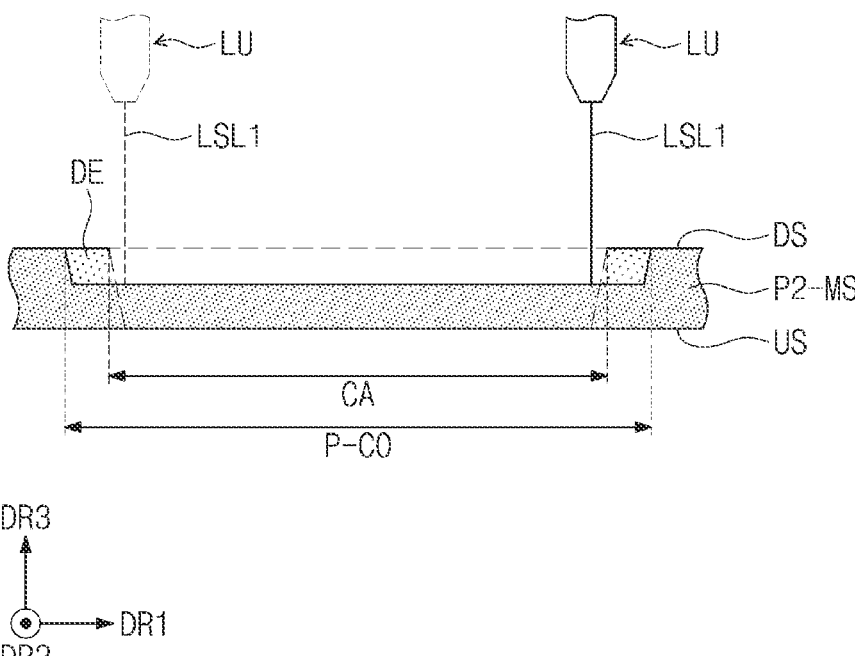
Figure 16B:
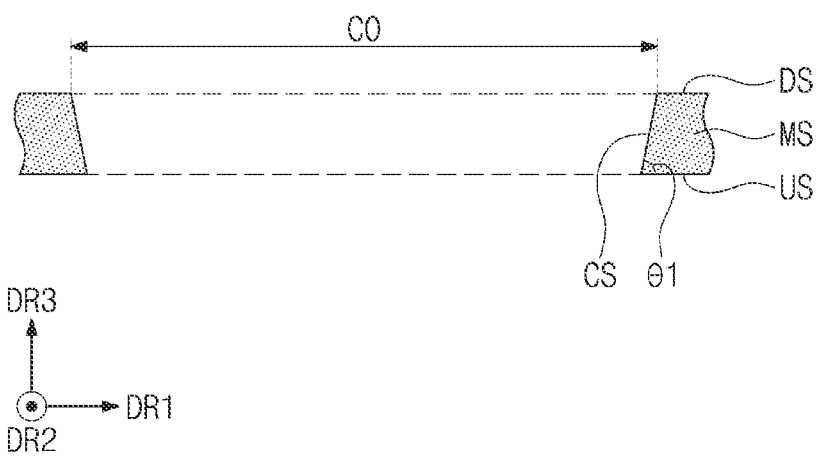
Figures 16C, 16D:
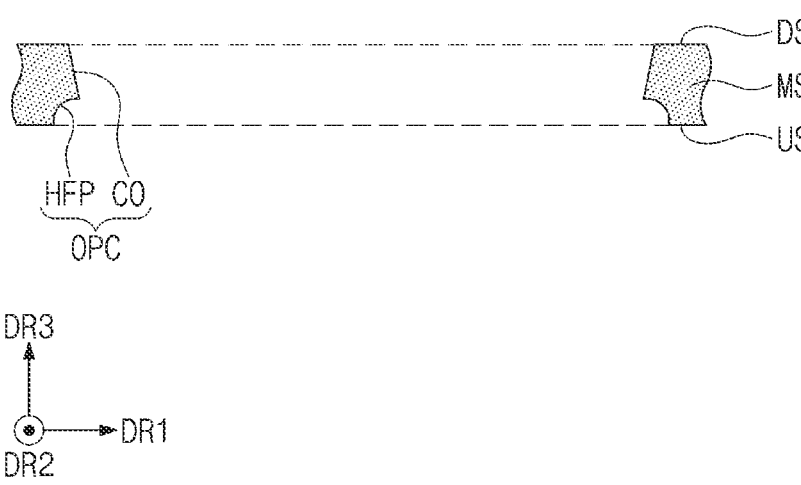

FIGS. 16A to 16D are schematic cross-sectional views of processes of the manufacturing method of the mask assembly according to an embodiment of the disclosure. FIGS. 16A and 16B are schematic cross-sectional views showing the processes of forming one opening CO. FIGS. 16C and 16D are schematic cross-sectional views showing processes of forming a recess portion HFP around the opening CO after the one opening CO is formed.

Referring to FIG. 16A, in the forming of the opening CO (refer to FIG. 16B) (S30, refer to FIG. 2), the light supply unit LU may be provided above the second surface DS of the tension mask sheet P2-MS, and a first laser beam LSL1 may be irradiated. The first laser beam LSL1 may be irradiated to the opening processing area CA defined in the second surface DS. The first laser beam LSL1 may be irradiated to an entire area defined as the opening processing area CA while moving in the first direction DR1 and the second direction DR2.

The opening processing area CA whose size may be corrected based on the tensile force acting on the tension mask sheet P2-MS may have a size smaller than that of the imaginary opening P-CO corresponding to the opening to be finally formed.

In the process of irradiating the first laser beam LSL1 to the opening processing area CA, an inside portion of the opening processing area CA, which is being processed, may be deformed to expand by the tensile force acting on the tension mask sheet P2-MS as described above. For the convenience of explanation, FIG. 16A shows the deformation size DE corresponding to a deformation degree. As the opening CO (refer to FIG. 16B) may be formed using the opening processing area CA whose size of the deformation size DE may be corrected, the opening CO (refer to FIG. 16B), which is finally formed, may be formed to have the designed size.

Referring to FIGS. 16A and 16B, the opening CO may have a width that decreases from the second surface DS to the first surface US. An opening side surface CS that defines the opening CO may be inclined with respect to the first surface US. As an example, an inclination angle θ1 of the opening side surface CS with respect to the first surface US may be equal to or greater than about 30 degrees and equal to or smaller than about 70 degrees, and in detail, the inclination angle θ1 may be within a range from about 30 degrees to about 50 degrees. As the opening CO may be formed to allow the inclination angle θ1 of the opening side surface CS with respect to the first surface US to be equal to or greater than about 30 degrees and equal to or smaller than about 70 degrees, a ratio of a size of a deposition area to the size of the mask MS may increase and a shadow area in the deposition area may be minimized.

As the opening CO of the mask MS may be formed using the laser beam, a processing trace caused by the laser beam may appear on the opening side surface CS defining the opening CO. As an example, the processing trace by the laser beam may appear in the form of wavy patterns on the opening side surface CS. However, the processing trace by the laser beam should not be limited thereto or thereby, and the trace of the laser beam may be observed when compared with a case of processing the opening through a wet-etching process. An oxide layer may be formed on the opening side surface CS of the mask MS. For example, the oxide layer of a metal material for the mask MS may be formed on the opening side surface CS.

Referring to FIG. 16C, the mask assembly manufacturing method may further include forming a recess portion HFP (refer to FIG. 16D) in the mask MS. A preliminary recess area P-HFP may be defined in the first surface US to form the recess portion HFP (refer to FIG. 16D) in the mask MS.

The preliminary recess area P-HFP may be defined adjacent to a boundary of the opening CO on the first surface US. The preliminary recess area P-HFP may surround the opening CO on the first surface US. The preliminary recess area P-HFP may be defined integrally with the opening CO to form an opening space.

The light supply unit LU may be provided above the first surface US of the mask MS through which the opening CO may be formed to form the recess portion HFP (refer to FIG. 16D). The light supply unit LU may irradiate a second laser beam LSL2 to the preliminary recess area P-HFP. The second laser beam LSL2 may be irradiated to an entire inside of an area defined as the preliminary recess area P-HFP.

The preliminary recess area P-HFP may be half-etched by the second laser beam LSL2. Accordingly, the recess portion HFP (refer to FIG. 16D) formed in the mask MS may not penetrate the first surface US and the second surface DS of the mask MS in the third direction DR3 and may be formed such that a portion of the first surface US is recessed toward the second surface DS. A portion defined as the preliminary recess area P-HFP may have a thickness smaller than the thickness of the mask MS.

According to an embodiment, the first laser beam LSL1 and the second laser beam LSL2 may be the same kind of laser beam. As an example, the first laser beam LSL1 and the second laser beam LSL2 may be pulse lasers with the same pulse width, however, the disclosure should not be limited thereto or thereby. The first laser beam LSL1 may have an intensity different from an intensity of the second laser beam LSL2. As an example, the intensity of the first laser beam LSL1 irradiated to form the opening CO through the mask may be greater than the intensity of the second laser beam LSL2 irradiated to form the recess portion HFP obtained by recessing a portion of the mask. However, the intensity of the first laser beam LSL1 and the second laser beam LSL2 should not be limited thereto or thereby and may be changed depending on formation conditions of the opening CO and the recess portion HFP.

FIG. 16D is a schematic cross-sectional view of the mask MS in which the recess portion HFP may be formed adjacent to the opening CO as a representative example after the process shown in FIG. 16C.

Referring to FIG. 16D, the recess portion HFP may be formed to correspond to the position at which the opening CO is formed. The opening CO may be formed through the first surface US and the second surface DS of the mask MS, and the recess portion HFP may be formed by recessing the portion of the first surface US toward the second surface DS around the opening CO. Accordingly, the thickness of the opening CO may be substantially the same as the thickness of the mask MS, and the thickness of the recess portion HFP may be smaller than the thickness of the mask MS.

The opening CO and the recess portion HFP may be integrally provided with each other to form the opening space. The opening space defined by the opening CO and the recess portion HFP connected to the opening CO may be defined as a cell opening OPC.

Due to the recess portion HFP, a width of the cell opening OPC on the first surface US of the mask MS may be greater than a width of the cell opening OPC on the second surface DS, however, it should not be limited thereto or thereby. According to an embodiment, the width of the cell opening OPC on the first surface US defined by the recess portion HFP may be substantially the same as the width of the cell opening OPC on the second surface DS defined by the opening CO.

The forming of the opening CO and the recess portion HFP should not be limited to the processes shown in FIGS. 16A to 16C. As an example, according to an embodiment, the recess portion HFP may be formed before the forming of the opening CO (S30, refer to FIG. 2). This will be described in detail with reference to FIGS. 17A to 17C and FIG. 18A to 18C.

FIGS. 17A to 17C are schematic cross-sectional views of processes of a manufacturing method of a mask assembly according to an embodiment of the disclosure. FIGS. 17A to 17C sequentially show the processes of forming the one cell opening OPC (refer to FIG. 16D) through the mask MS.

Referring to FIG. 17A, before the forming of the opening (S30, refer to FIG. 2), a temporary opening PO may be formed through a preliminary mask sheet P1-MSa. The preliminary mask sheet P1-MSa may correspond to the mask sheet that is not tensioned. Details of the temporary opening PO described above with reference to FIG. 15A may also be applied to the temporary opening PO.

Referring to FIG. 17A, a width of the temporary opening PO may decrease as it goes from the second surface DS to the first surface US. However, the shape in cross-section of the temporary opening PO should not be limited thereto or thereby, and according to an embodiment, the shape in cross-section of the temporary opening PO may be changed in various ways depending on the formation conditions of the temporary opening PO.

FIG. 17A shows a preliminary opening processing area P-CA corresponding to the opening processing area CA of FIG. 16A. The preliminary opening processing area P-CA may be an opening processing area defined in the preliminary mask sheet P1-MSa that is not tensioned. In case that the preliminary mask sheet P1-MSa is tensioned, the tensioned preliminary opening processing area P-CA may correspond to the opening processing area CA.

Referring to FIG. 17A, a size of the temporary opening PO may be smaller than a size of the preliminary opening processing area P-CA. For example, the size of the temporary opening PO may be small such that the size of the opening CO (refer to FIG. 16D), which may be formed to correspond to the preliminary opening processing area P-CA, may not be affected by the temporary opening PO.

The temporary opening PO may be formed by an etching process using a laser beam, however, it should not be limited thereto or thereby. According to an embodiment, the temporary opening PO may be formed by wet-etching the preliminary mask sheet P1-MSa.

A preliminary recess area P-HFP may be defined in the first surface US of the preliminary mask sheet P1-MSa through which the temporary opening PO may be formed. For example, a recess portion HFP (refer to FIG. 17B) may be formed in the preliminary mask sheet P1-MSa through which the temporary opening PO is formed before the mask sheet may be tensioned.

The preliminary recess area P-HFP may be defined around the temporary opening PO. Accordingly, the preliminary recess area P-HFP may surround the temporary opening PO on the first surface US of the preliminary mask sheet P1-MSa. The preliminary recess area P-HFP may be defined to have a size greater than that of the preliminary opening processing area P-CA on the first surface US of the preliminary mask sheet P1-MSa when viewed in the plane, however, it should not be limited thereto or thereby. According to an embodiment, the preliminary recess area P-HFP may be defined to have substantially the same size as the preliminary opening processing area P-CA.

A light supply unit LU may be provided above the first surface US of the preliminary mask sheet P1-MSa to form the recess portion HFP (refer to FIG. 17B). The light supply unit LU may irradiate a laser beam LSL0 to the preliminary recess area P-HFP. Details of the second laser beam LSL2 described above may also be applied to the laser beam LSL0.

FIG. 17A shows the process of forming the recess portion HFP using the laser beam as a representative example, however, it should not be limited thereto or thereby. According to an embodiment, the recess portion HFP may be formed through a wet-etching process. FIG. 17A shows the processes of sequentially forming the temporary opening PO and the recess portion HFP in the preliminary mask sheet P1-MSa, however, according to an embodiment, the temporary opening PO and the recess portion HFP may be substantially simultaneously formed using the laser beam or the wet-etching.

FIG. 17B shows a schematic cross-section of the preliminary mask sheet P1-MSa in which the temporary opening PO and the recess portion HFP may be formed. The preliminary mask sheet P1-MSa of FIG. 17B may correspond to the preliminary mask sheet P1-MSa that may be turned over after the laser beam LSL0 is irradiated to the preliminary recess area P-HFP of FIG. 17A.

Referring to FIG. 17B, the recess portion HFP may be formed at a position corresponding to a position at which the temporary opening PO may be formed. The temporary opening PO may be formed through the first surface US and the second surface DS of the preliminary mask sheet P1-MSa, and the recess portion HFP may be formed by recessing a portion of the first surface US of the preliminary mask sheet P1-MSa toward the second surface DS. The temporary opening PO and the recess portion HFP may be provided integrally with each other to form an opening space.

After the temporary opening PO and the recess portion HFP may be formed, the preliminary mask sheet P1-MSa may be tensioned by a tensile force F1 to be coupled with the mask frame FR (refer to FIG. 15B). Due to the tension of the mask sheet, a size of each of the temporary opening PO and the recess portion HFP may increase when viewed in the plane.

FIG. 17C shows a process of forming an opening through the tension mask sheet P2-MSa. Referring to FIG. 17C, the light supply unit LU may be provided above the second surface DS and may irradiate a first laser beam LSL1 to form the opening through the tension mask sheet P2-MSa. The process of forming the opening through the tension mask sheet P2-MSa may be substantially the same as the process of forming the opening shown in FIG. 16A except that the opening may be formed through the tension mask sheet P2-MSa in which the temporary opening PO and the recess portion HFP may be previously formed. Details of the process of forming the opening described above may also be applied to the process of forming the opening through the tension mask sheet P2-MSa. In case that the process shown in FIG. 17C is completed, the opening CO and the recess portion HFP may be formed in the mask MS as shown in FIG. 16D.

FIGS. 18A to 18C are schematic cross-sectional views of processes of a manufacturing method of a mask assembly according to an embodiment of the disclosure. FIGS. 18A to 18C sequentially show processes of forming one cell opening OPC (refer to FIG. 16D) through a mask MS.

Referring to FIG. 18A, a preliminary recess area P-HFP may be defined in a preliminary mask sheet P1-MSa through which a temporary opening PO (refer to FIG. 17A) is not formed. For example, the process of forming the temporary opening PO (refer to FIG. 17A) may be omitted, and a recess portion HFP (refer to FIG. 18B) may be formed in the preliminary mask sheet P1-MSa. The preliminary recess area P-HFP may be defined to correspond to the preliminary opening processing area P-CA at which the opening may be formed.

FIG. 18A shows the process of forming the recess portion HFP (refer to FIG. 18B) using a laser beam as a representative example, however, it should not be limited thereto or thereby. According to an embodiment, the recess portion HFP (refer to FIG. 18B) may be formed by a wet-etching process.

Referring to FIG. 18B, the preliminary mask sheet P1-MSa in which the recess portion HFP is formed may be tensioned by a tensile force F1 to be coupled (or connected) with the mask frame FR (refer to FIG. 15B). Due to the tension of the mask sheet, a size of the recess portion HFP may increase when viewed in the plane.

FIG. 18C shows the process of forming the opening through the tension mask sheet P2-MSa. Referring to FIG. 18C, a light supply unit LU may be provided above the second surface DS and may irradiate the first laser beam LSL1 to form the opening through the tension mask sheet P2-MSa in which the recess portion HFP is formed. The process of forming the opening through the tension mask sheet P2-MSa may be different from the process of forming the opening shown in FIG. 16A at least in that the opening may be formed through the tension mask sheet P2-MSa in which the recess portion HFP is previously formed. In case that the process shown in FIG. 18C is completed, the opening CO and the recess portion HFP may be formed in the mask MS as shown in FIG. 16D.

FIG. 19A is a schematic cross-sectional view of a deposition process using a mask assembly manufactured by a mask assembly manufacturing method according to an embodiment of the disclosure. FIG. 19B is an enlarged schematic cross-sectional view of an area CC of FIG. 19A. FIG. 19A schematically shows the deposition process using the mask assembly MK including the mask MS in which the opening CO and the recess portion HFP may be formed.

Referring to FIGS. 19A and 19B, the mask MS through which the cell opening OPC is formed may be coupled with the mask frame FR such that the second surface DS may face the upper side FR-U of the mask frame FR. The mask MS may include a coupling portion WP in a portion thereof coupled with the mask frame FR. The coupling portion WP may be formed in a portion where the mask MS contacts the mask frame FR in the coupling process using the welding portion AD shown in FIG. 4 (S20, refer to FIG. 2). The coupling portion WP may include a metal oxide material but is not limited thereto.

The mask MS may include the openings CO and the recess portions HFP. The recess portions HFP may be formed to respectively correspond to and connected to the openings CO, and the recess portions HFP and the openings CO may be provided as the cell openings OPC. Details of the openings CO and the recess portions HFP described above may be applied to the openings CO and the recess portions HFP.

The mask assembly MK may be disposed on a target substrate P-SUB, and a deposition material DM may be deposited to form the functional layer. For example, the target substrate P-SUB may be disposed on the mask MS of the mask assembly MK. The deposition surface of the target substrate P-SUB may be provided to face the first surface US of the mask MS. The target substrate P-SUB may be disposed such that areas to be deposited may overlap the cell openings OPC of the mask MS.

A deposition source may be disposed under the mask assembly MK. The deposition material DM evaporated by the deposition source may travel to the second surface DS of the mask MS and may be deposited on the deposition surface of the target substrate P-SUB through the frame opening OP of the mask frame FR and the cell opening OPC of the mask MS.

The deposition material DM may be deposited on the target substrate P-SUB, and thus, a deposition pattern DPA may be formed. A shape and a deposition position of the deposition pattern DPA may correspond to those of the cell openings OPC.

The mask assembly MK may be used to deposit the functional layer included in the display panel DP (refer to FIG. 1B). The deposition pattern DPA may correspond to the functional layer included in the display panel DP (refer to FIG. 1B) and provided as the common layer as described above. As an example, the deposition pattern DPA may correspond to at least one of the hole transport region HTR, the electron transport region ETR, the second electrode CE, the insulating layer of the encapsulation layer TFE, and the insulating layer of the circuit layer DP-CL shown in FIG. 1B.

According to an embodiment, one target substrate P-SUB may be a substrate having a large area compared to one display panel DP (refer to FIG. 1A), and multiple display panels DP (refer to FIG. 1A) may be manufactured from the one target substrate P-SUB. Multiple deposition patterns DPA may be formed on the one target substrate P-SUB using the mask assembly MK, and the deposition patterns DPA may correspond to the common layers of the display panels DP, respectively, however, the disclosure should not be limited thereto or thereby. According to an embodiment, one display panel DP may be manufactured from one target substrate P-SUB according to the size of the display panel DP (refer to FIG. 1A) to be manufactured.

The mask MS provided with the cell openings OPC defined therethrough and manufactured by the manufacturing method according to the embodiment of the disclosure may protect the surface of the target substrate P-SUB and may improve the deposition quality. The shadow area may be formed in a boundary between a deposition area and a non-deposition area of the target substrate P-SUB according to the shape of the cell opening OPC. As the cell openings OPC include the openings CO defining the deposition area and the recess portions HFP extending from the openings CO and opened, the shadow area may be reduced in the deposition area. An area ratio of the deposition area within the mask MS may increase. Accordingly, a defect or a dead space may be reduced in the display panel manufactured using the mask assembly MK.

The openings CO of the mask MS manufactured by the manufacturing method according to the embodiment of the disclosure may be formed by defining the opening processing areas CA, and the opening processing areas CA may be areas whose size and position may be corrected in consideration of the cumulative deformation amount acting on the openings CO according to the processing sequence. Accordingly, the accuracy of the size and the position of the openings CO finally formed through the mask MS may be improved, and the reliability of the mask MS may be improved. As the accuracy of the size and the position of the openings CO is improved, the deposition pattern DPA may be formed precisely in the area requiring the deposition on the target substrate P-SUB, and the deposition quality may be improved.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of manufacturing a mask assembly, comprising:

tensioning a mask sheet;

connecting the tensioned mask sheet with a mask frame; and defining opening processing areas in the tensioned mask sheet to form openings respectively corresponding to the opening processing areas, the defining of the opening processing areas comprising:

defining initial opening processing areas in the tensioned mask sheet in a first direction and in a second direction intersecting the first direction to determine a processing sequence of the initial opening processing areas;

calculating cumulative deformation amounts accumulated in each of the initial opening processing areas based on the processing sequence; and correcting a size and a position of each of the initial opening processing areas based on the cumulative deformation amounts, wherein each of the opening processing areas has a size smaller than a size of a corresponding opening among the openings formed from the opening processing areas.

2. The method of claim 1, wherein the opening processing areas comprise first to a-th processing groups each comprising opening processing areas arranged in a line in the first direction, a is a natural number equal to or greater than two (2), the first to a-th processing groups are arranged in the second direction, and the processing sequence is sequentially set from the first processing group to the a-th processing group.

3. The method of claim 1, further comprising:

forming temporary openings through the mask sheet before the tensioning of the mask sheet, wherein the opening processing areas respectively correspond to the temporary openings, and each of the opening processing areas surrounds a corresponding temporary opening among the temporary openings in a plan view.

4. The method of claim 1, wherein a first tensile force acts on the tensioned mask sheet in a direction substantially parallel to the first direction, an opening processing area which is defined to form the opening having a first width in the first direction, has a second width in the first direction, and a difference between the first width and the second width is proportional to the first tensile force.

5. The method of claim 4, wherein the second width is smaller than the first width by 2K, K satisfies K=FP/AE, F denotes the first tensile force, P denotes a width in the first direction between a center of the opening processing area and an edge of the opening processing area, A denotes a size in cross-section of an area to which the first tensile force is applied in the opening processing area, and E denotes an elastic modulus of the mask sheet.

6. The method of claim 4, wherein a second tensile force acts on the tensioned mask sheet in a direction substantially parallel to the second direction, the opening processing area which is defined to form the opening having a third width in the second direction, has a fourth width in the second direction, and a difference between the third width and the fourth width is proportional to the second tensile force.

7. The method of claim 1, wherein an n-th opening processing area that is processed at an n-th order among the opening processing areas has a center set at a second position to form an n-th opening having a center at a first position, the opening processing areas arranged with the n-th opening processing area in a line in the first direction are defined as a first group, and in case that a number of the opening processing areas which are processed after the n-th opening processing area and are arranged in an upward direction parallel to the first direction from the n-th opening processing area among the opening processing areas of the first group, is defined as m and a number of the opening processing areas which are processed after the n-th opening processing area and are arranged in a downward direction parallel to the first direction from the n-th opening processing area among the opening processing areas of the first group, is defined as 1, a difference in position between the first position and the second position in the first direction is proportional to a difference between m and 1, and each of m and 1 is zero (0) or a natural number.

8. The method of claim 7, wherein, in case that m is smaller than 1, the second position is disposed below the first position in a plan view, and in case that m is greater than 1, the second position is disposed above the first position in a plan view.

9. The method of claim 7, wherein the opening processing areas arranged with the n-th opening processing area in a line in the second direction are defined as a second group, and in case that a number of the opening processing areas which are processed after the n-th opening processing area and are arranged in a leftward direction parallel to the second direction from the n-th opening processing area among the opening processing areas of the second group, is defined as p and a number of the opening processing areas which are processed after the n-th opening processing area and are arranged in a rightward direction parallel to the second direction from the n-th opening processing area among the opening processing areas of the second group, is defined as q, a difference in position between the first position and the second position in the second direction is proportional to a difference between p and q, and each of p and q is zero (0) or a natural number.

10. The method of claim 9, wherein, in case that p is smaller than q, the second position is disposed to a right side of the first position in a plan view, and in case that p is greater than q, the second position is disposed to a left side of the first position in a plan view.

11. A method of manufacturing a mask assembly, comprising:

tensioning a mask sheet;

connecting the tensioned mask sheet with a mask frame; and defining opening processing areas in the tensioned mask sheet to form openings respectively corresponding to the opening processing areas, the defining of the opening processing areas comprising:

defining initial opening processing areas in the tensioned mask sheet in a first direction and in a second direction intersecting the first direction to determine a processing sequence of the initial opening processing areas;

calculating cumulative deformation amounts accumulated in each of the initial opening processing areas based on the processing sequence; and correcting a size and a position of each of the initial opening processing areas based on the cumulative deformation amounts, wherein an n-th opening processing area that is processed at an n-th order among the opening processing areas has a center set at a second position to form an n-th opening having a center at a first position, the opening processing areas arranged with the n-th opening processing area in a line in the first direction are defined as a first group, in case that a number of the opening processing areas which are processed after the n-th opening processing area and are arranged in an upward direction parallel to the first direction from the n-th opening processing area among the opening processing areas of the first group, is defined as m and a number of the opening processing areas which are processed after the n-th opening processing area and are arranged in a downward direction parallel to the first direction from the n-th opening processing area among the opening processing areas of the first group, is defined as l, a difference in position between the first position and the second position in the first direction is proportional to a difference between m and l, and each of m and l is zero (0) or a natural number, in case that m is smaller than l, the second position is disposed below the first position in a plan view, in case that m is greater than l, the second position is disposed above the first position in a plan view, a first tensile force acts on the tensioned mask sheet in the first direction, the difference in position between the first position and the second position in the first direction is X, X satisfies $X=|m-l|(FP/AE)$, F denotes the first tensile force, P denotes a width in the first direction between a center of the opening processing area and an edge of the opening processing area, A denotes a size in cross-section of an area to which the first tensile force is applied in the opening processing area, and E denotes an elastic modulus of the mask sheet.

12. The method of claim 11, wherein each of the opening processing areas has a size smaller than a size of a corresponding opening among the openings formed from the opening processing areas.

13. A method of manufacturing a mask assembly, comprising:

tensioning a mask sheet;

connecting the tensioned mask sheet with a mask frame;

defining primary opening processing areas arranged in an arrangement on the tensioned mask sheet and each having a center point whose position is corrected; and forming final opening areas respectively corresponding to the primary opening processing areas, the forming of the final opening areas comprising:

irradiating a laser beam to each of the primary opening processing areas based on a processing sequence of the primary opening processing areas to sequentially form secondary opening processing areas, and a position of a center point of at least one of the secondary opening processing areas is different from a position of a center point of a corresponding final opening area among the final opening areas, wherein the primary opening processing areas comprise first to a-th opening processing areas arranged in a first direction between one end and another end of the tensioned mask sheet in a plan view, the final opening areas comprise first to a-th openings respectively corresponding to the first to a-th opening processing areas and formed through the tensioned mask sheet, each of the first to a-th opening processing areas has a first center point, each of the first to a-th openings has a second center point, a position of the first center point of at least one of the first to a-th opening processing areas is different from a position of the second center point of an opening corresponding thereto, and a is a natural number equal to or greater than two (2), the laser beam is sequentially irradiated from the first opening processing area disposed closest to the one end and to the a-th opening processing area in the first direction, the laser beam is first irradiated to the first opening processing area among the first to a-th opening processing areas to form a secondary first opening processing area having a same center point as the first center point of the first opening processing area, and a position of a center point of the secondary first opening area is different from a position of the second center point of the first opening in the first direction, the laser beam is irradiated at an a-th order to the a-th opening processing area among the first to a-th opening processing areas to form a secondary a-th opening processing area having a same center point as the first center point of the a-th opening processing area, and a position of a center point of the secondary a-th opening area is the same as a position of the second center point of the a-th opening in the first direction.

14. A method of manufacturing a mask assembly, comprising:

tensioning a mask sheet;

connecting the tensioned mask sheet with a mask frame;

defining primary opening processing areas arranged in an arrangement on the tensioned mask sheet and each having a center point whose position is corrected; and forming final opening areas respectively corresponding to the primary opening processing areas, the forming of the final opening areas comprising:

irradiating a laser beam to each of the primary opening processing areas based on a processing sequence of the primary opening processing areas to sequentially form secondary opening processing areas, and a position of a center point of at least one of the secondary opening processing areas is different from a position of a center point of a corresponding final opening area among the final opening areas, wherein the primary opening processing areas comprise first to a-th opening processing areas arranged in a first direction between one end and another end of the tensioned mask sheet in a plan view, the final opening areas comprise first to a-th openings respectively corresponding to the first to a-th opening processing areas and formed through the tensioned mask sheet, each of the first to a-th opening processing areas has a first center point, each of the first to a-th openings has a second center point, a position of the first center point of at least one of the first to a-th opening processing areas is different from a position of the second center point of an opening corresponding thereto, a is a natural number equal to or greater than two (2), the opening processing area disposed at a center in the first direction among the first to a-th opening processing areas is defined as a center opening processing area, and the laser beam is sequentially irradiated to the first to a-th opening processing areas from the opening processing area disposed farthest from the center opening processing area.

15. The method of claim 14, wherein the laser beam is sequentially irradiated from the first opening processing area disposed closest to the one end and to the a-th opening processing area in the first direction.

16. The method of claim 15, wherein the laser beam is first irradiated to the first opening processing area among the first to a-th opening processing areas to form a secondary first opening processing area having a same center point as the first center point of the first opening processing area, and a position of a center point of the secondary first opening area is different from a position of the second center point of the first opening in the first direction.

17. The method of claim 16, wherein the second center point of the first opening is closer to the one end in the first direction than a center point of the secondary first opening processing area is.

18. The method of claim 16, wherein the laser beam is irradiated at an a-th order to the a-th opening processing area among the first to a-th opening processing areas to form a secondary a-th opening processing area having a same center point as the first center point of the a-th opening processing area, and a position of a center point of the secondary a-th opening area is the same as a position of the second center point of the a-th opening in the first direction.

19. A method of manufacturing a mask assembly, comprising:

tensioning a mask sheet;

connecting the tensioned mask sheet with a mask frame;

defining primary opening processing areas arranged in an arrangement on the tensioned mask sheet and each having a center point whose position is corrected; and forming final opening areas respectively corresponding to the primary opening processing areas, the forming of the final opening areas comprising:

irradiating a laser beam to each of the primary opening processing areas based on a processing sequence of the primary opening processing areas to sequentially form secondary opening processing areas, and a position of a center point of at least one of the secondary opening processing areas is different from a position of a center point of a corresponding final opening area among the final opening areas, wherein the primary opening processing areas comprise first to a-th opening processing areas arranged in a first direction between one end and another end of the tensioned mask sheet in a plan view, the final opening areas comprise first to a-th openings respectively corresponding to the first to a-th opening processing areas and formed through the tensioned mask sheet, each of the first to a-th opening processing areas has a first center point, each of the first to a-th openings has a second center point, a position of the first center point of at least one of the first to a-th opening processing areas is different from a position of the second center point of an opening corresponding thereto, a is a natural number equal to or greater than two (2), the opening processing area disposed at a center in the first direction among the first to a-th opening processing areas is defined as a center opening processing area, and the laser beam is sequentially irradiated according to the processing sequence that gradually goes away from the center opening processing area.

\* \* \* \* \*